(12) United States Patent
Misaka

(10) Patent No.: US 7,569,312 B2
(45) Date of Patent: Aug. 4, 2009

(54) MASK DATA CREATION METHOD

(75) Inventor: Akio Misaka, Osaka (JP)

(73) Assignee: Panasonic Corporation, Osaka (JP)

( * ) Notice: Subject to any disclaimer, the term of this patent is extended or adjusted under 35 U.S.C. 154(b) by 495 days.

(21) Appl. No.: 11/601,705

(22) Filed: Nov. 20, 2006

(65) Prior Publication Data

US 2007/0141479 A1 Jun. 21, 2007

Related U.S. Application Data

(62) Division of application No. 10/717,598, filed on Nov. 21, 2003, now Pat. No. 7,147,975.

(30) Foreign Application Priority Data

Feb. 17, 2003 (JP) ............................. 2003-037845

(51) Int. Cl.
*G03F 1/00* (2006.01)
(52) U.S. Cl. .......................................................... 430/5
(58) Field of Classification Search ................. 430/5, 430/311, 322, 394; 716/19, 20, 21
See application file for complete search history.

(56) References Cited

U.S. PATENT DOCUMENTS

| | | |
|---|---|---|
| 6,255,024 B1 | 7/2001 | Pierrat |
| 6,355,382 B1 | 3/2002 | Yasuzato et al. |
| 6,479,194 B1 | 11/2002 | Talor, Jr. |
| 2001/0021477 A1 | 9/2001 | Dirksen et al. |
| 2002/0137361 A1 | 9/2002 | Kim et al. |

FOREIGN PATENT DOCUMENTS

| | | |
|---|---|---|
| EP | 1241523 A1 | 9/2002 |
| JP | 5-165194 A | 6/1993 |
| JP | 06-019114 | 1/1994 |
| JP | 06-313964 | 11/1994 |
| JP | 9-73166 A | 3/1997 |
| JP | 09-319067 | 12/1997 |

(Continued)

OTHER PUBLICATIONS

Japanese Office Action with English translation issued in corresponding Japanese Patent Application No. JP 2005-301199, mailed May 8, 2007.

(Continued)

*Primary Examiner*—Stephen Rosasco
(74) *Attorney, Agent, or Firm*—McDermott Will & Emery LLP

(57) ABSTRACT

A mask pattern includes a main pattern to be transferred through exposure and an auxiliary pattern that diffracts exposing light and is not transferred through the exposure. The main pattern is made from a shielding portion, a phase shifter or a combination of a semi-shielding portion or a shielding portion and a phase shifter. The auxiliary pattern is made from a shielding portion or a semi-shielding portion. The auxiliary pattern is disposed in a position away from the main pattern by a distance $M \times (\lambda/(2 \times \sin \phi))$ or $M \times ((\lambda/(2 \times \sin \phi)) + (\lambda/(NA + \sin \phi)))$, wherein $\lambda$ indicates a wavelength of the exposing light, M and NA indicate magnification and numerical aperture of a reduction projection optical system of an aligner and $\phi$ indicates an oblique incident angle.

9 Claims, 34 Drawing Sheets

FOREIGN PATENT DOCUMENTS

| | | |
|---|---|---|
| JP | 2002-055434 | 2/2002 |
| JP | 2002-526792 A | 8/2002 |
| JP | 2002-287326 | 10/2002 |
| JP | 2003-302739 | 10/2003 |
| WO | WO-01/04838 A1 | 1/2001 |
| WO | WO 01/61412 A1 | 8/2001 |
| WO | WO 02/091079 A1 | 11/2002 |
| WO | WO 03/062923 A1 | 7/2003 |

OTHER PUBLICATIONS

Japanese Office Action with English translation issued in corresponding Japanese Patent Application No. JP 2006-258854, mailed May 8, 2007.

Japanese Office Action, with English translation, issued in Japanese Patent Application No. JP 2007-179776, mailed Dec. 9, 2008.

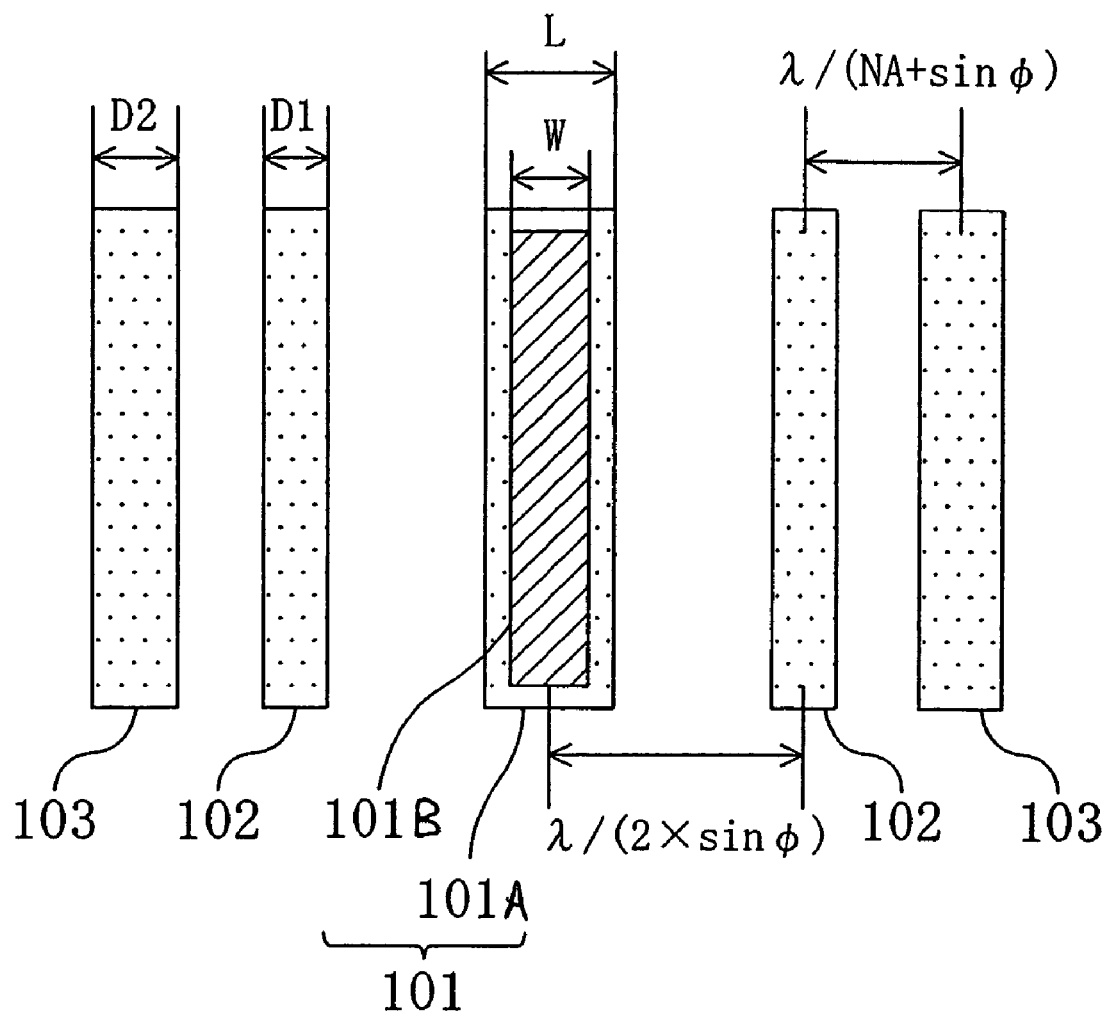

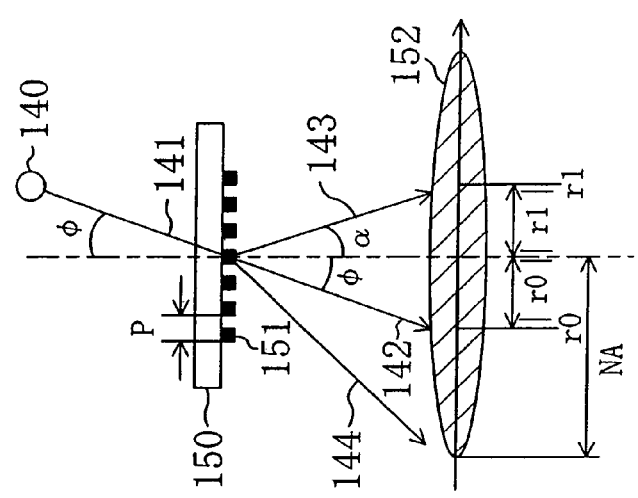

FIG. 5A $\sin\phi = S \times NA$ define
$\sin\phi = |r0|$,
$\sin\alpha = |r1|$,
$|r0| + |r1| = \lambda/P$ and
$\sin\theta_1 = |r0| + |r1|$

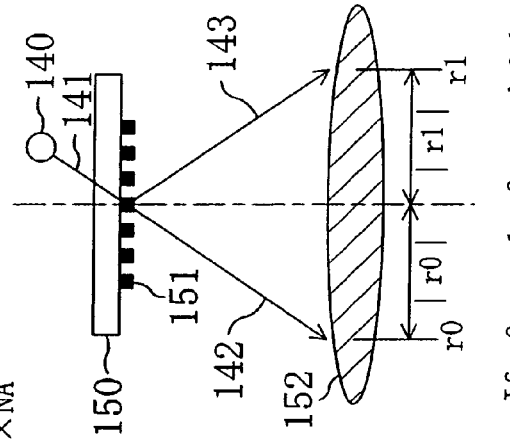

FIG. 5B

If r0 = −r1, focused 0th-order diffraction light and focused first-order diffraction light are in the identical phase even in a defocus state.

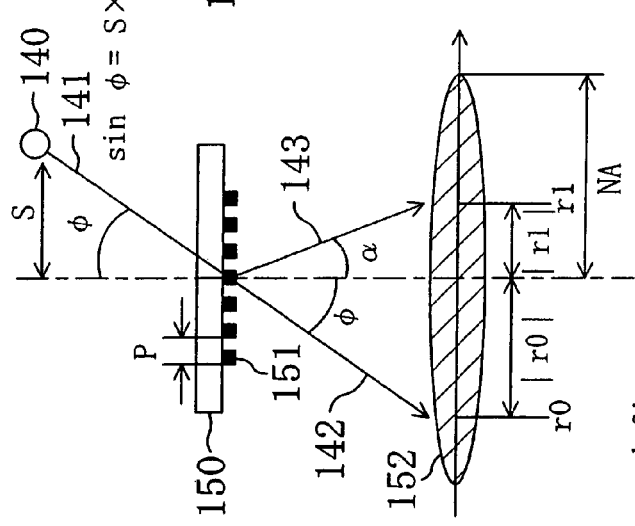

FIG. 5C

When both +first-order diffraction light and −first-order diffraction light pass through a mask, a good defocus state cannot be obtained.

define
$\sin\phi = |r0|$,
$\sin\alpha = |r1|$,
$|r0| + |r1| = \lambda/P$ and
$\sin\theta_1 = |r0| + |r1|$ $\sin\phi = S \times NA$ define
$\sin\phi = |r0|$,
$\sin\beta = NA$,
$|r0| + NA = 2\lambda/P$ and
$\sin\theta_2 = |r0| + NA$ $S=(x1+x2)/2$ S=(x1+x2)/2

—— Mask enhancer
·········· Shielding pattern

S(=sin φ/NA)

—— Mask enhancer
·········· Shielding pattern

S(=sin φ/NA)

—— Mask enhancer
·········· Shielding pattern

S(=sin φ/NA)

$S = (S1+S2)/2$

Annular illumination $S = (x1+x2)/2$

Four-eyed illumination
(Quadrupole illumination)

$S = (x1+x2)/2$

Four-eyed illumination
(Quadrupole illumination)

$S = (x1+x2)/2$

Four-eyed illumination
(Quadrupole illumination)

$S = (x1+x2)/2$

Four-eyed illumination
(Quadrupole illumination)

MASK DATA CREATION METHOD

RELATED APPLICATION

This application is a divisional application of Ser. No. 10/717,598, filed Nov. 21, 2003, now U.S. Pat. No. 7,147,975 which claims priority of Japanese Patent application No. 10-2003-37845, filed Feb. 17, 2003, and the contents of which are herewith incorporated by reference.

BACKGROUND OF THE INVENTION

The present invention relates to a photomask used for forming a fine pattern in fabrication of semiconductor integrated circuit devices and a pattern formation method using the photomask, and further relates to a design method for a mask pattern.

Recently, there are increasing demands for refinement of circuit patterns in order to increase the degree of integration of a large scale integrated circuit (hereinafter referred to as the LSI) realized by using semiconductors. As a result, thinning of an interconnect pattern used for forming a circuit has become very significant.

Now, conventional thinning of an interconnect pattern using an optical exposure system will be described by exemplifying use of positive resist process. Herein, a line pattern means a portion of a resist film not exposed to exposing light, that is, a resist portion remaining after development (namely, a resist pattern). Also, a space pattern is a portion of the resist film exposed to the exposing light, that is, an opening where the resist film is removed through the development (namely, a resist removal pattern). In the case where negative resist process is employed instead of the positive resist process, the above-described definitions of a line pattern and a space pattern are replaced with each other.

Conventionally, in the case where pattern formation is carried out by using an optical exposure system, a photomask in which a completely shielding pattern of Cr or the like is drawn correspondingly to a desired pattern on a transparent substrate of quartz or the like is used. In such a photomask, an area where the Cr pattern is present works as a shielding portion that does not transmit exposing light of a given wavelength at all (namely, that has transmittance of substantially 0%), and an area where the Cr pattern is not present (an opening) works as a transparent portion that has transmittance equivalent to that of the transparent substrate against the exposing light (namely, that has transmittance of substantially 100%). When this photomask is used for the exposure, the shielding portion corresponds to an unexposed portion of a resist and the opening (transparent portion) corresponds to an exposed portion of the resist. Accordingly, such a photomask, namely, a photomask consisting of a shielding portion and a transparent portion against exposing light of a given wavelength, is designated as a binary mask.

In an optical exposure system, an image formed through exposure using the above-described binary mask (namely, an energy intensity distribution caused on a target material through the exposure) has contrast in inverse proportion to $\lambda/NA$, wherein $\lambda$ indicates the wavelength of the exposing light emitted from a light source and NA indicates numerical aperture of a reducing projection optical system (specifically, a projection lens) of an aligner. Therefore, a dimension that can be formed as a resist pattern is in proportion to $\lambda/NA$. Accordingly, in order to realize refinement of a pattern, it is effective to reduce the wavelength $\lambda$ of the exposing light and increase the numerical aperture NA.

On the other hand, for example, since steps are caused in formation of devices included in an LSI or the surface of a substrate is not flat, an image formed by using the conventional optical exposure system may be shifted from an ideal focal point. Therefore, the dimension of a pattern formed in such a defocused state should be kept in a predetermined range. The limit of a defocus value at which the dimension of a pattern falls within the predetermined range, namely, the limit of a defocus value for securing the dimensional accuracy of a pattern, is designated as a depth of focus (DOF). Specifically, in order to refine a pattern, it is necessary not only to emphasize the contrast of an image but also to increase the value of a DOF. The DOF value is, however, in proportion to $\lambda/NA^2$, and therefore, when the wavelength is reduced and the numerical aperture NA is increased for improving the contrast, the DOF value is unavoidably reduced.

As described so far, a technique to simultaneously realize improvement of contrast by a method other than by reducing the wavelength and increasing the numerical aperture and improvement of a DOF without changing the wavelength $\lambda$ and the numerical aperture NA has become significant.

In the most typical method for largely improving the contrast and the DOF, oblique incident exposure (off-axis illumination) is performed on periodical patterns provided on a photomask. However, the oblique incident exposure can exhibit a satisfactory effect merely when the patterns are arranged at a small period of $\lambda/NA$ or less, and hence is not an effective method for refinement of arbitrary patterns. In order to make up for this weak point of the oblique incident exposure, there is a method using an auxiliary pattern (hereinafter referred to as the auxiliary pattern method).

Now, an auxiliary pattern method disclosed in Japanese Laid-Open Patent Publication No. 5-165194 (hereinafter referred to as the first conventional example) will be described. FIG. 35 is a plan view of a photomask used in the first conventional example. The photomask of FIG. 35 is used in a stepper for performing ⅕ reduction projection exposure. As shown in FIG. 35, a shielding film 11 of chromium is provided on a transparent glass substrate 10 working as a mask substrate. A first opening 12 corresponding to a main pattern (circuit pattern) to be transferred through the exposure is formed in the shielding film 11. Also, a pair of second openings 13 that correspond to an auxiliary pattern for improving the transfer accuracy of the main pattern and are not transferred through the exposure are provided in the shielding film 11 on both sides of the first opening 12. In this case, the first opening 12 has a width of, for example, 1.5 μm and each second opening 13 has a width of, for example, 0.75 μm. Also, the distance between the center of the first opening 12 and the center of each second opening 13 is, for example, 4.5 μm. In other words, in the photomask used in the first conventional example, an auxiliary pattern smaller than a circuit pattern, namely, a main pattern, is provided to be adjacent to the circuit pattern. In the auxiliary pattern method of the first conventional example, although the DOF is slightly improved, the effect equivalent to that attained by using the original periodic patterns cannot be attained.

Next, an auxiliary pattern method disclosed in Japanese Laid-Open Patent Publication No. 9-73166 (hereinafter referred to as a second conventional example), which is obtained by improving the first conventional example, will be described. FIG. 36 is a plan view of a photomask used in the second conventional example. As shown in FIG. 36, a main pattern 21 is provided on a transparent glass substrate 20 working as a mask substrate, and auxiliary patterns 22 are periodically arranged on the glass substrate 20 on both sides of the main pattern 21. The main pattern 21 is made from a multilayer film consisting of a lower low transmittance film and an upper shielding film (chromium film). Each auxiliary pattern 22 is made from the low transmittance film obtained by removing the upper shielding film from the multilayer film. At this point, the auxiliary pattern 22 made from the low transmittance film is not used for forming an unexposed portion of a resist (i.e., a resist pattern) through exposure. Accordingly, when the oblique incident exposure is performed with the auxiliary patterns 22 having low transmittance periodically arranged against the main pattern 21, the DOF can be improved.

Although the contrast and the DOF can be largely improved by using a phase shifter, but this effect can be attained merely in the case where a transparent portion (opening) and a phase shifter for transmitting exposing light at a phase difference of 180° with respect to the transparent portion can be arranged on both sides of a fine line pattern on a photomask. Accordingly, even when a phase shifter is used, the contrast and the DOF cannot be improved all over fine portions of an interconnect pattern of a general LSI.

Also, the contrast and the DOF can be largely improved in a completely periodic pattern by using the oblique incident exposure. However, this effect cannot be attained all over fine portions of an interconnect pattern including an isolated pattern of a general LSI. In this case, the DOF and the like can be slightly improved by using an auxiliary pattern (as in the first conventional example), but the effect is slight as compared with that attained in a completely periodic patterns. Also, when a pattern having low transmittance is used as an auxiliary pattern so as to improve the degree of freedom in the arrangement of the auxiliary pattern, the periodicity in the arrangement of patterns can be improved (as in the second conventional example). Also in this case, however, there arises the following problem: a substantial effect attained by the second conventional example is merely to ease processing of the auxiliary patterns because the auxiliary patterns can be made thick. In other words, with respect to the improvement of the contrast and the DOF, the second conventional example can attain the effect merely equivalent to that attained by the first conventional example (using a thin auxiliary pattern). This is because the improvement of the contrast and the DOF does not depend upon whether a mask pattern consisting of a main pattern and an auxiliary pattern is periodic but depends upon whether an image formed by using a mask pattern through exposure (i.e., an energy intensity distribution) is highly periodic.

SUMMARY OF THE INVENTION

In consideration of the above-described conventional problems, an object of the invention is providing a photomask, a pattern formation method and a method for creating mask data that can improve contrast and a DOF in forming a pattern in an arbitrary shape.

In order to achieve the object, the first photomask of the invention includes a mask pattern formed on a transparent substrate; and a transparent portion of the transparent substrate where the mask pattern is not formed. Specifically, the mask pattern includes a main pattern to be transferred through exposure and an auxiliary pattern that diffracts exposing light and is not transferred through the exposure. Also, the main pattern is composed of a first semi-shielding portion that has first transmittance for partially transmitting the exposing light and transmits the exposing light in an identical phase with respect to the transparent portion, and a phase shifter that transmits the exposing light in an opposite phase with respect to the transparent portion. Furthermore, the auxiliary pattern is made from a second semi-shielding portion that has second transmittance for partially transmitting the exposing light and transmits the exposing light in the identical phase with respect to the transparent portion.

Herein, the identical phase means that a phase difference is not less than (−30+360×n) degrees and not more than (30+360×n) degrees (wherein n is an integer), and the opposite phase means that a phase difference is not less than (150+360×n) degrees and not more than (210+360×n) degrees (wherein n is an integer).

In the first photomask, since the main pattern is composed of the semi-shielding portion and the phase shifter, lights passing through the transparent portion and the semi-shielding portion can be partially cancelled by light passing through the phase shifter. Therefore, the contrast in a light intensity distribution of a shielded image corresponding to the main pattern can be emphasized. Also, since the auxiliary pattern with low transmittance is provided separately from the main pattern, when the auxiliary pattern is disposed in an appropriate position, diffraction light for interfering with the light passing through the phase shifter of the main pattern can be generated. Accordingly, the defocus characteristic of a transferred image of the main pattern can be improved, resulting in improving the DOF characteristic.

Furthermore, in the first photomask, since the auxiliary pattern is made from the semi-shielding portion, the degree of freedom in the arrangement of the auxiliary pattern can be improved, and hence, the periodicity in the arrangement of the patterns including the main pattern can be improved, so that the DOF characteristic can be further improved. Also, since the auxiliary pattern is made from the semi-shielding portion, it can be made thick under restriction that it is not transferred through the exposure, and hence it can be easily processed.

In the first photomask, the first transmittance is preferably 15% or less.

Thus, the thickness of a resist film can be prevented from reducing or the resist sensitivity can be optimized in the pattern formation. Specifically, such an effect and the effects to improve the DOF and the contrast can be both attained.

In the first photomask, the second transmittance is preferably not less than 6% and not more than 50%.

Thus, the effect to improve the DOF derived from the diffraction light can be definitely realized while preventing an unexposed portion from being formed in a resist due to a too high shielding property of the auxiliary pattern.

The second photomask of this invention includes a mask pattern formed on a transparent substrate; and a transparent portion of the transparent substrate where the mask pattern is not formed. Specifically, the mask pattern includes a main pattern to be transferred through exposure and an auxiliary pattern that diffracts exposing light and is not transferred through the exposure. Furthermore, a part of the transparent portion is disposed between the main pattern and the auxiliary pattern, and with respect to an oblique incident angle $\phi A$ defined as $\sin \phi A = NA \times SA$ when a given oblique incident position is indicated by SA (wherein $0.4 \leq SA \leq 0.8$), a center of the auxiliary pattern is disposed in or in the vicinity of a position away from a center of the main pattern by a distance $M \times (\lambda/(2 \times \sin \phi A))$, wherein $\lambda$ indicates a wavelength of the exposing light and M and NA indicate magnification and numerical aperture of a reduction projection optical system of an aligner.

In the second photomask, the auxiliary pattern is provided separately from the main pattern in or in the vicinity of a position away from the main pattern by a distance $M \times (\lambda/(2 \times \sin \phi A))$. Therefore, the defocus characteristic of a transferred image of the main pattern can be improved owing to diffraction light generated by the auxiliary pattern, resulting in improving the DOF characteristic.

In the second photomask, the main pattern may be made from a shielding portion or a phase shifter that transmits the exposing light in an opposite phase with respect to the transparent portion.

In the second photomask, the main pattern is preferably composed of a semi-shielding portion that has transmittance for partially transmitting the exposing light and transmits the exposing light in an identical phase with respect to the transparent portion, and a phase shifter that transmits the exposing light in an opposite phase with respect to the transparent portion.

Thus, since the main pattern is composed of the semi-shielding portion and the phase shifter, lights passing through the transparent portion and the semi-shielding portion can be partially cancelled by light passing through the phase shifter. Therefore, the contrast in a light intensity distribution of a shielded image corresponding to the main pattern can be emphasized.

In the case where the main pattern is composed of the semi-shielding portion and the phase shifter, the phase shifter is preferably disposed at a center of the main pattern to be surrounded by the semi-shielding portion.

Thus, the contrast in the light intensity distribution can be emphasized at the center of the shielded image corresponding to the main pattern, and therefore, while keeping a good defocus characteristic, for example, a fine line pattern can be formed. Furthermore, a dimension of a part of the semi-shielding portion sandwiched between the phase shifter and the transparent portion is preferably not less than 20 nm and not more than $(0.3 \times \lambda/NA) \times M$, or not less than ¼ of a wavelength of the exposing light and not more than $(0.3 \times \lambda/NA) \times M$, wherein $\lambda$ indicates a wavelength of the exposing light and M and NA indicate magnification and numerical aperture of a reduction projection optical system of an aligner. Alternatively, the main pattern may be composed of a shielding portion replaced with the semi-shielding portion and the phase shifter.

In the case where the main pattern is composed of the semi-shielding portion and the phase shifter, the phase shifter is preferably disposed in a peripheral portion of the main pattern to be surrounded by a part of the semi-shielding portion.

Thus, the contrast in the light intensity distribution can be emphasized in the vicinity of the main pattern in an image of light having passed through the transparent portion. Therefore, while keeping a good defocus characteristic, for example, a fine contact pattern can be formed.

Furthermore, in the case where the main pattern is composed of the semi-shielding portion and the phase shifter, the semi-shielding portion preferably has transmittance of 15% or less.

Thus, the thickness of a resist film can be prevented from reducing or the resist sensitivity can be optimized in the pattern formation. Specifically, such an effect and the effects to improve the DOF and the contrast can be both attained.

In the second photomask, the auxiliary pattern may be made from a shielding portion or a semi-shielding portion that has transmittance for partially transmitting the exposing light and transmits the exposing light in an identical phase with respect to the transparent portion. When the auxiliary pattern is made from the semi-shielding portion, the degree of freedom in the arrangement of the auxiliary pattern can be improved, and hence, the periodicity in the arrangement of the patterns including the main pattern can be improved, so that the DOF characteristic can be further improved. Furthermore, when the auxiliary pattern is made from the semi-shielding portion, the auxiliary pattern can be made thick under restriction that it is not transferred through the exposure, and hence, the auxiliary pattern can be easily processed. In the case where the auxiliary pattern is made from the semi-shielding portion, the transmittance of the semi-shielding portion is preferably not less than 6% and not more than 50%. Thus, the effect to improve the DOF derived from the diffraction light can be definitely realized while preventing an unexposed portion from being formed in a resist due to a too high shielding property of the auxiliary pattern.

The third photomask of the invention includes a mask pattern formed on a transparent substrate; and a transparent portion of the transparent substrate where the mask pattern is not formed. Specifically, the mask pattern includes a main pattern to be transferred through exposure and an auxiliary pattern that diffracts exposing light and is not transferred through the exposure. Furthermore, a part of the transparent portion is disposed between the main pattern and the auxiliary pattern, and with respect to an oblique incident angle $\phi B$ defined as $\sin \phi B = NA \times SB$ when a given oblique incident position is indicated by SB ($0.4 \leq SB \leq 0.8$), a center of the auxiliary pattern is disposed in or in the vicinity of a position away from a center of the main pattern by a distance $M \times ((\lambda/(2 \times \sin \phi B)) + (\lambda/(NA + \sin \phi B)))$, wherein $\lambda$ indicates a wavelength of the exposing light and M and NA indicate magnification and numerical aperture of a reduction projection optical system of an aligner.

In the third photomask, the auxiliary pattern is provided separately from the main pattern in or in the vicinity of a position away from the main pattern by a distance $M \times ((\lambda/(2 \times \sin \phi B)) + (\lambda/(NA + \sin \phi B)))$. Therefore, the defocus characteristic of a transferred image of the main pattern can be improved owing to diffraction light generated by the auxiliary pattern, resulting in improving the DOF characteristic. Furthermore, when a first auxiliary pattern is disposed in or in the vicinity of a position away from the main pattern by a distance $M \times (\lambda/(2 \times \sin \phi B))$ and a second auxiliary pattern is disposed in or in the vicinity of a position away from the main pattern by a distance $M \times ((\lambda/(2 \times \sin \phi B)) + (\lambda/(NA + \sin \phi B)))$, the following effect can be attained: Since the first auxiliary pattern functions as a first-order diffraction light generation pattern and the second auxiliary pattern functions as a second-order diffraction light generation pattern, the effect to improve the DOF can be further increased.

In the third photomask, the main pattern may be made from a shielding portion or a phase shifter that transmits the exposing light in an opposite phase with respect to the transparent portion.

In the third photomask, the main pattern is preferably composed of a semi-shielding portion that has transmittance for partially transmitting the exposing light and transmits the exposing light in an identical phase with respect to the transparent portion, and a phase shifter that transmits the exposing light in an opposite phase with respect to the transparent portion.

Thus, since the main pattern is composed of the semi-shielding portion and the phase shifter, lights passing through the transparent portion and the semi-shielding portion can be partially cancelled by light passing through the phase shifter. Therefore, the contrast in the light intensity distribution in a shielded image corresponding to the main pattern can be emphasized.

In the case where the main pattern is composed of the semi-shielding portion and the phase shifter, the phase shifter is preferably disposed at a center of the main pattern to be surrounded by the semi-shielding portion.

Thus, the contrast in the light intensity distribution can be emphasized at the center of the shielded image corresponding to the main pattern, and therefore, while keeping a good defocus characteristic, for example, a fine line pattern can be formed. Also, a dimension of a part of the semi-shielding portion sandwiched between the phase shifter and the transparent portion is preferably not less than 20 nm and not more than $(0.3 \times \lambda/NA) \times M$, or not less than ¼ of a wavelength of the exposing light and not more than $(0.3 \times \lambda/NA) \times M$, wherein $\lambda$ indicates a wavelength of the exposing light and M and NA indicate magnification and numerical aperture of a reduction projection optical system of an aligner. Alternatively, the main pattern may be composed of a shielding portion replaced with the semi-shielding portion and the phase shifter.

In the case where the main pattern is composed of the semi-shielding portion and the phase shifter, the phase shifter is preferably disposed in a peripheral portion of the main pattern to be surrounded by a part of the semi-shielding portion.

Thus, the contrast in the light intensity distribution can be emphasized in the vicinity of the main pattern in an image formed by light having passed through the transparent portion, and hence, while keeping a good defocus characteristic, for example, a fine contact pattern can be formed.

In the case where the main pattern is composed of the semi-shielding portion and the phase shifter, the semi-shielding portion preferably has transmittance of 15% or less.

Thus, the thickness of a resist film can be prevented from reducing or the resist sensitivity can be optimized in the pattern formation. Specifically, such an effect and the effects to improve the DOF and the contrast can be both attained.

In the third photomask, the auxiliary pattern may be made from a shielding portion or a semi-shielding portion that has transmittance for partially transmitting the exposing light and transmits the exposing light in an identical phase with respect to the transparent portion. When the auxiliary pattern is made from the semi-shielding portion, the degree of freedom in the arrangement of the auxiliary pattern can be improved, and hence, the periodicity in the arrangement of the patterns including the main pattern can be improved, so that the DOF characteristic can be further improved. Also, when the auxiliary pattern is made from the semi-shielding portion, the auxiliary pattern can be made thick under restriction that it is not transferred through the exposure, and hence, the auxiliary pattern can be easily processed. In the case where the auxiliary pattern is made from the semi-shielding portion, the transmittance of the semi-shielding portion is preferably not less than 6% and not more than 50%. Thus, the effect to improve the DOF derived from the diffraction light can be definitely realized while preventing an unexposed portion from being formed in a resist due to a too high shielding property of the auxiliary pattern.

In the second or third photomask, in the case where the auxiliary pattern is disposed in a position away from the phase shifter by a distance $M \times (\lambda/(2 \times \sin \phi))$ or $M \times ((\lambda/(2 \times \sin \phi)) + (\lambda/(NA + \sin \phi)))$, the oblique incident angle $\phi$ is preferably not less than $\phi 1$ and not more than $\phi 2$ or satisfies $(\phi 1 + \phi 2)/2$ or $(\xi + \phi 2)/2$, wherein $\phi 1$ and $\phi 2$ indicate the minimum oblique incident angle and the maximum oblique incident angle of an oblique incident illumination system of the aligner and $\xi$ indicates an angle satisfying $\sin \xi = 0.4 \times NA$, wherein NA is numerical aperture of the reduction projection optical system of the aligner.

The fourth photomask of this invention includes a mask pattern formed on a transparent substrate; and a transparent portion of the transparent substrate where the mask pattern is not formed. Specifically, the mask pattern includes a main pattern to be transferred through exposure and an auxiliary pattern that diffracts exposing light and is not transferred through the exposure. Furthermore, the auxiliary pattern includes a first auxiliary pattern that is disposed in or in the vicinity of a position away from a center of the main pattern by a distance X with a part of the transparent portion sandwiched between the main pattern and the first auxiliary pattern, and a second auxiliary pattern that is disposed on a side of the first auxiliary pattern farther from the main pattern in or in the vicinity of a position away from a center of the first auxiliary pattern by a distance Y with a part of the transparent portion sandwiched between the first auxiliary pattern and the second auxiliary pattern. In this case, the distance X is larger than the distance Y.

Herein, a distance between the main pattern and the auxiliary pattern means a distance between the centers thereof. For example, in the case where an auxiliary pattern in an analogous shape is provided in parallel to a line-shaped main pattern, the distance means a distance between the center lines of the main pattern and the auxiliary pattern.

In the fourth photomask, the first auxiliary pattern is provided separately from the main pattern in or in the vicinity of the position away from the main pattern by the distance X, and the second auxiliary pattern is provided in or in the vicinity of the position away from the first auxiliary pattern by the distance Y smaller than the distance X. Therefore, the defocus characteristic of a transferred image of the main pattern can be improved by diffraction light generated by each auxiliary pattern, resulting in improving the DOF characteristic.

In the fourth photomask, when a given oblique incident position is indicated by S (wherein $0.4 \leq S \leq 0.8$), a relationship, $X/Y = (1+S)/(2 \times S)$, preferably holds. Thus, the effect to improve the DOF can be maximized.

In the fourth photomask, when a given oblique incident position is indicated by SA (wherein $0.4 \leq SA \leq 0.8$), with respect to an oblique incident angle $\phi A$ defined as $\sin \phi A = NA \times SA$, a relationship, $X = M \times (\lambda/(2 \times \sin \phi A))$, may hold.

In the fourth photomask, the main pattern may be made from a shielding portion or a phase shifter that transmits the exposing light in an opposite phase with respect to the transparent portion.

In the fourth photomask, the main pattern is preferably composed of a semi-shielding portion that has transmittance for partially transmitting the exposing light and transmits the exposing light in an identical phase with respect to the transparent portion, and a phase shifter that transmits the exposing light in an opposite phase with respect to the transparent portion.

Thus, since the main pattern is composed of the semi-shielding portion and the phase shifter, lights passing through the transparent portion and the semi-shielding portion can be partially canceled by light passing through the phase shifter. Therefore, the contrast in a light intensity distribution of a shielded image corresponding to the main pattern can be emphasized.

In the case where the main pattern is composed of the semi-shielding portion and the phase shifter, the phase shifter is preferably disposed at a center of the main pattern to be surrounded by the semi-shielding portion.

Thus, the contrast in the light intensity distribution can be emphasized at the center of the shielded image corresponding to the main pattern, and hence, while keeping a good defocus characteristic, for example, a fine line pattern can be formed. Furthermore, a dimension of a part of the semi-shielding portion sandwiched between the phase shifter and the transparent portion is not less than 20 nm and not more than $(0.3\times\lambda/NA)\times M$, or not less than ¼ of a wavelength of the exposing light and not more than $(0.3\times\lambda/NA)\times M$, wherein $\lambda$ indicates a wavelength of the exposing light and M and NA indicate magnification and numerical aperture of a reduction projection optical system of an aligner. Alternatively, the main pattern may be composed of a shielding portion replaced with the semi-shielding portion and the phase shifter.

In the case where the main pattern is composed of the semi-shielding portion and the phase shifter, the phase shifter is preferably disposed in a peripheral portion of the main pattern to be surrounded by a part of the semi-shielding portion.

Thus, the contrast in the light intensity distribution can be emphasized in the vicinity of the main pattern in an image formed by light having passed through the transparent portion. Therefore, while keeping a good defocus characteristic, for example, a fine contact pattern can be formed.

In the case where the main pattern is composed of the semi-shielding portion and the phase shifter, the semi-shielding portion preferably has transmittance of 15% or less.

Thus, the thickness of a resist film can be prevented from reducing or the resist sensitivity can be optimized in the pattern exposure. Specifically, such an effect and the effects to improve the DOF and the contrast can be both attained.

In the fourth photomask, the first auxiliary pattern and the second auxiliary pattern may be made from a shielding portion or a semi-shielding portion that has transmittance for partially transmitting the exposing light and transmits the exposing light in an identical phase with respect to the transparent portion. When each auxiliary pattern is made from the semi-shielding portion, the degree of freedom in the arrangement of the auxiliary patterns can be improved, and hence, the periodicity in the arrangement of the patterns including the main pattern can be improved, so that the DOF characteristic can be further improved. Also, when the auxiliary patterns are made from the semi-shielding portion, the auxiliary patterns can be made thick under restriction that they are not transferred through the exposure, and hence, the auxiliary patterns can be easily processed. In the case where the auxiliary patterns are made from the semi-shielding portion, the transmittance of the semi-shielding portion is preferably not less than 6% and not more than 50%. Thus, the effect to improve the DOF derived from the diffraction light can be definitely realized while preventing an unexposed portion from being formed in a resist due to a too high shielding property of the auxiliary patterns.

The fifth photomask of the invention includes a mask pattern formed on a transparent substrate; and a transparent portion of the transparent substrate where the mask pattern is not formed. Specifically, the mask pattern includes a main pattern to be transferred through exposure and an auxiliary pattern that diffracts exposing light and is not transferred through the exposure. Furthermore, the auxiliary pattern includes a first auxiliary pattern that has a width D1 and is disposed with a part of the transparent portion sandwiched between the main pattern and the first auxiliary pattern and a second auxiliary pattern that has a width D2 and is disposed on a side of the first auxiliary pattern farther from the main pattern with a part of the transparent portion sandwiched between the first auxiliary pattern and the second auxiliary pattern. In this case, the width D2 is larger than the width D1.

In the fifth photomask, since the first and second auxiliary patterns are provided separately from the main pattern, the defocus characteristic of a transferred image of the main pattern can be improved owing to diffraction light generated by each auxiliary pattern, resulting in improving the DOF characteristic. Also, since the width D2 of the second auxiliary pattern farther from the main pattern is larger than the width D1 of the first auxiliary pattern closer to the main pattern, while keeping a large exposure margin, the effect to improve the DOF can be attained.

In the fifth photomask, a ratio D2/D1 is preferably not less than 1.2 and not more than 2. Thus, the effect to improve the DOF can be attained while preventing an unexposed portion from being formed in a resist by the auxiliary patterns.

In the fifth photomask, the main pattern may be made from a shielding portion or a phase shifter that transmits the exposing light in an opposite phase with respect to the transparent portion.

In the fifth photomask, the main pattern is preferably composed of a semi-shielding portion that has transmittance for partially transmitting the exposing light and transmits the exposing light in an identical phase with respect to the transparent portion, and a phase shifter that transmits the exposing light in an opposite phase with respect to the transparent portion.

Thus, since the main pattern is composed of the semi-shielding portion and the phase shifter, lights passing through the transparent portion and the semi-shielding portion can be partially cancelled by light passing through the phase shifter. Therefore, the contrast in a light intensity distribution of a shielded image corresponding to the main pattern can be emphasized.

In the case where the main pattern is composed of the semi-shielding portion and the phase shifter, the phase shifter is preferably disposed at a center of the main pattern to be surrounded by the semi-shielding portion.

Thus, the contrast in the light intensity distribution can be emphasized at the center of the shielded image corresponding to the main pattern, and hence, while keeping a good defocus characteristic, for example, a fine line pattern can be formed. Furthermore, a dimension of a part of the semi-shielding portion sandwiched between the phase shifter and the transparent portion is preferably not less than 20 nm and not more than $(0.3\times\lambda/NA)\times M$, or not less than ¼ of a wavelength of the exposing light and not more than $(0.3\times\lambda/NA)\times M$, wherein $\lambda$ indicates a wavelength of the exposing light and M and NA indicate magnification and numerical aperture of a reduction projection optical system of an aligner. Alternatively, the main pattern may be composed of a shielding portion replaced with the semi-shielding portion and the phase shifter.

In the case where the main pattern is composed of the semi-shielding portion and the phase shifter, the phase shifter is preferably disposed in a peripheral portion of the main pattern to be surrounded by a part of the semi-shielding portion.

Thus, the contrast in the light intensity distribution can be emphasized in the vicinity of the main pattern in an image formed by light having passed through the transparent portion. Therefore, while keeping a good defocus characteristic, for example, a fine contact pattern can be formed.

In the case where the main pattern is composed of the semi-shielding portion and the phase shifter, the semi-shielding portion preferably has transmittance of 15% or less.

Thus, the thickness of a resist film can be prevented from reducing or the resist sensitivity can be optimized in the pattern formation. Specifically, such an effect and the effects to improve the DOF and the contrast can be both attained.

In the fifth photomask, the first auxiliary pattern and the second auxiliary pattern may be made from a shielding portion or a semi-shielding portion that has transmittance for partially transmitting the exposing light and transmits the exposing light in an identical phase with respect to the transparent portion. When each auxiliary pattern is made from the semi-shielding portion, the degree of freedom in the arrangement of the auxiliary patterns can be improved, and hence, the periodicity in the arrangement of the patterns including the main pattern can be improved, so that the DOF characteristic can be further improved. Also, when the auxiliary patterns are made from the semi-shielding portion, the auxiliary patterns can be made thick under restriction that they are not transferred through the exposure, and hence, the auxiliary patterns can be easily processed. In the case where the auxiliary patterns are made from the semi-shielding portion, the transmittance of the semi-shielding portion is preferably not less than 6% and not more than 50%. Thus, the effect to improve the DOF derived from the diffraction light can be definitely realized while preventing an unexposed portion from being formed in a resist due to a too high shielding property of the auxiliary patterns.

In each of the first through fifth photomasks, the phase shifter is preferably formed by trenching the transparent substrate. Thus, a very good defocus characteristic can be exhibited in the pattern formation.

In each of the first through fifth photomasks, the semi-shielding portion is preferably made from a metal thin film formed on the transparent substrate. Thus, the semi-shielding portion can be easily formed, and hence, the photomask processing can be eased.

The first pattern formation method of the invention uses any of the photomasks of the invention, and includes the steps of forming a resist film on a substrate; irradiating the resist film with the exposing light through the photomask of the invention; and forming a resist pattern by developing the resist film having been irradiated with the exposing light.

In the first pattern formation method, the same effects as those attained by each of the photomasks of the invention can obtained. Also, in the first pattern formation method, an oblique incident illumination method is preferably employed in the step of irradiating the resist film. Thus, the contrast between regions corresponding to the main pattern and the transparent portion can be improved in a light intensity distribution of light having passed through the photomask. Also, the focus characteristic of the light intensity distribution can be improved. Accordingly, an exposure margin and a focus margin can be increased in the pattern formation. In other words, a fine pattern can be formed with a good defocus characteristic.

The second pattern formation method of the invention uses the second or third photomask of the invention, and includes the steps of forming a resist film on a substrate; irradiating, through the photomask, the resist film with the exposing light emitted by annular illumination; and forming a resist pattern by developing the resist film having been irradiated with the exposing light.

In the second pattern formation method, particularly when an average of an outer diameter and an inner diameter of a lighting shape used in the annular illumination is not less than 0.58 and not more than 0.8, whereas values of the outer diameter and the inner diameter are standardized by numerical aperture of an aligner, the effect to improve the DOF of the second or third photomask of the invention can be definitely attained.

The third pattern formation method of the invention uses the second or third photomask of the invention, and includes the steps of forming a resist film on a substrate; irradiating, through the photomask, the resist film with the exposing light emitted by quadrupole illumination; and forming a resist pattern by developing the resist film having been irradiated with the exposing light.

In the third pattern formation method, particularly when a distance from a light source center to a center of each of four polarized lighting shapes used in the quadrupole illumination is not less than $0.4/(0.5)^{0.5}$ and not more than $0.6/(0.5)^{0.5}$, whereas values of the outer diameter and the inner diameter are standardized by using numerical aperture of an aligner, the effect to improve the DOF characteristic of the second or third photomask can be definitely attained.

The first mask data creation method of the invention is employed for creating mask data for a photomask including a mask pattern formed on a transparent substrate and a transparent portion of the transparent substrate where the mask pattern is not formed. Specifically, the method includes the steps of generating a main pattern corresponding to a desired unexposed region of a resist formed by irradiating the resist with exposing light through the photomask; determining a shape of a phase shifter that is disposed within the main pattern and transmits the exposing light in an opposite phase with respect to the transparent portion; disposing an auxiliary pattern for diffracting the exposing light in a position on the transparent substrate away from the phase shifter by a given distance; setting an edge of the main pattern corresponding to a boundary between the main pattern and the transparent portion as a CD adjustment edge; predicting, through simulation, a dimension of a resist pattern formed by using the main pattern including the phase shifter and the auxiliary pattern; and changing a shape of the main pattern by moving the CD adjustment edge when the predicted dimension of the resist pattern does not accord with a desired dimension.

In the first mask data creation method, the shape of the phase shifter provided within the main pattern and the position of the auxiliary pattern are first determined so as to optimize pattern formation characteristics, and thereafter, the shape of the main pattern is changed by using the edge of the main pattern as the CD adjustment edge so as to make the dimension of the resist pattern predicted through simulation accord with the desired dimension. Therefore, a mask pattern with good pattern formation characteristics can be realized.

In the first mask data creation method, the main pattern may include a semi-shielding portion that transmits the exposing light in an identical phase with respect to the transparent portion.

In the case where the main pattern includes the semi-shielding portion, when the phase shifter is disposed at a center of a part having a given or smaller dimension of the main pattern to be surrounded by the semi-shielding portion, a mask pattern capable of forming a finer desired pattern and having good pattern formation characteristics can be realized. In this case the phase shifter is preferably disposed with a part of the semi-shielding portion having a given or larger width sandwiched between the transparent portion and the phase shifter.

In the case where the main pattern includes the semi-shielding portion, when the phase shifter is disposed in a peripheral portion of the main pattern, a mask pattern capable of forming a desired pattern in an arbitrary shape and having good pattern formation characteristics can be realized.

In the first mask data creation method, it is preferred that the main pattern includes a shielding portion, and that the phase shifter is disposed at a center of a part having a given or smaller dimension of the main pattern to be surrounded by the shielding portion. Thus, a mask pattern capable of forming a finer desired pattern and having good pattern formation characteristics can be realized. In this case, the phase shifter is preferably disposed with a part of the shielding portion having a given or larger width sandwiched between the transparent portion and the phase shifter.

The second mask data creation method of the invention is employed for creating mask data for a photomask including a mask pattern formed on a transparent substrate and a transparent portion of the transparent substrate where the mask pattern is not formed. Specifically, the method includes the steps of generating a main pattern corresponding to a desired unexposed region of a resist formed by irradiating the resist with exposing light through the photomask; separating the main pattern into a first region and a second region; disposing a first auxiliary pattern for diffracting the exposing light in a position on the transparent substrate away from the first region of the main pattern by a given distance; and disposing a second auxiliary pattern for diffracting the exposing light in a position on the transparent substrate away from the second region of the main pattern by another given distance.

In the second mask data creation method, even in the case where the first region of the main pattern and the second region of the main pattern are too close to each other to simultaneously optimally provide auxiliary patterns (diffraction light generation patterns) with respect to these regions, a diffraction light generation pattern can be disposed priorly with respect to one of the regions of the main pattern, namely, a significant region of the main pattern. In this case, the significant region (one of the first region and the second region) may be a transistor region.

As described so far, the present invention relates to a photomask for use in fabrication of semiconductor integrated circuit devices. According to the invention, since an auxiliary pattern for diffracting exposing light is provided on the photomask separately from a main pattern, the defocus characteristic of a transferred image of the main pattern can be improved owing to diffraction light generated by the auxiliary pattern, resulting in improving the DOF characteristic. Accordingly, the present invention is particularly useful in application to fine pattern formation.

BRIEF DESCRIPTION OF THE DRAWINGS

FIG. 4 is a plan view of a mask pattern of a photomask according to Modification 1 of Embodiment 1 of the invention;

FIG. 5A is a diagram for explaining a diffraction phenomenon caused in exposure of a mask on which patterns are periodically arranged, FIG. 5B is a diagram for explaining a diffraction phenomenon caused in oblique incident exposure performed under conditions that 0th-order diffraction light and first-order diffraction light alone pass through a lens and r0=−r1, and FIG. 5C is a diagram for explaining a diffraction phenomenon caused in oblique incident exposure performed under conditions that 0th-order diffraction light, +first-order diffraction light and -first-order diffraction light pass through a lens;

DETAILED DESCRIPTION OF THE INVENTION

Prerequisites

Prerequisites for explaining preferred embodiments of the invention will be first described.

Since a photomask is generally used in a reduction projection type aligner, it is necessary to consider a reduction ratio in arguing a pattern dimension on the mask. However, in order to avoid confusion, in the description of each embodiment below, when a pattern dimension on a mask is mentioned in correspondence to a desired pattern to be formed (such as a resist pattern), a value obtained by converting the pattern dimension by using a reduction ratio (magnification) is used unless otherwise mentioned. Specifically, also in the case where a resist pattern with a width of 100 nm is formed by using a mask pattern with a width of M×100 nm in a 1/M reduction projection system, the width of the mask pattern and the width of the resist pattern are both described as 100 nm.

Also, in each embodiment of the invention, M and NA respectively indicate a reduction ratio and numerical aperture of a reduction projection optical system of an aligner, λ indicates the wavelength of exposing light and φ indicates an oblique incident angle in oblique incident exposure unless otherwise mentioned.

Embodiment 1

A photomask according to Embodiment 1 of the invention will now be described with reference to the accompanying drawings.

Figure 1A:
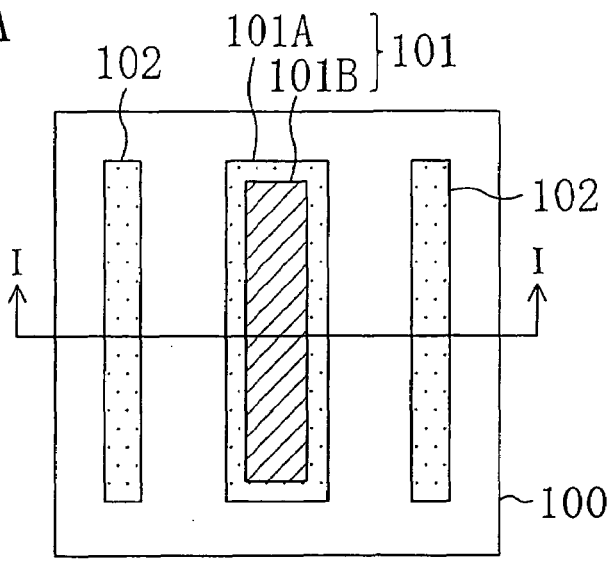
FIG. 1A is a plan view of a photomask according to Embodiment 1 of the invention and FIGS. 1B and 1C are cross-sectional views thereof taken along line I-I of FIG. 1A.
Figure 1B:
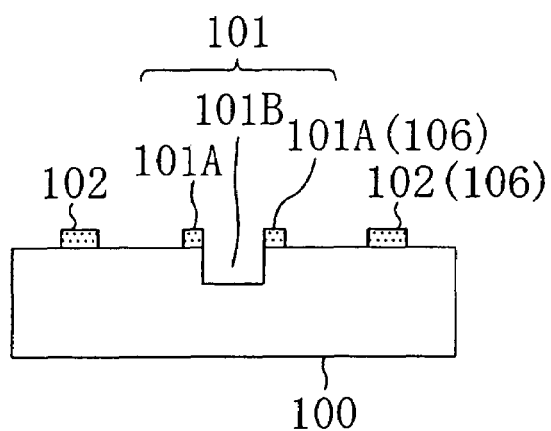
Figure 1C:
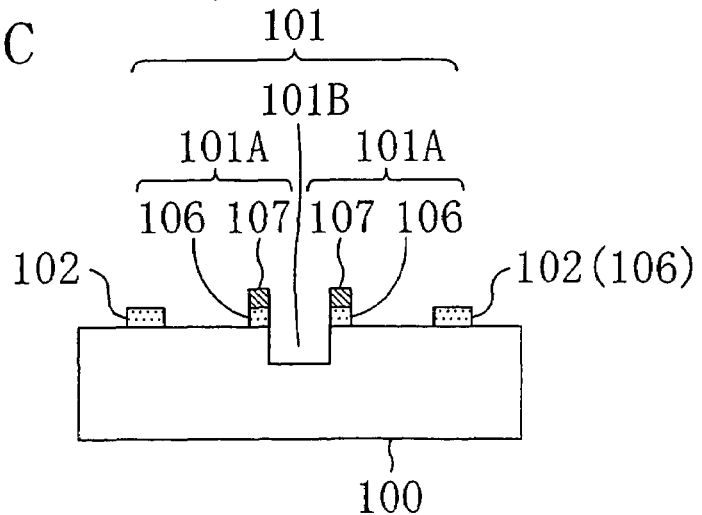

FIG. 1A is a plan view of the photomask of Embodiment 1, FIG. 1B is an exemplified cross-sectional view thereof taken along line I-I of FIG. 1A and FIG. 1C is another exemplified cross-sectional view thereof taken along line I-I of FIG. 1A.

As shown in FIGS. 1A and 1B, a line-shaped main pattern 101 to be transferred through exposure is provided on a transparent substrate 100. The main pattern 101 is composed of a first semi-shielding portion 101A having first transmittance for partially transmitting exposing light and a phase shifter 101B. The first semi-shielding portion 101A is formed so as to surround the line-shaped phase shifter 101B. In other words, the phase shifter 101B is formed at the center of the main pattern 101. The phase shifter 101B is formed by, for example, trenching the transparent substrate 100. On both sides of the main pattern 101 on the transparent substrate 100, a pair of auxiliary patterns 102 that diffract the exposing light and are not transferred through the exposure are provided with transparent portions sandwiched between the main pattern 101 and the auxiliary patterns 102. The auxiliary patterns 102 are made from a second semi-shielding portion having second transmittance for partially transmitting the exposing light. In this case, the first semi-shielding portion 101A and the second semi-shielding portion are, for example, a semi-shielding film 106 formed on the transparent substrate 100. It is noted that the first semi-shielding portion 101A and the auxiliary patterns 102 may be shielding portions.

In the photomask shown in FIGS. 1A and 1B, a mask pattern consists of the main pattern 101 and the auxiliary patterns 102. Also, an area on the transparent substrate 100 on which the mask pattern is not formed corresponds to the transparent portion (opening).

Furthermore, there is a relationship of opposite phases between light passing through the phase shifter 101B and light passing through the transparent portion (specifically, a relationship that a phase difference between these lights is not less than (150+360×n) degrees and not more than (210+360×n) degrees (wherein n is an integer)).

Moreover, there is a relationship of the identical phase between lights passing through the first semi-shielding portion 101A and the second semi-shielding portion (the auxiliary patterns 102) and light passing through the transparent portion (specifically, a relationship that a phase difference between these lights is not less than (−30+360×n) degrees and not more than (30+360×n) degrees (wherein n is an integer).

According to Embodiment 1, since the main pattern 101 is composed of the first semi-shielding portion (or the first shielding portion) 101A and the phase shifter 101B, the lights passing through the transparent portion and the first semi-shielding portion 101A (the lights in the identical phase) can be partially cancelled by the light passing through the phase shifter 101B (the light in the opposite phase), so that a strong shielding property can be realized. This effect is particularly remarkable when the main pattern 101 is a fine pattern and hence its shielding property is weak. On the other hand, since the auxiliary pattern 102 is made from the semi-shielding portion, its shielding property is weak. Therefore, while increasing the shielding degree of a shielded image corresponding to the main pattern 101 as compared with that attained by a general shielding pattern, the shielding property of the auxiliary patterns 102 can be reduced. Accordingly, the contrast in a light intensity distribution can be emphasized by employing the mask structure of this embodiment. Also, since the auxiliary patterns 102 having low transmittance are provided separately from the main pattern 101, diffraction light that interferes with the light passing through the phase shifter 101B of the main pattern 101 can be generated by disposing the auxiliary patterns 102 in appropriate positions. Accordingly, a defocus characteristic of a transferred image of the main pattern 101 can be improved, resulting in improving the DOF characteristic.

The following description is given under assumption that the main pattern is composed of the phase shifter and the semi-shielding portion, and unless otherwise mentioned, similar effects can be attained even when the main pattern is composed of a phase shifter and a shielding portion.

According to Embodiment 1, since the auxiliary patterns 102 are the semi-shielding portions with a weak shielding property, the auxiliary patterns 102 are minimally transferred through the exposure. This increases the degree of freedom in the arrangement of the auxiliary patterns under restriction that the auxiliary patterns 102 are not transferred. Accordingly, the periodicity in the whole pattern arrangement including the main pattern 101 can be increased, so that the DOF characteristic can be further improved. Also, since the auxiliary patterns 102 are the semi-shielding portion, the auxiliary patterns 102 can be made thick under restriction that they are not transferred through the exposure. Therefore, the photomask can be processed easily, and even if a dimensional error is caused in formation of the auxiliary patterns, the dimensional error less affects the transferred image of the main pattern 101. Furthermore, according to this embodiment, in the case where the peripheral portion of the main pattern 101 is made from the semi-shielding portion, a dimensional error of the main pattern 101 caused in the mask processing less affects the pattern formation.

Also, according to Embodiment 1, since the phase shifter 101B is provided at the center of the main pattern 101, the contrast in the light intensity distribution at the center of the shielded image corresponding to the main pattern 101 can be emphasized, so that, for example, a fine line pattern can be formed while keeping a good defocus characteristic.

Furthermore, according to Embodiment 1, the phase shifter 101B is formed by forming an opening in the semi-shielding portion (i.e., the semi-shielding film 106) and trenching the transparent substrate 100 within the opening. Therefore, the phase shifter can attain high transmittance. Also, the intensity of the light in the opposite phase passing through the inside of the main pattern (i.e., the phase shifter 101B) can be controlled in accordance with the size of the opening formed in the semi-shielding portion. Therefore, the light in the opposite phase passing through the main pattern 101 can be easily optimized, so that a very good defocus characteristic can be exhibited in the pattern formation. In other words, the mask dimension can be controlled in accordance with the width of a part of the semi-shielding portion surrounding the phase shifter, and in addition, the intensity of the light in the opposite phase can be controlled in accordance with the dimension of the opening formed in the semi-shielding portion. Therefore, as a peculiar effect of this embodiment, the mask dimension and the intensity of the light in the opposite phase can be independently controlled. As a result, while definitely realizing the effects attained by controlling the light in the opposite phase, such as the effect to improve the focus characteristic and the effect to improve the contrast of a fine pattern, a desired pattern dimension can be easily realized.

In Embodiment 1, the first transmittance of the first semi-shielding portion 101A included in the main pattern 101 is preferably 15% or less. Thus, in the pattern formation using the photomask, a resist film can be prevented from reducing in its thickness due to too much light passing through the semi-shielding portion or resist sensitivity can be optimized. In other words, such an effect as well as the effect to improve the DOF characteristic and the effect to improve the contrast can be both realized.

Also, in Embodiment 1, the second transmittance of the auxiliary patterns 102 (i.e., the second semi-shielding portion) is preferably not less than 6% and not more than 50%. Thus, while preventing an unexposed portion from being formed in a resist due to a too high shielding property of the auxiliary patterns 102, the effect to improve the DOF characteristic derived from the diffraction light can be definitely realized.

Furthermore, in Embodiment 1, the first semi-shielding portion 101A and the second semi-shielding portion working as the auxiliary patterns 102 may be made from the same semi-shielding film 106 such as a metal thin film formed on the transparent substrate 100. In this case, the respective semi-shielding portions can be easily formed, and hence, the photomask can be easily processed. As the metal thin film, a thin film (with a thickness of approximately 50 nm or less) of a metal such as Cr (chromium), Ta (tantalum), Zr (zirconium), Mo (molybdenum) or Ti (titanium), or an alloy of any of these metals can be used. Examples of the alloy are Ta—Cr alloy, Zr—Si alloy, Mo—Si alloy and Ti—Si alloy. Alternatively, a thick film including a silicon oxide such as ZrSiO, CrAlO, TaSiO, MoSiO or TiSiO may be used instead of the metal thin film.

Furthermore, also in the case where merely the first semi-shielding portion 101A of the main pattern 101 of Embodiment 1 is replaced with a shielding portion, the effect to improve the contrast attained by using the main pattern 101 and the auxiliary patterns 102 can be exhibited. Specifically, for example, as shown in FIG. 1C, a mask structure in which a shielding film 107 is further deposited on the semi-shielding film 106 used for forming the first semi-shielding portion 101A may be employed.

Figure 2A:
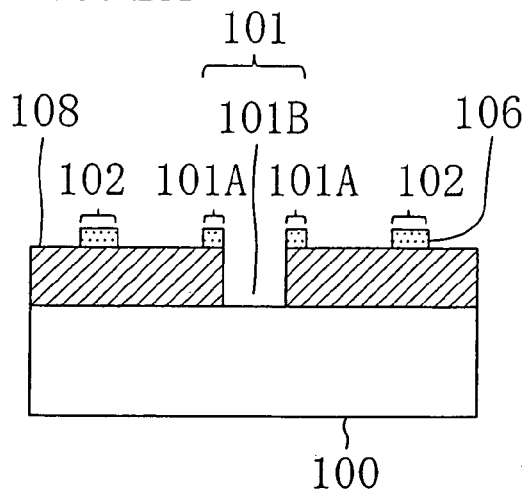
FIGS. 2A, 2B, 2C and 2D are diagrams for showing variations of the cross-sectional structure of the photomask of Embodiment 1 of the invention.
Figure 2B:
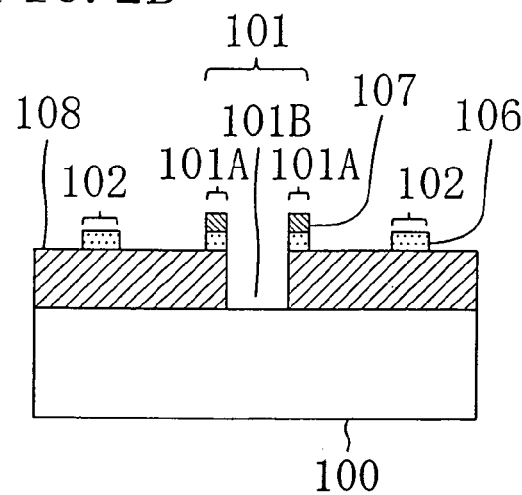

FIGS. 2A through 2D show variations of the photomask structure according to Embodiment 1. In other words, the mask structure shown in FIG. 1B can be replaced with a structure shown in FIG. 2A. In FIG. 2A, a phase shift film 108 made from a material with high transmittance and a semi-shielding film 106 are successively formed on a transparent substrate 100, the phase shift film 108 is removed in a formation region for the phase shifter 101B provided within the main pattern 101 and the semi-shielding film 106 is removed in formation regions for the phase shifter 101B and the transparent portion. Also in this case, a shielding film 107 may be deposited on the semi-shielding film 106 used for forming the first semi-shielding portion 101A of the main pattern 101 as shown in FIG. 2B. It is noted that in the mask structure shown in FIG. 2A or 2B, an area on the transparent substrate 100 in which the phase shift film 108 alone is formed corresponds to the transparent portion. When such a structure is employed, the phase of the phase shifter 101B can be controlled in accordance with the thickness of the phase shift film 108, and hence, the phase of the phase shifter 101B can be accurately controlled.

Figure 2C:
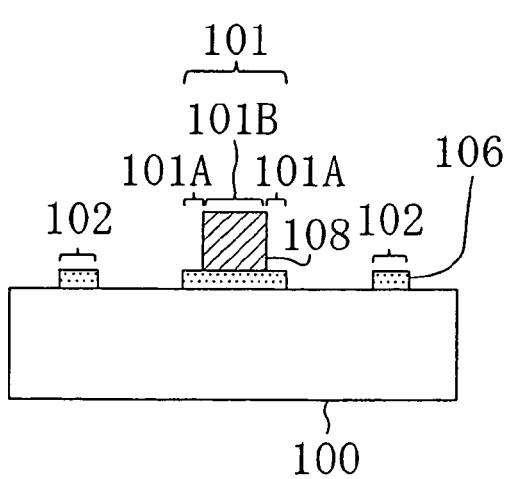
Figure 2D:
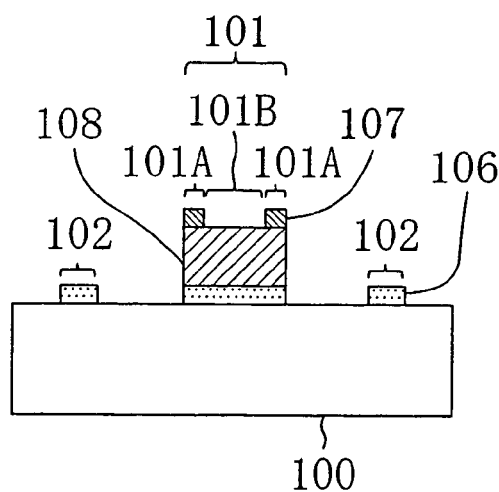

Alternatively, the mask structure of FIG. 1B can be replaced with a structure shown in FIG. 2C. In FIG. 2C, a semi-shielding film 106 and a phase shift film 108 made from a material with high transmittance are successively formed on a transparent substrate 100, the semi-shielding film 106 is removed in a transparent portion formation region and the phase shift film 108 is removed in a region other than a phase shifter formation region within the main pattern 101. In this case, a multilayer structure composed of the phase shift film 108 and a shielding film 107 may be formed on the semi-shielding film 106 used for forming the first semi-shielding portion 101A of the main pattern 101 as shown in FIG. 2D. When such a structure is employed, the phase of the phase shifter 101B can be controlled in accordance with the thickness of the phase shift film 108.

Next, a method for improving the resolution of a line pattern by emphasizing the shielding property of a mask pattern by employing the structure in which a phase shifter (namely, the phase shifter 101B) is provided at the center of a line-shaped shielding pattern (namely, the main pattern 101) (hereinafter which structure is referred to as the mask enhancer structure and which method is referred to as the center line enhancement method), which has been found by the present inventor, will be described. The following description is given by exemplifying the case where a fine line pattern is formed by the positive resist process. Also in the case where the negative resist process is used, the center line enhancement method can be similarly practiced by replacing a fine line pattern (a resist pattern) of the positive resist process with a fine space pattern (a resist removal pattern). Also, it is assumed for simplification in the following description that a shielding pattern excluding a phase shifter is made from a shielding portion.

In a mask enhancer, when the pattern width and the width of the phase shifter are adjusted so that the intensity of light rounding from the periphery of the shielding pattern to the reverse face thereof can balance with the intensity of light passing through the phase shifter, the amplitude intensity of light passing through the mask enhancer has a distribution where the amplitude intensity is 0 (zero) in a position corresponding to the center of the mask enhancer. In this case, also the intensity of the light passing through the mask enhancer (which is a square of the amplitude intensity) has a distribution where the intensity is 0 (zero) in the position corresponding to the center of the mask enhancer. In other words, an image with high contrast can be formed by using the mask enhancer. In this case, even when the shielding portion is a semi-shielding portion that transmits light in the identical phase with respect to the transparent portion (transparent substrate) and has finite transmittance, the same effect can be attained. Specifically, in consideration of the weak shielding property, a semi-shielding portion is not preferred as a line-shaped mask pattern, but when a phase shifter is provided within the semi-shielding portion, namely, when the mask enhancer structure is employed, an image with high contrast can be formed. In other words, a semi-shielding portion can be utilized for fine pattern formation.

As described above, the center line enhancement method is very effective, due to its principle, in a state where a pattern composed of a completely shielding portion alone (a completely shielding pattern) is difficult to form on a mask. Specifically, the center line enhancement method can exhibit its effect when the width of a mask pattern is too small to shield light by using the completely shielding pattern due to diffraction, namely, when the mask pattern has a width of $0.8 \times \lambda/NA$ or less, and the center line enhancement method can exhibit its effect more remarkably when the mask pattern has a width of $0.5 \times \lambda/NA$ or less, where the influence of the diffraction is large. Furthermore, the center line enhancement method can exhibit its effect very remarkably when the mask pattern has a width of $0.4 \times \lambda/NA$ or less, where pattern formation using a completely shielding pattern is very difficult. Accordingly, in this embodiment employing the mask enhancer structure for the main pattern, the effect is exhibited particularly when the mask width of the main pattern has a very small dimension as described above, and hence, this embodiment is highly effective in formation of a fine pattern. It is noted that the width of the mask pattern of the mask enhancer structure herein means a width of the whole outline shape of the shielding portion or the semi-shielding portion including the phase shifter.

Now, it will be described that the influence of a dimensional error of a mask on the pattern formation can be reduced by employing the mask enhancer structure for a main pattern accompanying an auxiliary pattern.

When an auxiliary pattern is added in the vicinity of a main pattern, the resultant mask pattern is densely arranged. In general, in a densely arranged mask pattern, the influence of a dimensional error of the mask on the pattern formation is large. When the mask enhancer structure is used for the main pattern, however, this influence can be reduced.

Figure 3A:
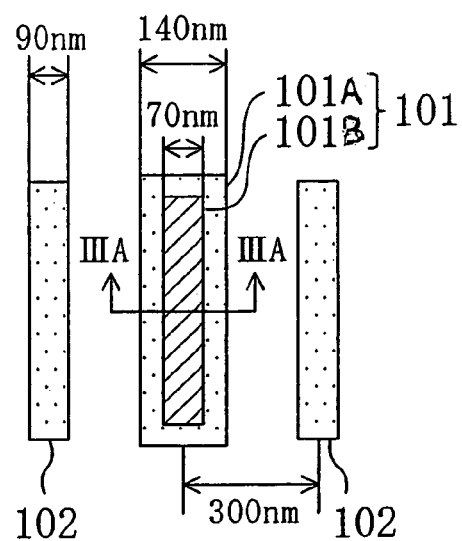
FIGS. 3A, 3B, 3C and 3D are diagrams for explaining that the influence of a dimensional error in a mask on pattern formation can be reduced by employing a mask enhancer structure for a main pattern accompanying auxiliary patterns.

FIG. 3A is a diagram of a mask pattern consisting of a main pattern 101 with the mask enhancer structure including a phase shifter 101B and a semi-shielding portion 101A and auxiliary patterns 102 made from a semi-shielding portion. Specifically, the mask pattern is composed of the main pattern 101 with a width of 140 nm and the auxiliary patterns 102 with a width of 90 nm each having its center away from the center of the main pattern 101 by 300 nm. In the mask enhancer structure of the main pattern 101, the phase shifter 101B has a width of 70 nm. In the case where auxiliary patterns 102 are the same as those of the mask pattern of FIG. 3A and the main pattern 101 is simply made from a shielding portion (shielding pattern) 109 as in FIG. 3B, it is necessary to provide a width of 180 nm to the shielding pattern in order to attain a shielding property equivalent to that attained by the mask enhancer structure of FIG. 3A.

Figure 3B:
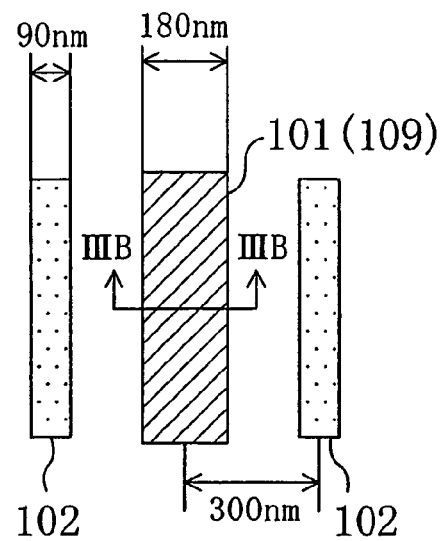
Figure 3C:
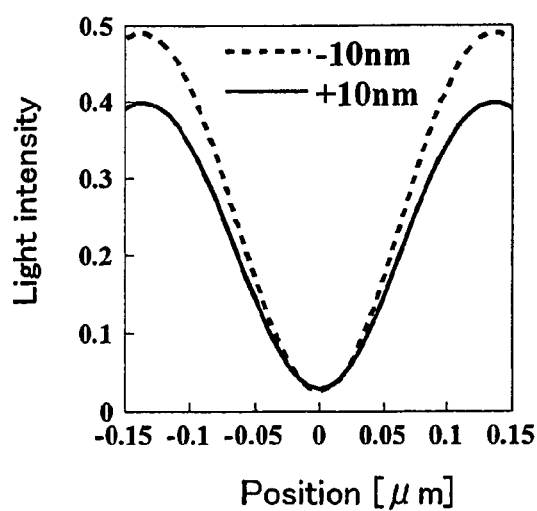
Figure 3D:
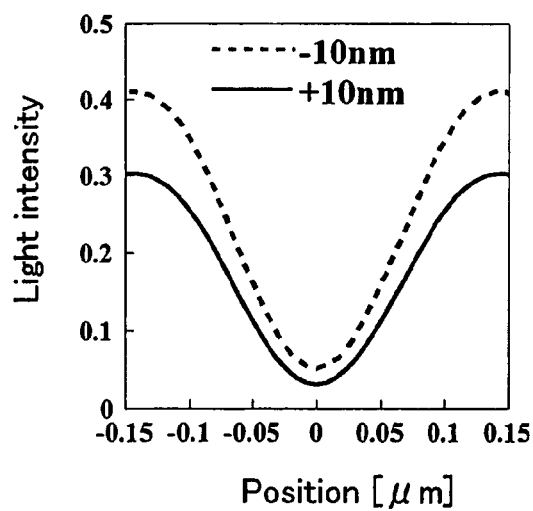

FIGS. 3C and 3D are diagrams for respectively showing the results of simulation for the influence on the pattern formation when the main pattern widths and the auxiliary pattern widths of the mask patterns of FIGS. 3A and 3B are simultaneously changed by 10 nm, respectively. Specifically, FIG. 3C shows the result of simulation for a light intensity distribution caused in a position corresponding to line IIIA-IIIA (along a widthwise direction of the main pattern 101) of FIG. 3A through pattern exposure, and FIG. 3D shows the result of simulation for a light intensity distribution caused in a position corresponding to line IIIB-IIIB (along a widthwise direction of the main pattern 101) of FIG. 3B through pattern exposure. In the simulation, the wavelength λ of a light source is 193 nm (which is the wavelength of an ArF light source) and the lens numerical aperture NA is 0.6. Also, all the semi-shielding portions used in the mask patterns have transmittance of 6%. In FIGS. 3C and 3D, a result obtained by increasing each pattern width (mask dimension) by 10 nm (+10 nm) is shown with a solid line and a result obtained by reducing each pattern width by 10 nm (−10 nm) is shown with a broken line. Also, in FIGS. 3C and 3D, a position corresponding to the center of the main pattern 101 is set to 0 (zero).

It is understood from the simulation results shown in FIGS. 3C and 3D that the light intensity at the center of the main pattern is minimally changed against the change of the mask dimension when the main pattern has the mask enhancer structure. Also, in the evaluation by using the dimension of a pattern to be formed, when the main pattern width and the auxiliary pattern width, namely, the mask dimension, are increased by 10 nm under conditions that a pattern with a width of 100 nm is formed by using the mask structure of FIG. 3A, the width of the pattern to be formed is 106 nm. Similarly, when the mask dimension is reduced by 10 nm, the width of the pattern to be formed is 95 nm. Specifically, even when the mask dimension is increased/reduced by approximately 10 nm, the dimension of the pattern to be formed is affected by merely approximately 5 nm.

On the other hand, when the mask dimension of the main pattern and the auxiliary pattern is increased by 10 nm under conditions that a pattern with a width of 100 nm is formed by using the mask structure of FIG. 3B, the dimension of the pattern to be formed is 116 nm. Similarly, when the mask dimension is reduced by 10 nm, the dimension of the pattern to be formed is 86 nm. Specifically, when the mask dimension is increased/reduced by 10 nm, the dimension of the pattern to be formed is increased/reduced by as much as approximately 15 nm. In other words, when the mask structure of FIG. 3B is used, the pattern dimension is changed more largely than the variation of the mask dimension, and hence, a mask dimension error can largely affect the pattern formation.

In this manner, when the mask enhancer structure is employed for a main pattern disposed in the vicinity of an auxiliary pattern, an effect to suppress the influence of mask dimension variation on the pattern formation can be attained. This effect is particularly remarkable in the mask enhancer structure in which a main pattern is composed of a phase shifter and a semi-shielding portion, but a similar effect can be attained in a mask enhancer structure in which a main pattern is composed of a phase shifter and a shielding portion.

In this embodiment, the auxiliary patterns are not necessarily provided on the both sides of the main pattern. Specifically, in the case where a main pattern is disposed in the vicinity of one side of another main pattern, an auxiliary pattern may be provided merely on the other opposite side of the main pattern.

Modification 1 of Embodiment 1

A photomask according to Modification 1 of Embodiment 1 will now be described with reference to the accompanying drawings.

FIG. 4 is a plan view of a mask pattern of the photomask according to Modification 1 of Embodiment 1. In FIG. 4, like reference numerals are used to refer to like elements of the photomask of Embodiment 1 shown in FIGS. 1A and 1B, so as to omit the description.

As a first characteristic of this modification, each auxiliary pattern 102 (with a width D1) is disposed in a position away from the center of a phase shifter 101B (with a width W) of a main pattern 101 (with a width L) by a distance $\lambda/(2\times\sin \phi)$ with respect to a predetermined oblique incident angle φ.

As a second characteristic of this modification, a second auxiliary pattern 103 (with a width D2) that diffracts the exposing light and is not transferred through the exposure is disposed in a position away from the center of the phase shifter 101B of the main pattern 101 by a distance $\lambda/(2\times\sin \phi)+\lambda/(NA+\sin \phi)$, namely, in a position away from the center of the auxiliary pattern 102 (hereinafter referred to as the first auxiliary pattern) by a distance $\lambda/(NA+\sin \phi)$. There is a transparent portion sandwiched between the first auxiliary pattern 102 and the second auxiliary pattern 103. Also, the second auxiliary pattern 103 is made from a semi-shielding portion similarly to the first auxiliary pattern 102.

According to this modification, the effect to improve the DOF attained by providing the auxiliary patterns can be definitely realized.

It is noted that either of the first auxiliary patterns 102 and the second auxiliary patterns 103 may be omitted in this modification.

Also, in this modification, the aforementioned effect can be attained to some extent even when the distance between the center of the phase shifter 101B and the center of the first auxiliary pattern 102 is approximate to $\lambda/(2\times\sin \phi)$.

Furthermore, in this modification, the aforementioned effect can be attained to some extent even when the distance between the center of the phase shifter 101B and the center of the second auxiliary pattern 103 is approximate to $\lambda/(2\times\sin \phi)+\lambda/(NA+\sin \phi)$.

Also, in this modification, the oblique incident angle φ is preferably not less than 0.40×NA and not more than 0.80×NA, and more preferably, not less than 0.58×NA and not more than 0.70×NA. In the case where annular illumination is used for the exposure, the oblique incident angle φ is preferably not less than 0.60×NA and not more than 0.80×NA. In the case where quadrupole illumination is used for the exposure, the oblique incident angle φ is preferably not less than 0.40×NA and not more than 0.60×NA (which will be described in detail in Modification 2 of Embodiment 1 below.)

Furthermore, in this modification, the width L of the main pattern 101 is larger than the width W of the phase shifter 101B preferably by at least 2×20 nm (in the actual dimension on the mask), and more preferably by at least a twice of a quarter of the exposure wavelength (i.e., the wavelength of the exposing light). Specifically, in the mask enhancer structure of the main pattern, a part of the semi-shielding portion (or the shielding portion) sandwiched between the phase shifter and the transparent portion has a width preferably of 20 nm or more (in the actual dimension on the mask) and more preferably of a quarter or more of the exposure wavelength. Since this photomask employs the mask enhancer structure, the main pattern preferably has a width of $0.8 \times \lambda/NA$ or less, and accordingly, the part of the semi-shielding portion (or the shielding portion) sandwiched between the phase shifter and the transparent portion has a width preferably not exceeding $0.4 \times \lambda/NA$ (which will be described in detail in Modification 3 of Embodiment 1 below).

In addition, in this modification, the width D2 of the second auxiliary pattern 103 is preferably larger than the width D1 of the first auxiliary pattern 102, and more particularly, the width D2 is preferably 1.2 times as large as the width D1 (which will be described in detail in Modification 4 of Embodiment 1 below).

Now, the reason why the defocus characteristic can be improved in the pattern formation when diffraction light that interferes with light passing through the opening (the phase shifter 101B) provided within the mask enhancer is generated by disposing the diffraction light generation patterns (auxiliary patterns 102) in the above-described specified positions against the main pattern 101 having the mask enhancer structure will be described.

FIG. 5A is a diagram for explaining a diffraction phenomenon caused when exposure is performed on a mask on which patterns are periodically arranged. As shown in FIG. 5A, a mask 150 in which a plurality of shielding patterns (hereinafter referred to as the pitch patterns) 151 are substantially infinitely periodically arranged at predetermined pitch P is irradiated with light 141 emitted from a light source 140. Herein, "to be substantially infinitely periodically arranged" means that the pitch pattern 151 disposed at the center of the mask can attain an effect attained by each of a substantially infinite number of pitch patterns periodically arranged. In other words, it means that the pitch patterns 151 are disposed so that a distance from a pitch pattern 151 disposed at the center of the mask to another pitch pattern 151 disposed at the edge of the mask can be approximately $4 \times \lambda/NA$ or more.

FIG. 5A shows the diffraction phenomenon caused in assuming the oblique incident exposure. Specifically, the light source 140 is disposed in a position away from the normal line (indicated with a long dashed short dashed line in the drawing) extending through the center of a lens 152 by a distance S. In this case, the incident angle (the oblique incident angle) $\phi$ of the light 141 from the light source 140 against the mask 150 is represented as $\sin \phi = S \times NA$. Herein, the distance S used for defining the oblique incident angle $\phi$ is designated as an oblique incident position. The coordinate of the light source 140 is represented by using a value standardized by the numerical aperture NA. Also, the diffraction angle $\theta n$ of nth-order diffraction light (wherein n is an integer) of the light 141 having passed through the pitch patterns 151 arranged at the pitch P is represented as $\sin \theta n = n \times \lambda/P$. Also, 0th-order diffraction light 142 of the light 141 having entered the mask 150 at the oblique incident angle $\phi$ reaches a position expressed as a coordinate $r0 = -\sin \phi = -S \times NA$ on the lens 152 (a coordinate on a one-dimensional coordinate system having the lens center as the origin; which applies to coordinates mentioned below). Furthermore, first-order diffraction light (+first-order diffraction light) 143 of the light 141 reaches a position expressed as a coordinate $r1 = r0 + \sin \theta 1 = r0 + \lambda/P$. In general, a position on the lens 152 where nth-order diffraction light reaches is expressed as a coordinate $rn = r0 + \sin \theta n = r0 + n \times \lambda/P$, whereas when the absolute value of rn exceeds NA, the nth-order diffraction light is not diffraction light passing through the lens 152, and hence is not focused on a wafer.

In an ideal lens, phase change caused in defocus of diffraction light that passes through the lens and is focused on a wafer is determined merely by the distance (radius) from the lens center to a position of the lens through which the diffraction light passes. In the case where light enters the lens perpendicularly, 0th-order diffraction light always passes through the lens center and first-order or higher order diffraction lights pass through positions away from the lens center. Therefore, in defocus, a phase difference is caused between the 0th-order diffraction light passing through the lens center and the higher order diffraction light passing through a position away from the lens center, which results in image defocus.

FIG. 5B is a diagram for explaining a diffraction phenomenon caused when the mask of FIG. 5A is subjected to the oblique incident exposure under conditions that the 0th-order diffraction light and the first-order diffraction light alone pass through the lens and $r0 = -r1$. As shown in FIG. 5B, the 0th-order diffraction light 142 and the first-order diffraction light 143 pass through positions away from the center of the lens 152 by the same distance. Therefore, the phase change caused in defocus is identical between the 0th-order diffraction light 142 and the first-order diffraction light 143. Specifically, no phase difference is caused between these diffraction lights, so that image defocus derived from the defocus can be avoided. At this point, in consideration of $r0 = -r1$, $r1 = r0 + \sin \theta 1$ can be modified to $-2 \times r0 = \sin \theta 1$. Furthermore, in consideration of $\sin \theta 1 = \lambda/P$ and $r0 = -\sin \phi$, $2 \times \sin \phi = \lambda/P$ can be obtained. Accordingly, through the oblique incident exposure with the oblique incident angle $\phi$ expressed as $\sin \phi = \lambda/(2 \times P)$, pattern formation with a good defocus characteristic can be performed. In other words, in the oblique incident exposure with the oblique incident angle $\phi$, a good defocus characteristic can be attained when periodical patterns are provided on a mask with a pitch P of $\lambda/(2 \times \sin \phi)$. This is why the defocus characteristic can be improved by using substantially infinitely periodically arranged pitch patterns in the oblique incident exposure.

However, it is only when the pitch P is equal to or approximate to $\lambda/(2 \times \sin \phi)$ that the aforementioned good defocus characteristic can be obtained. Also, this effect to improve the defocus characteristic can be obtained under conditions that diffraction lights passing through the lens are the 0th-order diffraction light and one of the +first-order diffraction light and the −first-order diffraction light.

FIG. 5C is a diagram for explaining a diffraction phenomenon caused when the mask of FIG. 5A is subjected to the oblique incident exposure under conditions that the 0th-order diffraction light, the +first-order diffraction light and the −first-order diffraction light pass through the lens. As shown in FIG. 5C, even under conditions that the 0th-order diffraction light 142 passes through a position on the lens 152 expressed by the coordinate $r0 = -\sin \phi$ and the +first-order diffraction light 143 passes through a position on the lens 152 expressed by the coordinate $r1 = \sin \phi$, a good defocus characteristic cannot be obtained if the coordinate $r0 - \sin \theta 1$ of a position on the lens 152 where the −first-order diffraction light 144 passes is within the lens 152. At this point, a condition that the −first-order diffraction light 144 passes out of the lens 152 is expressed as $r0 - \sin \theta 1 < -NA$. Also, in consideration of $r0 = -\sin \phi$ and $\sin \theta 1 = r1 - r0 = 2 \times \sin \phi$, the condition that the −first-order diffraction light 144 passes out of the lens 152 is expressed as $-\sin \phi - 2 \times \sin \phi < -NA$, namely, $3 \times \sin \phi > NA$.

In other words, a condition that both the +first-order diffraction light and the −first-order diffraction light pass through the lens in employing the oblique incident angle $\phi$ is expressed as $3 \times \sin \phi < NA$. When the oblique incident angle $\phi$ satisfies this condition, both the +first-order diffraction light and the −first-order diffraction light pass through the lens and the distances from the lens center to the positions where the +first-order diffraction light and the −first-order diffraction light respectively pass through the lens are different from each other. Therefore, the image defocus is caused due to a phase difference between these diffraction lights in defocus. Accordingly, the lower limit of the oblique incident angle φ for realizing the improvement of the defocus characteristic is defined as sin φ>NA/3. Considering that the 0th-order diffraction light does not pass through the lens when sin φ exceeds NA, a condition of the oblique incident angle φ for improving the defocus characteristic is expressed as NA>sin φ>NA/3.

Figure 6A:
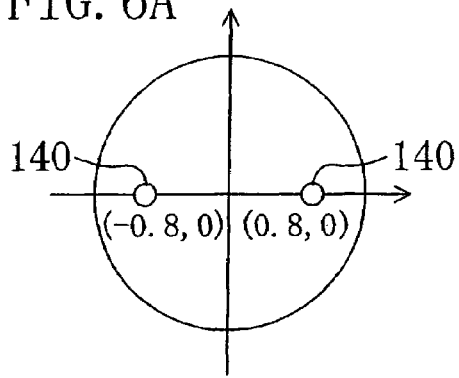
FIG. 6A is a diagram of a point light source used in simulation for a DOF characteristic obtained in oblique incident exposure performed on the mask of FIG. 5A while changing a pitch of pitch patterns.
Figure 6B:
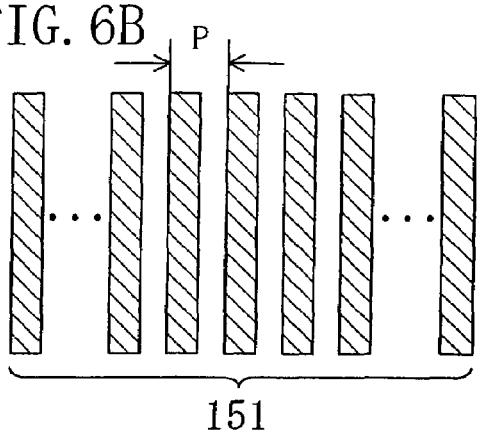
FIG. 6B is a diagram of the pitch patterns used in the simulation.
Figure 6C:
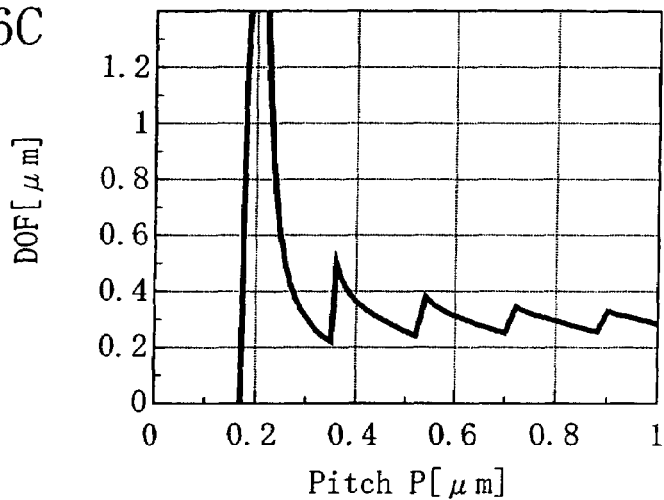
FIG. 6C is a graph for showing the result of the simulation and FIG. 6D is a diagram for explaining a diffraction phenomenon caused in oblique incident exposure performed on the mask of FIG. 5A under conditions that 0th-order diffraction light, first-order diffraction light and second-order diffraction light pass through a lens.

Next, the result of simulation for a DOF characteristic obtained in the oblique incident exposure performed on the mask of FIG. 5A with the pitch of the pitch patterns changed will be described. FIG. 6A is a diagram of a point light source used in the simulation, FIG. 6B is a diagram of pitch patterns used in the simulation, and FIG. 6C is a graph for showing the result of the simulation for the DOF characteristic. In the simulation for the DOF characteristic, a pair of light sources (point light sources) 140 shown in FIG. 6A are used, and specifically, the pair of point light sources 140 are positioned in coordinates (light source coordinates), on a plane perpendicular to the normal line extending through the center of the lens 152 (a two-dimensional coordinate system), of (−0.8, 0) and (0.8, 0). In this case, the point light sources 140 are ArF light sources (with a wavelength λ of 193 nm). Also, in the simulation for the DOF characteristic, the oblique incident exposure is performed with the lens numerical aperture NA set to 0.6 and the oblique incident angle φ set to satisfy sin φ=0.48 (namely, the distance S of FIG. 5A set to 0.8). Furthermore, the pitch patterns 151 shown in FIG. 6B, namely, the pitch patterns 151 infinitely periodically arranged at the pitch P, are line-shaped shielding patterns each with a width of 100 nm, and formation of a pattern with a width of 100 nm by using the pitch pattern 151 is simulated. A value of the DOF shown in FIG. 6C is a range of the defocus in which a pattern having a width of 100 nm can be formed with a dimensional error of 10 nm or less. As shown in FIG. 6C, in the case where the pitch P of the pitch patterns 151 is equal to or approximate to λ/(2×sin φ) (i.e., approximately 0.20 μm), a very large DOF can be obtained. However, when the pitch P is smaller or larger than λ/(2×sin φ), the value of the DOF is abruptly reduced.

Figure 6D:
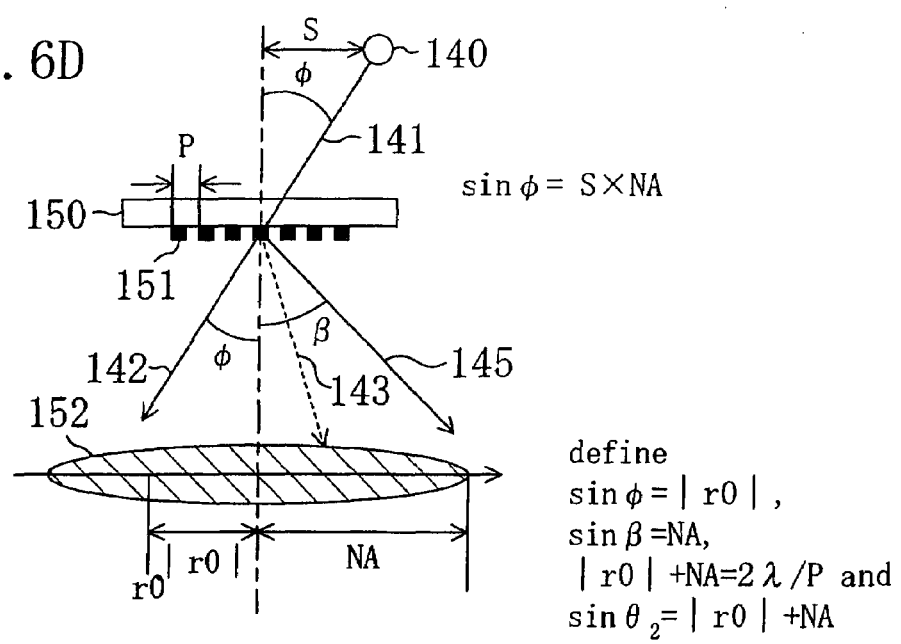

At this point, the present inventor has paid attention, in the dependency of the DOF on the pitch shown in FIG. 6C, to that values of the pitch P for locally improving the DOF are present at equal intervals when the pitch P is changed. Furthermore, the present inventor has found that the values of the pitch P for locally improving the DOF are obtained by multiplying λ/(NA+sin φ) (i.e., approximately 1.8 μm) by an integral number, at which high-order diffraction light affects image focus. This will be described as follows:

In a diffraction phenomenon of light, diffraction lights of one order and another adjacent order have opposite phases. FIG. 6D is a diagram for explaining a diffraction phenomenon caused when the mask of FIG. 5A is subjected to the oblique incident exposure under conditions that the 0th-order diffraction light, the first-order diffraction light and the second-order diffraction light pass through the lens. In this case, the second-order diffraction light 145 of FIG. 6D has a phase opposite to that of the first-order diffraction light 143. When an image formed by the 0th-order diffraction light 142 and the first-order diffraction light 143 through the oblique incident exposure is interfered by an image formed by the second-order diffraction light 145 in the opposite phase, these images mutually cancel the intensity of the opposite images. In the defocus, however, although the intensities of these images are reduced, since the first-order diffraction light 143 and the second-order diffraction light 145 are in the opposite phases, degradation in the respective images caused by the defocus can be mutually cancelled. In other words, in an image resulting from the interference between the image formed by the first-order diffraction light 143 and the image formed by the second-order diffraction light 145 in the opposite phase, the defocus characteristic is improved, resulting in improving the DOF characteristic.

A condition for thus improving the DOF characteristic corresponds to a condition that the second-order diffraction light 145 passes through the lens 152 as shown in FIG. 6D, which is expressed as sin θ2<NA−r0. At this point, in consideration of sin θ2=2×λ/P and r0=−sin φ, the aforementioned condition is expressed as 2×λ/P<NA+sin φ. Accordingly, pitch P for changing a state where lights up to the first-order diffraction light 143 pass through the lens 152 to a state where lights up to the second-order diffraction light 145 pass through the lens 152 is expressed as 2×λ/(sin φ+NA). Also, in general, a condition that nth-order diffraction light passes through a lens is expressed as sin θn=n×λ/P<NA−r0=NA+sin φ. In other words, the nth-order diffraction light can pass through the edge of a lens when the pitch P is n×λ/(sin φ+NA) or more. Accordingly, the DOF characteristic is locally improved when the pitch P is n×λ/(sin φ+NA) (wherein n is an integer of 2 or more).

As described above, the defocus characteristic can be improved in the oblique incident exposure by utilizing interference between lights in the opposite phases. Therefore, the present inventor has concluded that the defocus characteristic can be improved through an operation for causing a function equivalent to that caused by increasing the intensity of the second-order diffraction light in the opposite phase to the first-order diffraction light. Specifically, the defocus characteristic can be improved through an operation for introducing, into diffraction lights generated by periodically arranging shielding patterns, a component of the 0th-order diffraction light in the opposite phase to the first-order diffraction light. This operation can be realized by utilizing the above-described mask enhancer structure. Specifically, in the mask enhancer, light in the opposite phase can be controlled by controlling the dimension of the phase shifter (the opening) provided within the mask enhancer while adjusting the degree of shielding attained by the mask enhancer without changing the order of diffraction light passing through the lens. The present inventor has presumed that when the mask enhancer is employed, the DOF locally slightly improved when the pitch P is n×λ/(sin φ+NA) (wherein n is an integer of 2 or more) (see FIG. 6C) can be largely improved in proportion to the dimension of the phase shifter of the mask enhancer.

Figure 7A:
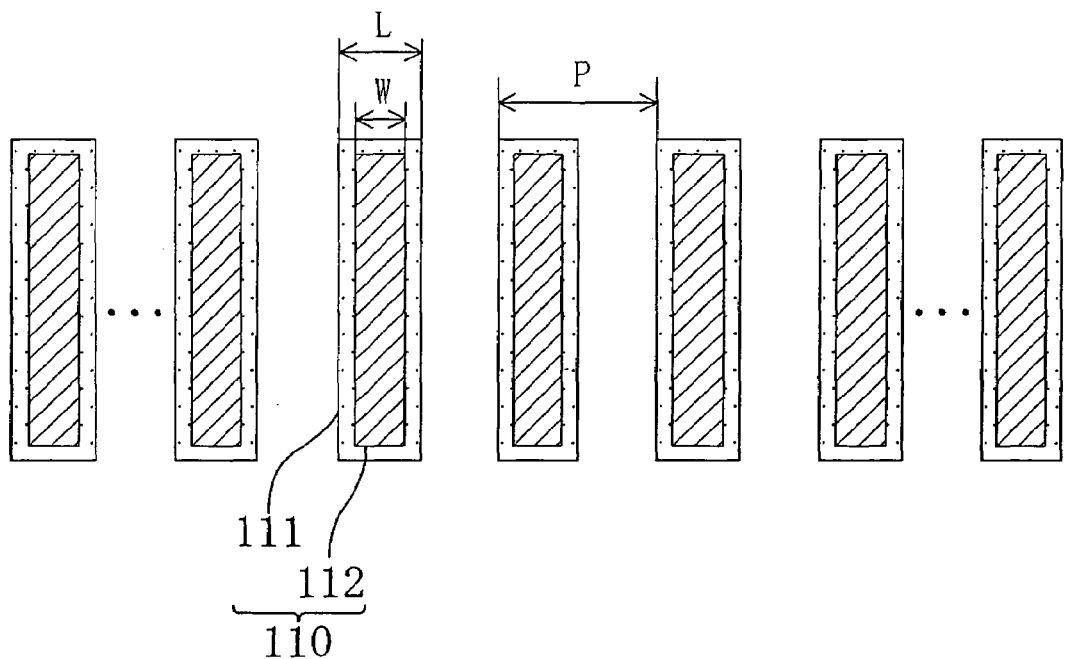
FIG. 7A is a diagram of pitch patterns (that is, mask enhancers arranged substantially infinitely periodically) used in simulation for a DOF characteristic obtained by performing oblique incident exposure while changing the pitch of the pitch patterns on a mask
Figure 7B:
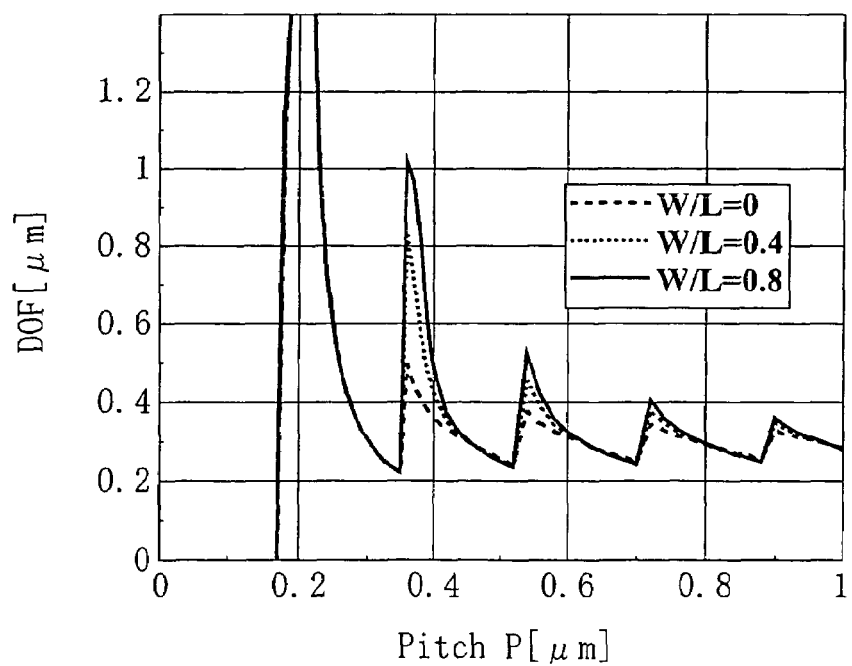
FIG. 7B is a graph for showing the result of the simulation.

Therefore, the result of simulation performed similarly to the simulation shown in FIG. 6A through 6C by the present inventor by using a mask enhancer as the pitch patterns will now be described. FIG. 7A is a diagram of mask enhancers used as the pitch patterns in the simulation, and FIG. 7B is a graph for showing the result of the simulation for the DOF characteristic obtained by using the pitch patterns of FIG. 7A. Point light sources used in this simulation are the same as those shown in FIG. 6A and the simulation is performed under the same conditions as those employed in FIG. 6A through 6C. Furthermore, FIG. 7B also shows the result obtained by changing the size of the phase shifter (the width of the opening) in the mask enhancer.

As shown in FIG. 7A, a plurality of mask enhancers 110 are substantially infinitely periodically arranged at predetermined pitch P. Each mask enhancer 110 is composed of a semi-shielding portion 111 in the shape corresponding to the outline of the mask enhancer and a phase shifter 112 provided at the center of the mask enhancer 110 and surrounded by the semi-shielding portion 111. In this case, the mask enhancer 110 has a width (pattern width) L and the phase shifter 112 has a width (opening width) W.

Similarly to the DOF characteristic shown in FIG. 6C, in the DOF characteristic shown in FIG. 7B, the DOF is locally increased when the pitch P is $n \times \lambda/(\sin \phi + NA)$ (wherein n is an integer of 2 or more). Also, as the ratio of the opening width W to the pattern width L (namely, W/L) is larger, the DOF is much more largely improved. In other words, as an effect peculiar to the mask enhancer, when patterns consisting of periodically arranged mask enhancers are subjected to the oblique incident exposure, pattern transfer with a good DOF characteristic can be performed not only when the pitch P is equal to or approximate to $\lambda/(2 \times \sin \phi)$ (which is approximately 0.20 μm under the conditions for the simulation) but also when the pitch P is as large as $n \times \lambda/(\sin \phi + NA)$ (which is approximately n×0.18 μm under the conditions for the simulation; wherein n is an integer of 2 or more).

Figure 8A:
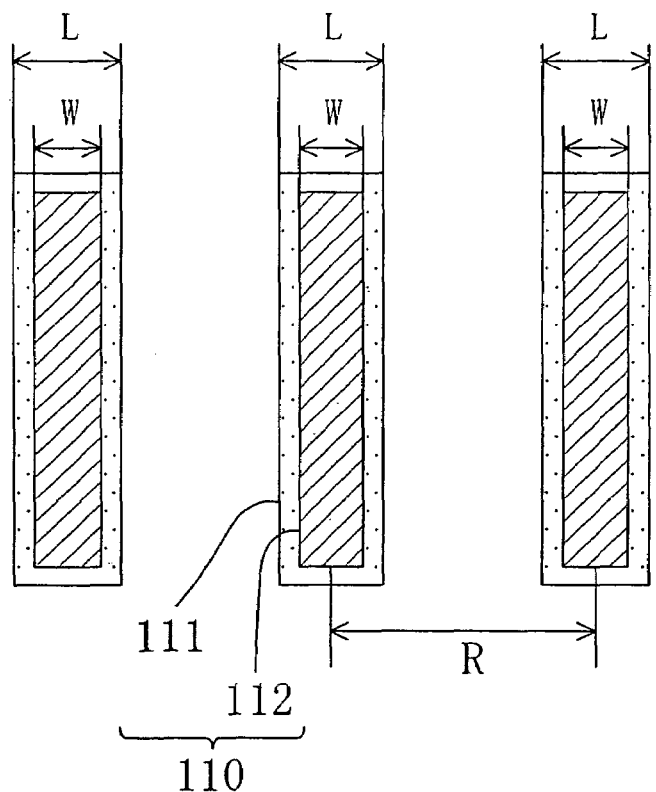
FIG. 8A is a diagram of pitch patterns (that is, three mask enhancers arranged in parallel) used in simulation for a DOF characteristic obtained by performing oblique incident exposure while changing the pitch of the pitch patterns on a mask
Figure 8B:
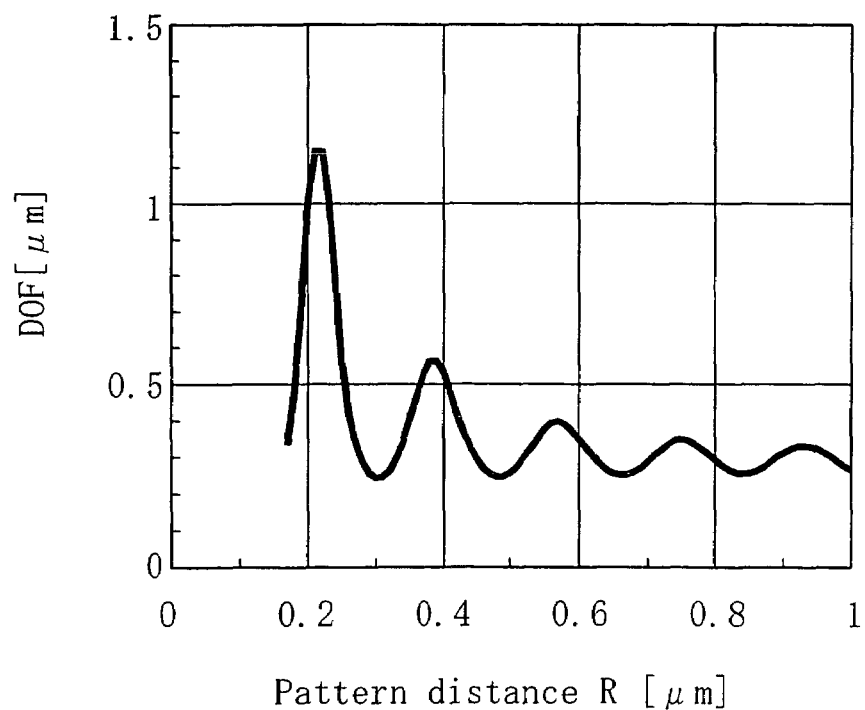
FIG. 8B is a graph for showing the result of the simulation.

Furthermore, the result of simulation performed by the present inventor similarly to that shown in FIGS. 6A through 6C by using, as mask enhancers working as pitch patterns, three mask enhancers arranged in parallel instead of the substantially infinitely periodically arranged mask enhancers shown in FIG. 7A will be explained. FIG. 8A is a diagram of the mask enhancers used in the simulation and FIG. 8B is a diagram for showing the result of the simulation for the DOF characteristic obtained by using the mask enhancers of FIG. 8A. Point light sources used in the simulation are the same as those shown in FIG. 6A and the other conditions for the simulation are the same as those employed in FIGS. 6A through 6C. Specifically, the oblique incident exposure is performed with the lens numerical aperture NA of 0.6, the distance S (see FIG. 5A) set to 0.8 and the oblique incident angle $\phi$ set to satisfy $\sin \phi = S \times NA = 0.48$.

As shown in FIG. 8A, the three mask enhancers 110 are arranged in parallel at an equal interval (i.e., a pattern distance R). Each mask enhancer 110 is composed of a semi-shielding portion 111 in the shape corresponding to the outline of the mask enhancer and a phase shifter 112 disposed at the center of the mask enhancer 110 and surrounded by the semi-shielding portion 111. In this case, when the mask enhancer 110 has a width (pattern width) L and the phase shifter 112 has a width (opening width) W, the ratio W/L is 0.4.

FIG. 8B shows the DOF characteristic obtained by the mask enhancer 110 disposed at the center out of the three mask enhancers 110 with the pattern distance R changed. Similarly to the DOF characteristic shown in FIG. 7B, also in the DOF characteristic shown in FIG. 8B, the DOF characteristic is locally improved when the pitch P, namely, the pattern distance R (more accurately, a distance between the phase shifters 112 of the adjacent mask enhancers 110) is equal to or approximate to $\lambda/(2 \times \sin \phi)$ (which is approximately 0.20 μm under the conditions for the simulation). Also, as shown in FIG. 8B, a maximum value of the DOF appears also when the pattern distance R is a value obtained by adding a multiple of $\lambda/(\sin \phi + NA)$ (which is approximately 0.18 μm) to $\lambda/(2 \times \sin \phi)$ (which is approximately 0.20 μm).

In other words, when the patterns consisting of the three mask enhancers 110 are subjected to the oblique incident exposure, a maximum value of the DOF is obtained when the pattern distance R is $\lambda/(2 \times \sin \phi)$ (which is approximately 0.20 μm). Furthermore, a maximum value of the DOF can be obtained also when the pattern distance R is $\lambda/(2 \times \sin \phi) + n \times \lambda/(\sin \phi + NA)$ (wherein n is a natural number). This seems to be caused, in the oblique incident exposure performed on the patterns consisting of the infinitely periodically arranged mask enhancers, by a diffraction phenomenon that phase shifts (phase change) respectively caused in the 0th-order diffraction light and the first-order diffraction light are synchronized due to the defocus as well as by a phenomenon that images formed by the 0th-order diffraction light and the first-order diffraction light are interfered by higher order diffraction light in the opposite phase. Accordingly, it can be presumed that the aforementioned relational expression representing the pattern distance R for obtaining a maximum value of the DOF holds in general.

Figure 9A:
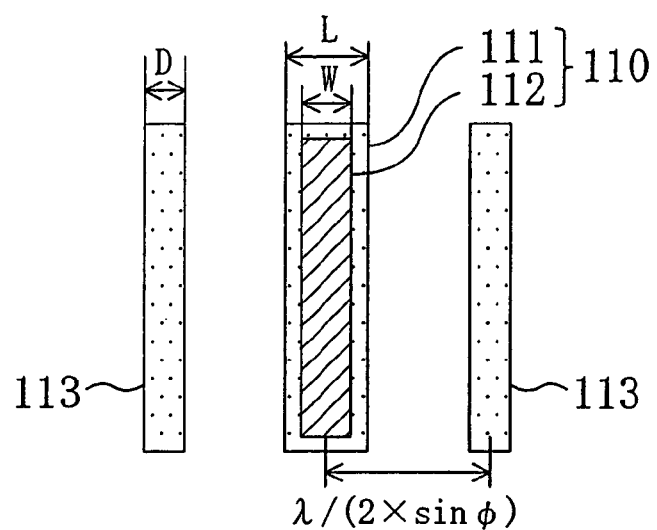
FIGS. 9A, 9B and 9C are plan views of mask patterns according to the invention in each of which diffraction light generation patterns (auxiliary patterns) are disposed for largely improving the DOF characteristic of a main pattern made from a mask enhancer.
Figure 9B:
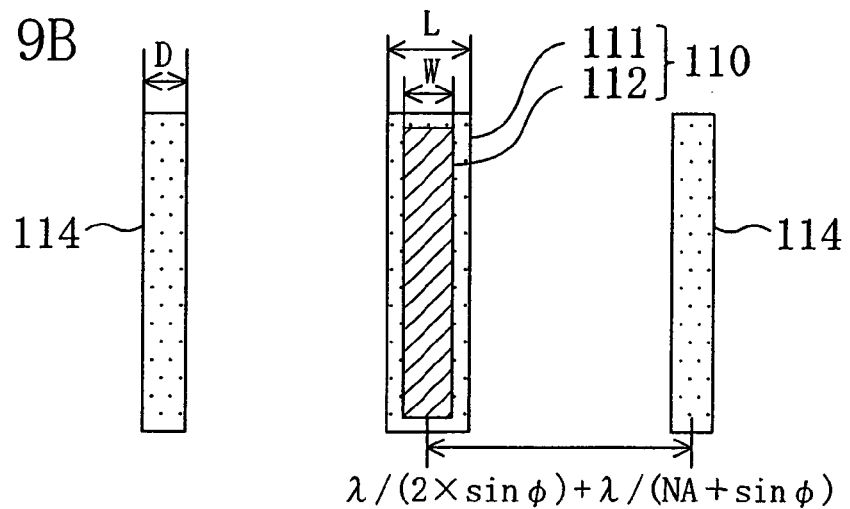
Figure 9C:
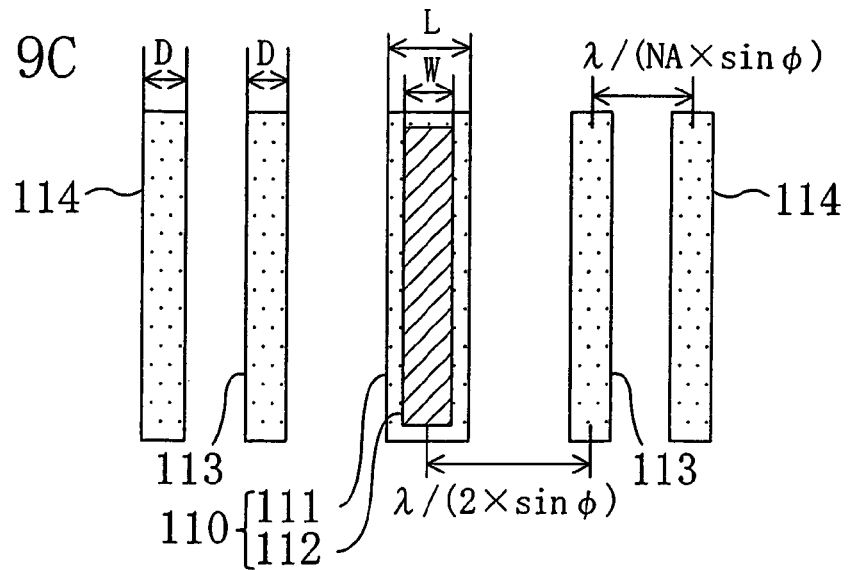

On the basis of the description given so far, the present inventor has found that in the case where a pattern including a phase shifter as the mask enhancer 110 is used as the main pattern 101 of the photomask according to this embodiment shown in FIG. 1A, the DOF characteristic in transferring the main pattern 101 through the exposure can be largely improved by arranging, as the auxiliary patterns 102, patterns that are not transferred through the exposure but generate diffraction lights (namely, diffraction light generation patterns) in predetermined positions. In this case, the predetermined positions are positions away from the center of the phase shifter 101B of the main pattern 101 (namely, the phase shifter 112 of the mask enhancer 110) respectively by a distance $\lambda/(2 \times \sin \phi)$ and a distance $\lambda/(2 \times \sin \phi) + n \times \lambda/(\sin \phi + NA)$ (wherein n is a positive integer). FIGS. 9A through 9C are plan views of mask patterns according to this invention in each of which diffraction light generation patterns (auxiliary patterns) are arranged for largely improving the DOF characteristic of a main pattern made from a mask enhancer.

As shown in FIG. 9A, first-order diffraction light generation patterns (first auxiliary patterns) 113 (with a width D) made from a semi-shielding portion with a dimension not transferred through exposure are disposed in positions away, by a distance of, for example, $\lambda/(2 \times \sin \phi)$, from the center of a phase shifter 112 (with a width W) of a mask enhancer 110 (with a width L) composed of the phase shifter 112 provided within a semi-shielding portion 111. Thus, the DOF characteristic of the mask enhancer 110 can be improved.

Also, as shown in FIG. 9B, second-order diffraction light generation patterns (second auxiliary patterns) 114 (with a width D) made from a semi-shielding portion with a dimension not transferred through exposure are disposed in positions away, by a distance of, for example, $\lambda/(2 \times \sin \phi) + \lambda/(\sin \phi + NA)$, from the center of a phase shifter 112 of a mask enhancer 110 composed of the phase shifter 112 provided within a semi-shielding portion 111. Thus, the DOF characteristic of the mask enhancer 110 can be improved.

Furthermore, since the effect to improve the DOF is derived from diffraction light, the present inventor has found that the DOF characteristic of the mask enhancer 110 can be largely improved by synthesizing the auxiliary patterns of FIG. 9A and the auxiliary patterns of FIG. 9B as shown in FIG. 9C. Specifically, the effect to improve the DOF characteristic can be increased when the first-order diffraction light generation patterns 113 are disposed in the positions away from the center of the phase shifter 112 of the mask enhancer 110 by the distance $\lambda/(2 \times \sin \phi)$ and the second-order diffraction light generation patterns 114 are disposed in the positions away from the center of the phase shifter 112 by the distance $\lambda/(2 \times \sin \phi) + \lambda/(\sin \phi + NA)$.

In other words, as compared with periodic arrangement where a distance X from the main pattern to the first auxiliary pattern and a distance Y from the first auxiliary pattern to the second auxiliary pattern are equal, the DOF characteristic can be more largely improved in the above-described aperiodic arrangement where the distance X from the main pattern to the first auxiliary pattern is larger than the distance Y from the first auxiliary pattern to the second auxiliary pattern. In this case, the optimum ratio X/Y between the distances X and Y is represented as $(\sin \phi + NA)/(2 \times \sin \phi)$. When this expression is expressed by using the oblique incident position S that satisfies $\sin \phi = NA \times S$ wherein $\phi$ is the oblique incident angle, $X/Y = (\sin \phi + NA)/(2 \times \sin \phi) = (1+S)/(2 \times S)$. Thus, the ratio can be obtained as a value not depending upon the NA.

Although not shown in the drawings, a third-order diffraction light generation pattern (third auxiliary pattern) made from a semi-shielding portion with a dimension not transferred through exposure is preferably disposed in a position away from the center of the second auxiliary pattern 114 (along a direction away from the mask enhancer 110) by a distance $\lambda/(\sin \phi + NA)$. Similarly, fourth, fifth, sixth and higher order diffraction light generation patterns made from semi-shielding portions each with a dimension not transferred through exposure are preferably disposed, as the auxiliary patterns, in positions away from the center of the third auxiliary pattern respectively by distances corresponding to multiples of $\lambda/(\sin \phi + NA)$.

Now, the effect attained by disposing the diffraction light generation patterns in the above-described positions will be confirmed through simulation.

Figure 10A:
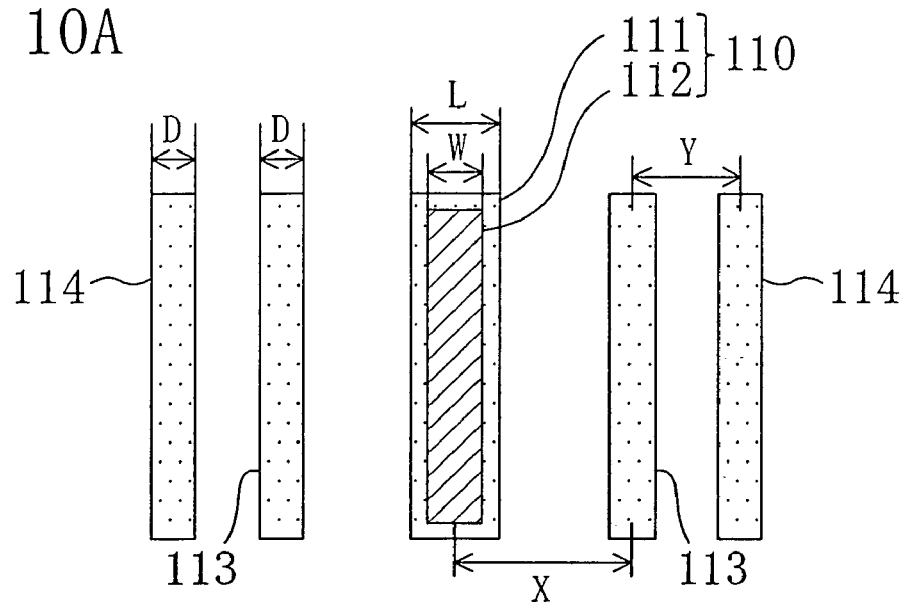
FIG. 10A is a diagram of a pattern (mask pattern) used in simulation performed for proving that a good DOF characteristic can be obtained by disposing the diffraction light generation patterns in positions shown in FIGS. 9A through 9C and FIG. 10B is a diagram for showing the result of the simulation.
Figure 10B:
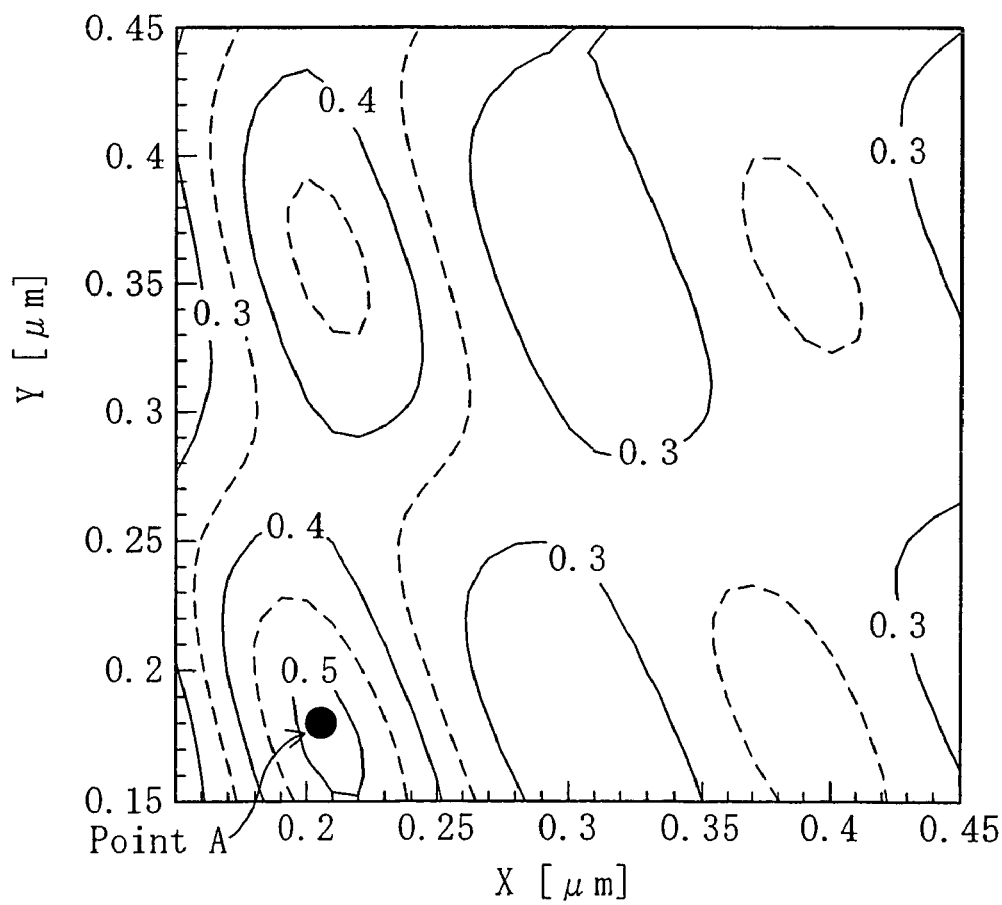

First, the result of simulation performed by the present inventor for proving that a good DOF characteristic of a main pattern made from a mask enhancer can be obtained by disposing diffraction light generation patterns in positions shown in each of FIG. 9A through 9C will be explained. FIG. 10A is a diagram of a pattern (mask pattern) used in the simulation. Specifically, as shown in FIG. 10A, first-order diffraction light generation patterns (first auxiliary patterns) 113 made from a semi-shielding portion with a dimension not transferred through exposure are disposed in positions away, by a distance X, from the center of a phase shifter 112 of a mask enhancer 110 composed of the phase shifter 112 provided within a semi-shielding portion 111. Also, second-order diffraction light generation patterns (second auxiliary patterns) 114 made from a semi-shielding portion with a dimension not transferred through exposure are disposed in positions away, by a distance Y, from the centers of the first-order diffraction light generation patterns 113 (along directions away from the mask enhancer 113). In this case, the mask enhancer 110 has a width L, the phase shifter 112 has a width W and each of the first-order diffraction light generation patterns 113 and the second-order diffraction light generation patterns 114 has a width D. FIG. 10B is a diagram for showing the result of the simulation for the DOF characteristic obtained by using the pattern of FIG. 10A. Specifically, FIG. 10B is a diagram obtained as follows: The pattern of FIG. 10A is subjected to the exposure with the distances X and Y variously changed, so as to obtain, through the simulation, the values of the DOF of patterns formed correspondingly to the mask enhancer 110, and the values of the DOF are mapped with respect to the distances X and Y. The simulation is performed under the following conditions: L=100 nm; W=60 nm; D=70 nm; the wavelength $\lambda$ of the light source (ArF light source)=193 nm; the lens numerical aperture NA=0.6; and $\sin \phi$ (wherein $\phi$ is an oblique incident angle)=0.8×NA. Also, the semi-shielding portion used for forming the first-order diffraction light generation patterns 113 and the second-order diffraction light generation patterns 114 has transmittance of 6%, and a dimension (width) of a pattern to be formed correspondingly to the mask enhancer 110 is 100 nm. Furthermore, in FIG. 10B, a contour line indicates a DOF, and a point A corresponds to a point where the distance $X=\lambda/(2 \times \sin \phi)$ (which is approximately 0.20 μm) and the distance $Y=\lambda/(\sin \phi + NA)$ (which is approximately 0.18 μm). As shown in FIG. 10B, a substantially maximum value of the DOF can be obtained at the point A. Specifically, it has been proved that a good DOF characteristic can be obtained by using the photomask according to this modification shown in FIG. 4.

Furthermore, the result of simulation performed by the present inventor by using the pattern of FIG. 10A under various optical conditions for proving that a DOF can be maximized by disposing the diffraction light generation patterns in the positions shown in FIG. 4 under arbitrary optical conditions will be explained.

Figure 11A:
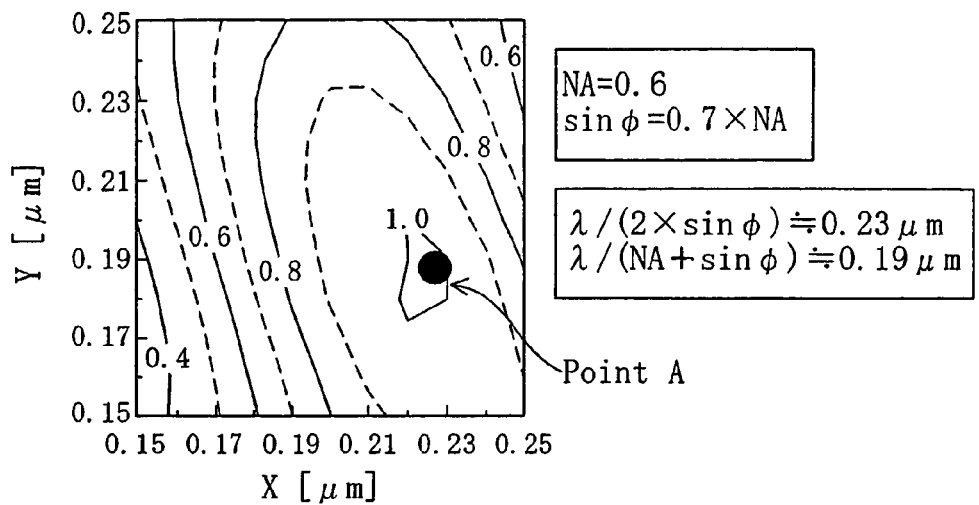
FIG. 11A is a diagram for showing the result of simulation performed under optical conditions of lens numerical aperture NA of 0.6 and sin $\phi$ of 0.7×NA for proving that a good DOF characteristic can be obtained by disposing the diffraction light generation patterns in the positions shown in FIGS. 9A through 9C.

FIG. 11A is a diagram for showing the result of simulation for the DOF characteristic performed under optical conditions that the lens numerical aperture NA=0.6 and $\sin \phi = 0.7 \times$ NA (with the other conditions the same as those employed in FIG. 10B). In FIG. 11A, a point A corresponds to a point where the distance $X=\lambda/(2 \times \sin \phi)$ (which is approximately 0.23 μm) and the distance $Y=\lambda/(\sin \phi + NA)$ (which is approximately 0.19 μm). As shown in FIG. 11A, a substantially maximum value of the DOF can be obtained at the point A.

Figure 11B:
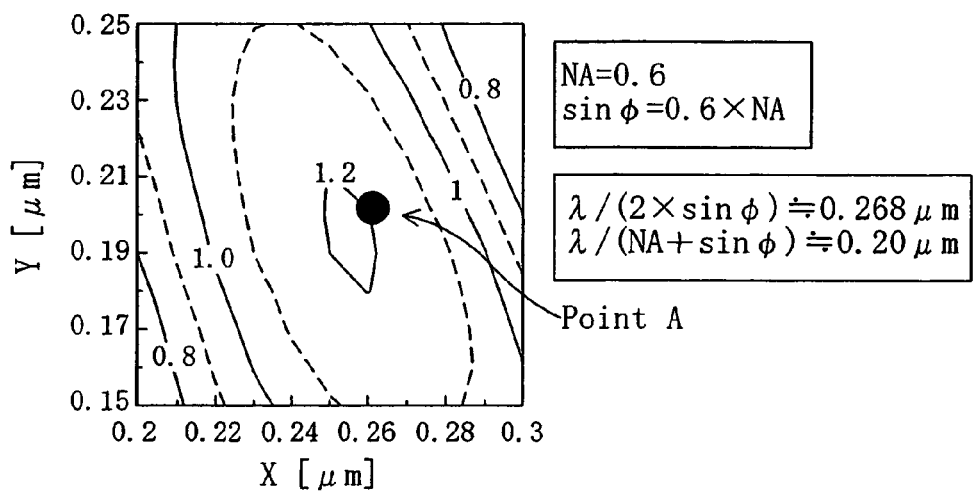
FIG. 11B is a diagram for showing the result of the simulation performed under optical conditions of the lens numerical aperture NA of 0.6 and sin $\phi$ of 0.6×NA

FIG. 11B is a diagram for showing the result of simulation for the DOF characteristic performed under optical conditions that the lens numerical aperture NA=0.6 and $\sin \phi = 0.6 \times$ NA (with the other conditions the same as those employed in FIG. 10B). In FIG. 11B, a point A corresponds to a point where the distance $X=\lambda/(2 \times \sin \phi)$ (which is approximately 0.268 μm) and the distance $Y=\lambda/(\sin \phi + NA)$ (which is approximately 0.20 μm). As shown in FIG. 11B, a substantially maximum value of the DOF can be obtained at the point A.

Figure 11C:
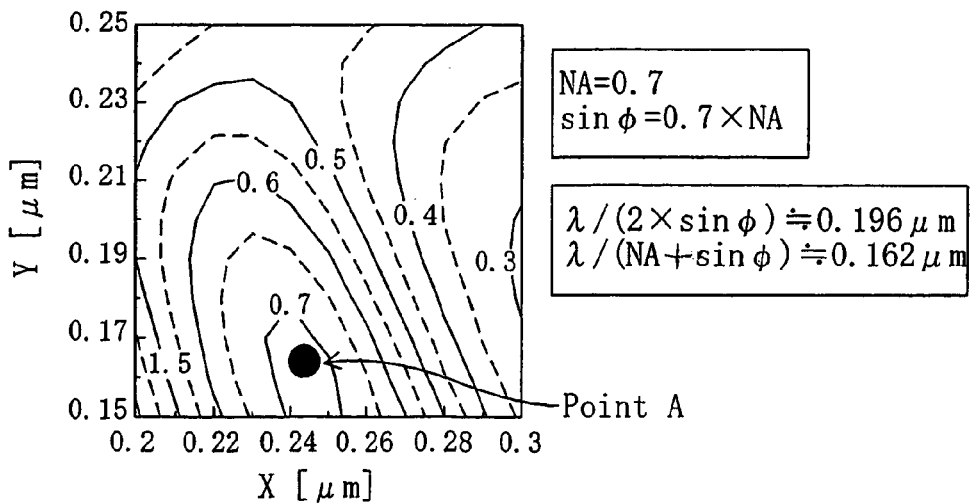
FIG. 11C is a diagram for showing the result of the simulation performed under optical conditions of the lens numerical aperture NA of 0.7 and sin $\phi$ of 0.7×NA.

FIG. 11C is a diagram for showing the result of simulation for the DOF characteristic performed under optical conditions that the lens numerical aperture NA=0.7 and $\sin \phi = 0.7 \times$ NA (with the other conditions the same as those employed in FIG. 10B). In FIG. 11C, a point A corresponds to a point where the distance $X=\lambda/(2 \times \sin \phi)$ (which is approximately 0.196 μm) and the distance $Y=\lambda/(\sin \phi + NA)$ (which is approximately 0.162 μm). As shown in FIG. 11C, a substantially maximum value of the DOF can be obtained at the point A.

Figure 12A:
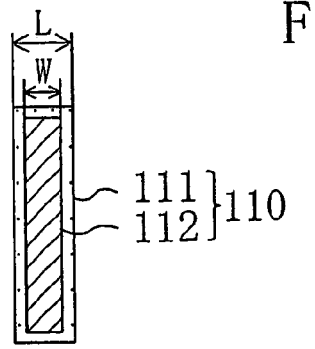
FIGS. 12A, 12B and 12C are diagrams of patterns (mask patterns) used in simulation performed for evaluating an effect to improve a DOF characteristic derived from diffraction light generation patterns of this invention obtained with a light source having an area used.

In the above explanation, the point light sources are used as a premise. Now, the result of simulation performed, by using a light source with an area, for evaluating the effect of the diffraction light generation patterns to improve the DOF characteristic will be explained. FIGS. 12A through 12C are diagrams of patterns (mask patterns) used in the simulation.

Specifically, the mask pattern of FIG. 12A consists of a mask enhancer 110 with a width L alone. The mask enhancer 110 is composed of a semi-shielding portion 111 in the shape corresponding to the outline of the mask enhancer and a phase shifter 112 (with a width W) provided at the center of the mask enhancer 110 and surrounded by the semi-shielding portion 111. The mask pattern of FIG. 12B is obtained by adding, to the mask enhancer 110 of FIG. 12A, first diffraction light generation patterns 113 for generating diffraction light that diffracts at an angle $\theta$ satisfying $\sin \theta = 2 \times \sin \phi$ (wherein $\phi$ is an oblique incident angle). In this case, the first-order diffraction light generation patterns 113 are semi-shielding patterns and have a width D. The mask pattern of FIG. 12C is obtained by adding, to the mask enhancer 110 and the first-order diffraction light generation patterns 113 of FIG. 12B, second-order diffraction light generation patterns 114 for generating diffraction light that diffracts at an angle $\eta$ satisfying $\sin \eta = 2 \times (NA + \sin \phi)$ (wherein $\phi$ is an oblique incident angle and NA is lens numerical aperture). In this case, the second-order diffraction light generation patterns 114 are semi-shielding patterns and have a width D.

Figure 12D:
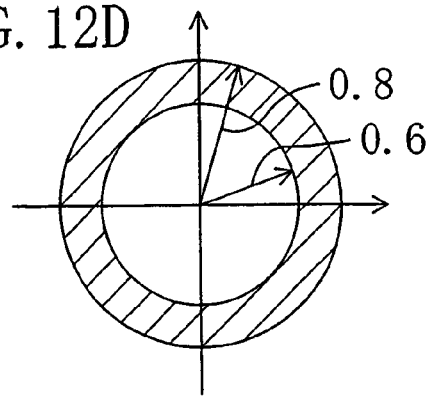
FIG. 12D is a diagram of the light source used in the simulation.
Figure 12B:
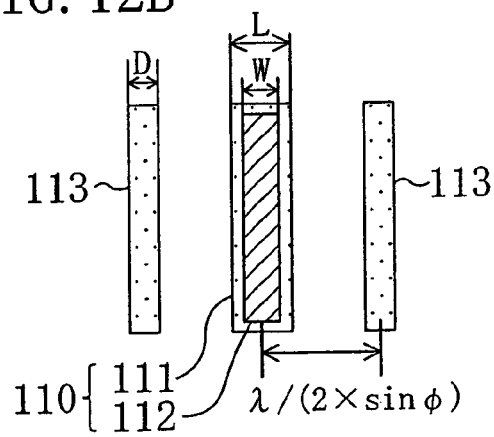

FIG. 12D is a diagram of a light source, specifically, an annular light source used in the simulation. As shown in FIG. 12D, the annular light source has outer and inner diameters of 0.8 and 0.6, respectively (standardized by the lens numerical aperture NA). In this case, when the oblique incident angle is $\phi$, oblique incident light satisfying $0.6 \times NA < \sin \phi < 0.8 \times NA$ is present. In this case, it seems that the optimum positions of the first-order diffraction light generation patterns 113 and the second-order diffraction light generation patterns 114 can be determined depending upon the oblique incident angle corresponding to a principal component of the light source. Specifically, in using the above-described light source, an average value of the oblique incident angle $\phi$ can be regarded as the principal component of the light source, and hence, the oblique incident angle $\phi$ corresponding to the principal component is represented as $\sin \phi = NA \times (0.6+0.8)/2 = 0.7 \times NA$. This and the result confirmed through the simulation will be continuously explained.

Figure 12E:
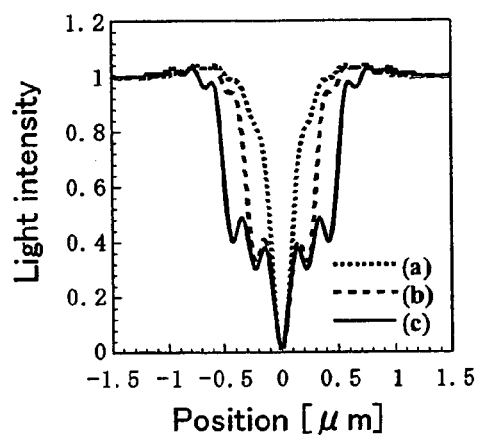
FIG. 12E is a graph for showing the result of the simulation for a light intensity distribution caused in correspondence to a mask enhancer through exposure performed on each of the mask patterns of FIGS. 12A through 12C under predetermined conditions.
Figure 12C:
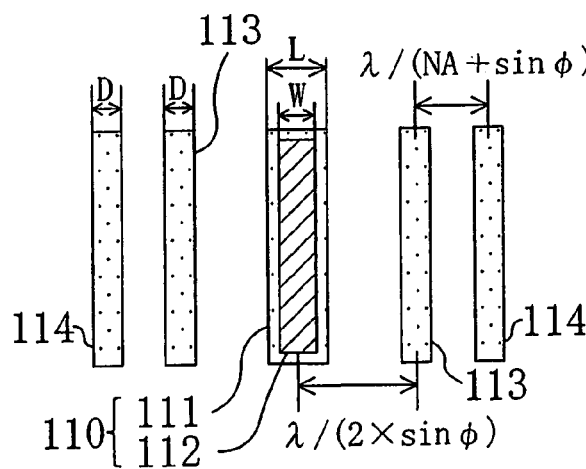
Figure 12F:
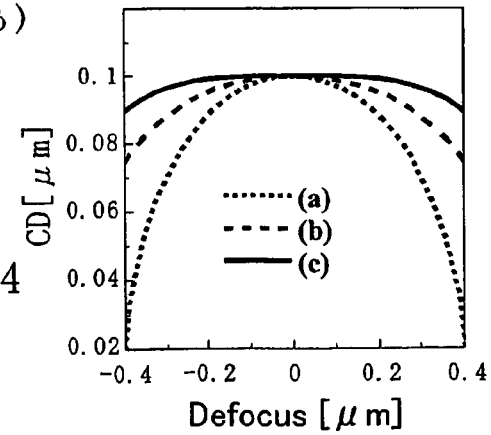
FIG. 12F is a graph for showing the result of simulation for a defocus characteristic of a CD of a pattern with a width of 0.1 μm formed correspondingly to a mask enhancer through the exposure performed on each of the mask patterns of FIGS. 12A through 12C under predetermined conditions.

FIG. 12E is a graph for showing the result of simulation for a light intensity distribution caused correspondingly to each mask enhancer obtained by subjecting each of the mask patterns of FIGS. 12A through 12C to the exposure under predetermined conditions. FIG. 12F is a diagram for showing the result of simulation for a defocus characteristic of a CD of a pattern with a width of 0.1 μm formed correspondingly to each mask enhancer 110 by subjecting each of the mask patterns of FIGS. 12A through 12C to the exposure under the predetermined conditions. Herein, a "CD" means a critical dimension, which corresponds to the ultimate dimension of the pattern to be formed. In the simulation, L=180 nm, W=60 nm and D=90 nm, and the positions of the diffraction light generation patterns are determined on the basis of the oblique incident angle $\phi$ that satisfies $\sin \phi = 0.7 \times NA = 0.42$. Also, the wavelength $\lambda$ of the light source (ArF light source) is 193 nm, and the lens numerical aperture NA is 0.6. Furthermore, the semi-shielding portion used for forming the first-order diffraction light generation patterns 113 and the second-order diffraction light generation patterns 114 has transmittance of 6%. In FIGS. 12E and 12F, lines (a), (b) and (c) respectively correspond to the mask patterns shown in FIGS. 12A, 12B and 12C.

As shown in FIG. 12E, images (light intensity distributions) with very high contrast can be formed by all the mask patterns shown in FIGS. 12A through 12C, namely, the mask patterns each including the mask enhancer 110. Also, a portion in each light intensity distribution related to formation of a pattern of 0.1 μm is minimally affected by the first-order diffraction light generation patterns 113 and the second-order diffraction light generation patterns 114. In this case, since the critical light intensity in the formation of a pattern of 0.1 μm (100 nm) is approximately 0.2, it is understood that the first-order diffraction light generation patterns 113 and the second-order diffraction light generation patterns 114 are not resolved to be transferred onto a resist.

Also, as shown in FIG. 12F, when the first-order diffraction light generation patterns 113 and the second-order diffraction light generation patterns 114 are added to the mask pattern, the defocus characteristic of the mask enhancer 110 can be remarkably improved. In other words, when the mask enhancer 110 including the phase shifter 112 is used together with the first-order diffraction light generation patterns 113 and the second-order diffraction light generation patterns 114, pattern formation with a good defocus characteristic can be realized.

Next, the result of simulation performed by the present inventor for proving that the method for calculating the positions for disposing the diffraction light generation patterns for optimizing the defocus characteristic introduced theoretically as described above is correct will be explained. Specifically, the positions of the diffraction light generation patterns 113 or 114 are changed in the mask pattern of FIG. 12B or 12C, so that values of the DOF of a line pattern with a width of 0.1 μm formed correspondingly to the mask enhancer 110 can be obtained through the simulation. In this case, the DOF is a defocus range where the width of the line pattern is changed from 0.1 μm to 0.09 μm. Also, the simulation conditions are the same as those employed in FIGS. 12E and 12F.

Figure 13A:
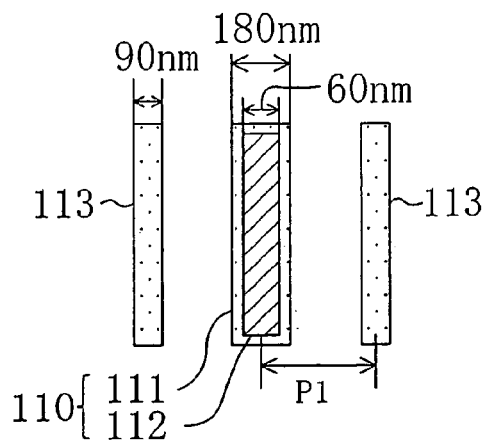
FIG. 13A is a diagram of a first-order diffraction light generation pattern disposed away from the center of a phase shifter by a distance P1 in the mask pattern of FIG. 12B.
Figure 13B:
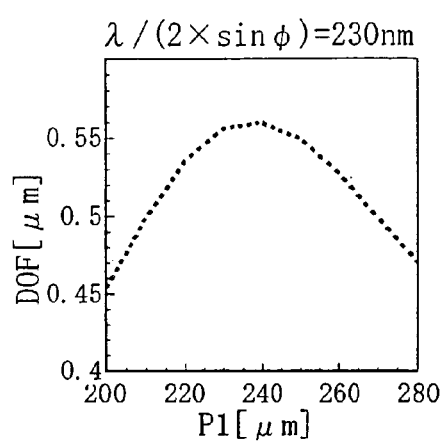
FIG. 13B is a diagram for showing change of the DOF obtained through exposure performed while changing the distance P1 in the mask pattern of FIG. 13A.

FIG. 13A is a diagram of the first-order diffraction light generation patterns 113 disposed in positions away from the center of the phase shifter 112 by a distance P1 in the mask pattern of FIG. 12B. Also, FIG. 13B is a graph for showing the change of the DOF obtained through exposure performed with the distance P1 changed in the mask pattern of FIG. 13A. As shown in FIG. 13B, when the distance P1 is approximately 230 nm, which is obtained by the theoretical expression $\lambda/(2 \times \sin \phi)$, the DOF has a substantially peak value.

Figure 13C:
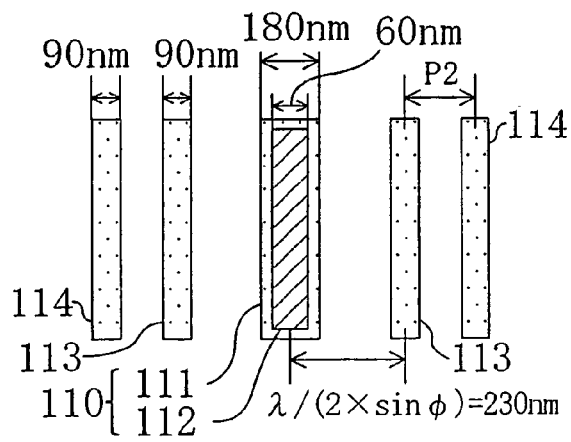
FIG. 13C is a diagram of a second-order diffraction light generation pattern disposed away from the center of the first-order diffraction light generation pattern by a distance P2 in the mask pattern of FIG. 12C
Figure 13D:
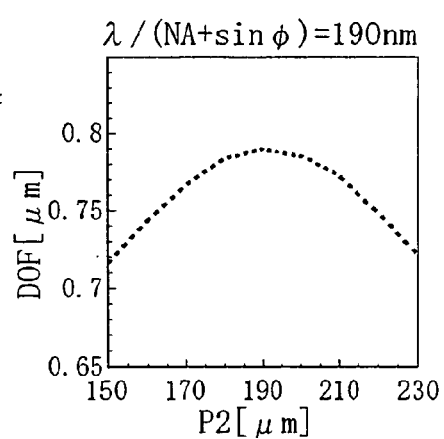
FIG. 13D is a diagram for showing change of the DOF obtained through exposure performed while changing the distance P2 in the mask pattern of FIG. 13C.

FIG. 13C is a diagram of the second-order diffraction light generation patterns 114 disposed in positions away from the centers of the first-order diffraction light generation patterns 113 by a distance P2 in the mask pattern of FIG. 12C. In this case, the distance between the phase shifter 112 and the first-order diffraction light generation pattern 113 is $\lambda/(2 \times \sin \phi)$ (which is approximately 230 nm). Also, FIG. 13D is a diagram for showing the change of the DOF obtained through the exposure performed with the distance P2 changed in the mask pattern of FIG. 13C. As shown in FIG. 13D, when the distance P2 is approximately 190 nm, which is obtained by the theoretical expression $\lambda/(\sin \phi + NA)$, the DOF has a substantially peak value.

As described so far, in the oblique incident exposure performed on a phase shifter or a mask enhancer by using an aligner having a wavelength $\lambda$ of a light source (disposed away from the normal line extending through the center of the lens by a distance S) and lens numerical aperture NA, the DOF characteristic of a pattern to be formed correspondingly to the phase shifter or the mask enhancer can be optimized by disposing diffraction light generation patterns as follows: First-order diffraction light generation patterns are disposed in positions away from the center of the phase shifter or the mask enhancer (namely, the center of the phase shifter in either case) by a distance $\lambda/(2 \times \sin \phi)$ and second-order diffraction light generation patterns are disposed in positions away from the centers of the first-order diffraction light generation patterns by a distance $\lambda/(\sin \phi + NA)$, namely, away from the center of the phase shifter by a distance $\lambda/(2 \times \sin \phi) + \lambda/(\sin \phi + NA)$.

In the above description, the optimum positions for disposing diffraction light generation patterns with respect to a principal component of the oblique incident angle $\phi$ determined depending upon the shape of a light source are described. Subsequently, allowable ranges of the positions for disposing the diffraction light generation patterns will be described. As shown in FIG. 8B, there is a position where the DOF is the minimum (hereinafter referred to as the worst position) between the optimum positions of a diffraction light generation patterns. When it is assumed that an intermediate position between the optimum position and the worst position is defined as a position where an average DOF improving effect can be obtained (hereinafter referred to as the average position), the diffraction light generation pattern is preferably disposed between a pair of average positions sandwiching the optimum position. Alternatively, the center of the diffraction light generation pattern is more preferably disposed between intermediate positions between the optimum position and a pair of average positions sandwiching the optimum position.

Specifically, the optimum position of a second-order diffraction light generation pattern is a position away from the center of the phase shifter by a distance $\lambda/(2\times\sin\phi)+\lambda/(\sin\phi+NA)$. When this position is designated as a point OP, worst positions on both sides of the point OP are positions away from and on the both sides of the point OP by a distance $(\lambda/(\sin\phi+NA))/2$. Also, average positions on the both sides of the point OP are positions away from and on the both sides of the point OP by a distance $(\lambda/(\sin\phi+NA))/4$. When the second-order diffraction light generation pattern is preferably disposed in a region sandwiched between this pair of average positions, the second-order diffraction light generation pattern is preferably disposed in a region away from the center of the phase shifter by a distance ranging from $\lambda/(2\times\sin\phi)+(\lambda/(\sin\phi+NA))\times(3/4)$ to $\lambda/(2\times\sin\phi)+(\lambda/(\sin\phi+NA))\times(5/4)$. In the case where these expressions are converted into numerical values under the same conditions as those employed in FIG. 13C, the second-order diffraction light generation pattern is preferably disposed in a region away from the center of the first-order diffraction light generation pattern by a distance ranging from 143 nm to 238 nm.

Also, intermediate positions between the optimum position of the second-order diffraction light generation pattern and a pair of average positions sandwiching the optimum position are away from and on the both sides of the point OP by a distance $(\lambda/(\sin\phi+NA))/8$. In this case, it is most preferred that the second-order diffraction light generation pattern is an auxiliary pattern not for use for forming a resist pattern and that the center of the second-order diffraction light generation pattern is disposed between the pair of intermediate positions sandwiching the optimum position. Specifically, the center of the second-order diffraction light generation pattern is preferably disposed in a region away from the center of the phase shifter by a distance ranging from $\lambda/(2\times\sin\phi)+(\lambda/(\sin\phi+NA))\times(7/8)$ to $\lambda/(2\times\sin\phi)+(\lambda/(\sin\phi+NA))\times(9/8)$. When these expressions are converted into numerical values under the same conditions as those employed in FIG. 13C, the center of the second-order diffraction light generation pattern is preferably disposed in a region away from the center of the first-order diffraction light generation pattern by a distance ranging from 166 nm to 214 nm.

Similarly to the second-order diffraction light generation pattern, a first-order diffraction light generation pattern is also preferably disposed in a region sandwiched between a pair of average positions away from and on both sides of the optimum position of the first-order diffraction generation pattern by a distance $(\lambda/(\sin\phi+NA))/4$. Alternatively, the center of the first-order diffraction light generation pattern is preferably disposed in a region sandwiched between a pair of intermediate positions between the optimum position of the first-order diffraction light generation pattern and a pair of average positions sandwiching the optimum position, namely, in a region sandwiched between a pair of intermediate positions away from and on the both sides of the optimum position of the first-order diffraction light generation pattern by a distance $(\lambda/(\sin\phi+NA))/8$.

Specifically, the first-order diffraction light generation pattern is preferably disposed in a region away from the center of the phase shifter by a distance ranging from $\lambda/(2\times\sin\phi)-(\lambda/(\sin\phi+NA))/4$ to $\lambda/(2\times\sin\phi)+(\lambda/(\sin\phi+NA))/4$. When these expressions are converted into numerical values under the same conditions as those employed in FIG. 13A, the first-order diffraction light generation pattern is preferably disposed in a region away from the center of the phase shifter by a distance ranging from 183 nm to 278 nm. Alternatively, the center of the first-order diffraction light generation pattern is preferably disposed in a region away from the center of the phase shifter by a distance ranging from $\lambda/(2\times\sin\phi)-(\lambda/(\sin\phi+NA))/8$ to $\lambda/(2\times\sin\phi)+(\lambda/(\sin\phi+NA))/8$. When these expressions are converted into numerical values under the same conditions as those employed in FIG. 13A, the center of the first-order diffraction light generation pattern is preferably disposed in a region away from the center of the phase shifter by a distance ranging from 206 nm to 254 nm.

The aforementioned allowable range of the position of the second-order diffraction light generation pattern is not applied merely when the auxiliary patterns up to the second-order diffraction light generation patterns are provided as shown in, for example, FIG. 4. Specifically, in the case where third-order diffraction light generation patterns, fourth-order diffraction light generation patterns and the like are provided, the third-order diffraction light generation patterns, the fourth-order diffraction light generation patterns and the like are preferably disposed in allowable ranges of their positions defined in the same manner as the second-order diffraction light generation patterns.

Modification 2 of Embodiment 1

As Modification 2 of Embodiment 1, a preferable range of the oblique incident angle for the photomask according to Embodiment 1 (or Modification 1 of Embodiment 1) will be described. Although the preferable positions of the auxiliary patterns with respect to an oblique incident angle employed in exposure have been described so far, this modification describes that there actually presents a preferable oblique incident angle. Specifically, a photomask in which auxiliary patterns are disposed in optimum positions with respect to the preferable oblique incident angle can exhibit the best pattern formation characteristics.

Illumination used in actual exposure is not a point light source but a light source with a given area. Therefore, there are a plurality of oblique incident angles $\phi$ in the exposure. Therefore, in order to consider a preferable oblique incident angle, light sources used in the oblique incident illumination (off-axis illumination) are classified into a group of annular illumination, a group of dipole illumination and a group of quadrupole illumination for the following reason: In, for example, the annular illumination, all light components are oblique incident components for a mask surface but some light components are not substantially oblique incident components for each line pattern on the mask. In contrast, in the dipole illumination and the quadrupole illumination, there is no light component other than oblique incident components.

Specifically, in the annular illumination, light entering from a direction perpendicular to a direction along which a line pattern extends (hereinafter referred to as the line direction) is oblique incident light for the line pattern but light entering from a direction parallel to the line direction is substantially vertical incident light for the line pattern. Accordingly, illumination having such a vertical incident component can be classified as the group of the annular illumination regardless of the shape thereof.

On the other hand, in the dipole illumination that is polarized along a direction perpendicular to the line direction, there is substantially no vertical incident light component for the line pattern. Therefore, illumination having such oblique incident light components alone can be classified as the group of the dipole illumination regardless of the shape thereof.

Alternatively, in the quadrupole illumination, there is no light component entering in a direction parallel to the line direction (namely, substantially vertical incident light component) similarly to the dipole illumination. Furthermore, the quadrupole illumination has merely oblique incident light entering in a diagonal direction to the line direction (namely, a direction at an angle of 45 degrees against the line direction). For example, in the case where light with the maximum oblique incident angle $\phi_{MAX}$, which is defined as sin $\phi_{MAX}$=NA with respect to the numerical aperture NA, enters from a diagonal direction at 45 degrees against the line direction, if this light is projected in a direction perpendicular to the line direction, this light is substantially equivalent to an oblique incident component satisfying sin $\phi$=NA×$0.5^{0.5}$. Because of such specificity, the quadrupole illumination has a different property from the dipole illumination.

Now, the dependency of the DOF on the oblique incident angle obtained when diffraction light generation patterns are disposed as auxiliary patterns with respect to a main pattern will be described by using the result of simulation. In this case, the mask patterns of FIGS. 9A through 9C are used in the simulation. In the mask pattern of FIG. 9A, the first auxiliary patterns 113 alone are disposed. These first auxiliary patterns 113 are made from a semi-shielding portion and have a width D. In the mask pattern of FIG. 9B, the second auxiliary patterns 114 alone are disposed. These second auxiliary patterns 114 are also made from a semi-shielding portion and have a width D. In the mask pattern of FIG. 9C, both the first auxiliary patterns 113 and the second auxiliary patterns 114 are disposed. Also, each mask enhancer 110 of FIGS. 9A through 9C is composed of a semi-shielding portion 111 and a phase shifter 112 and has a mask width L and the phase shifter has a width W.

Figure 14A:
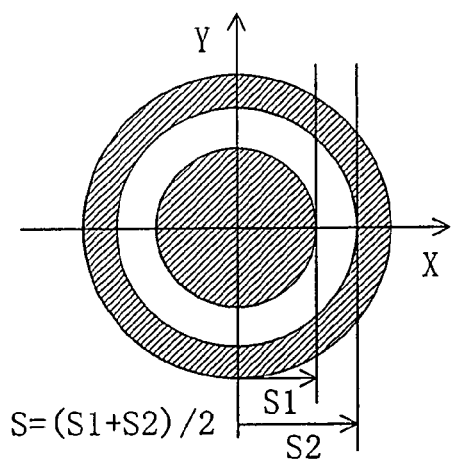
FIGS. 14A, 14B, 14C and 14D are diagrams for explaining the result of simulation in which oblique incident exposure is performed on the mask patterns of FIGS. 9A through 9C by using annular illumination.
Figure 14B:
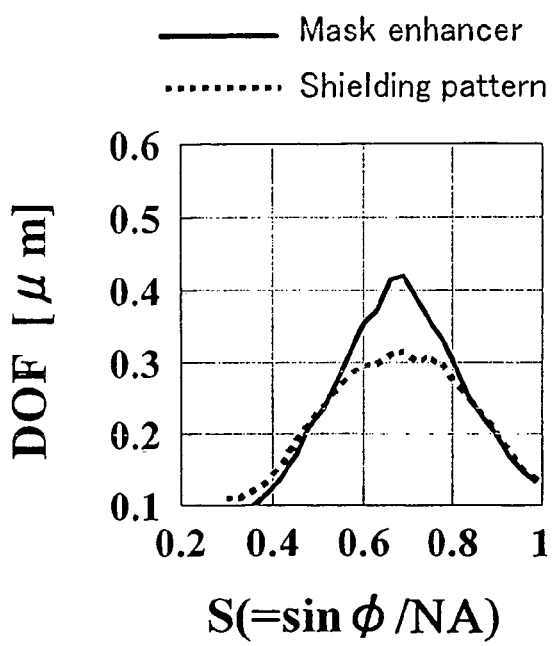
Figure 14C:
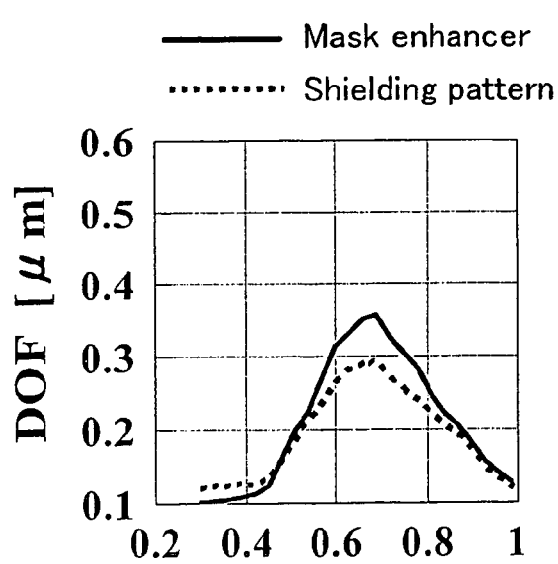
Figure 14D:
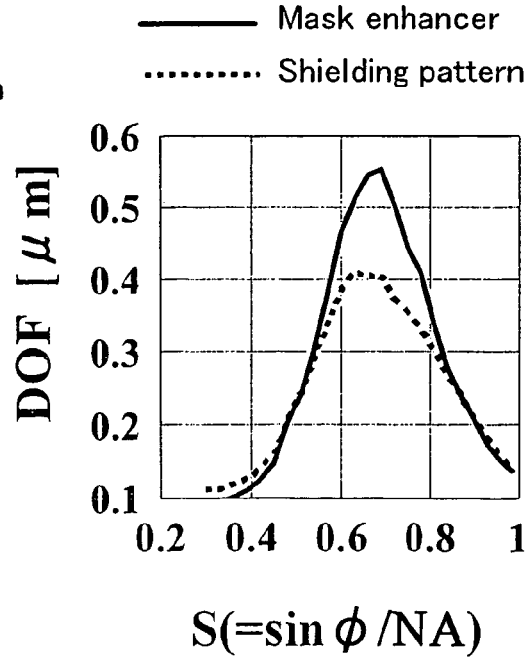

FIGS. 14A through 14D show the result of simulation performed through the oblique incident exposure carried out on the mask patterns of FIG. 9A through 9C by using the annular illumination. FIG. 14A is a diagram of the annular illumination used in the simulation. In FIG. 14A, the lighting shape has an inner diameter S1 and an outer diameter S2. FIG. 14A also shows a XY coordinate system. It is herein assumed that each line pattern of FIGS. 9A through 9C (the mask enhancer 110 and the first and second auxiliary patterns 113 and 114) is disposed in parallel to the Y axis of the XY coordinate system. Also, in simulating the dependency of the DOF on the oblique incident angle, in the case where the illumination of FIG. 14A is used for the exposure, the oblique incident position S is defined as (S1+S2)/2, and each of the auxiliary patterns 113 and 114 of FIGS. 9A through 9C is arranged on the basis of sin $\phi$=S×NA, so as to simulate the pattern formation characteristics. In the simulation, L=100 nm, W=60 nm, D=60 nm, $\lambda$=193 nm and NA=0.7. Also, the shape of the annular illumination is determined so that S2−S1=0.02. FIGS. 14B through 14D show the result of the simulation for the dependency of the DOF on the oblique incident angle $\phi$ (more precisely, on the oblique incident position S=sin $\phi$/NA) performed under these conditions for forming a pattern with a width of 80 nm by using each of the mask patterns of FIGS. 9A through 9C. In FIGS. 14B through 14D, the result obtained by using a shielding pattern with a width of 100 nm as a main pattern is also shown for comparison. Specifically, in FIGS. 14B through 14D, the result obtained when the main pattern has the mask enhancer structure is shown with a solid line and the result obtained when the main pattern is a shielding pattern is shown with a broken line.

In all the results shown in FIGS. 14B through 14D, the DOF obtained under an illumination condition that S is approximate to 0.7 is the maximum. Also, under a condition that S is not less than 0.58 and not more than 0.8, the DOF can be improved by using the mask enhancer structure as the main pattern as compared with the case where the shielding pattern is used as the main pattern. Specifically, under an exposure condition that the oblique incident angle $\phi$ satisfies sin $\phi$=0.7× NA, each of the mask patterns of FIGS. 9A through 9C in which the auxiliary patterns are disposed in the positions defined by using sin $\phi$ and NA against the main pattern made from the mask enhancer can be a mask pattern for realizing the best pattern formation characteristics. Although the optimum illumination condition is defined as described above, when the mask enhancer structure is introduced into a main pattern and illumination condition that sin $\phi$ is not less than 0.6×NA and not more than 0.8×NA is employed, the DOF can be improved as compared with the case where the main pattern is made from a shielding pattern.

More specific explanation will be given by exemplifying the above-described conditions for the simulation. Since the optimum illumination condition is sin $\phi$=0.7×NA and NA=0.7, an optimum photomask can be obtained by disposing the first auxiliary pattern (more accurately, the center thereof) in a position away from the phase shifter included in the main pattern by a distance $\lambda/(2\times\sin \phi)$=0.193/(2×0.7× 0.7)=197 nm. Similarly, an optimum photomask can be obtained by disposing the second auxiliary pattern (more accurately, the center thereof) in a position away from the center of the phase shifter included in the main pattern by a distance $\lambda/(2\times\sin \phi)+\lambda/(NA+\sin \phi)$=0.193/(2×0.7×0.7)+ 0.193/(0.7+0.7×0.7)=359 nm.

Furthermore, the DOF can be improved when the mask enhancer structure is introduced into a main pattern and the first auxiliary pattern (more accurately, the center thereof) is disposed in a position away from the center of the phase shifter of the main pattern by a distance ranging from 0.193/ (2×0.8×0.7)=172 nm to 0.193/(2×0.58×0.7)=238 nm. Similarly, the DOF can be improved when the second auxiliary pattern (more accurately, the center thereof) is disposed in a position away from the center of the phase shifter of the main pattern by a distance ranging from 0.193/(2×0.8×0.7)+0.193/ (0.7+0.8×0.7)=325 nm to 0.193/(2×0.58×0.7)+0.193/(0.7+ 0.58×0.7)=412 nm.

Figure 15A:
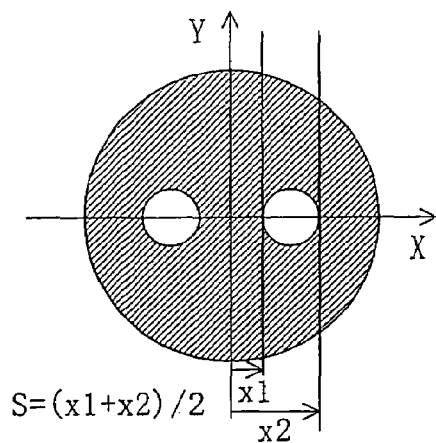
FIGS. 15A, 15B, 15C and 15D are diagrams for explaining the result of simulation in which oblique incident exposure is performed on the mask patterns of FIGS. 9A through 9C by using dipole illumination.
Figure 15B:
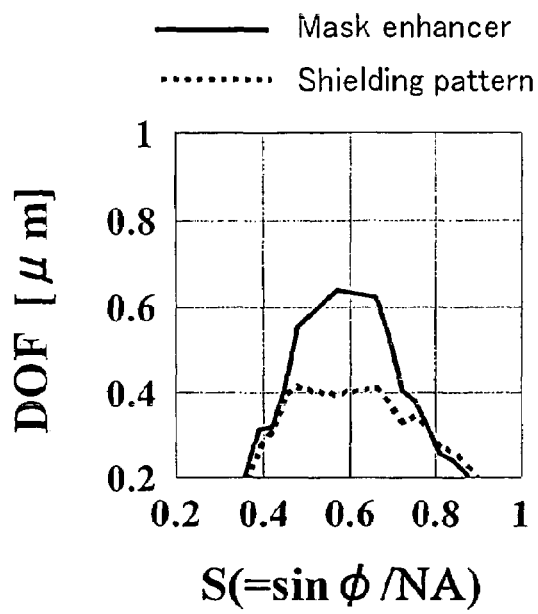
Figure 15C:
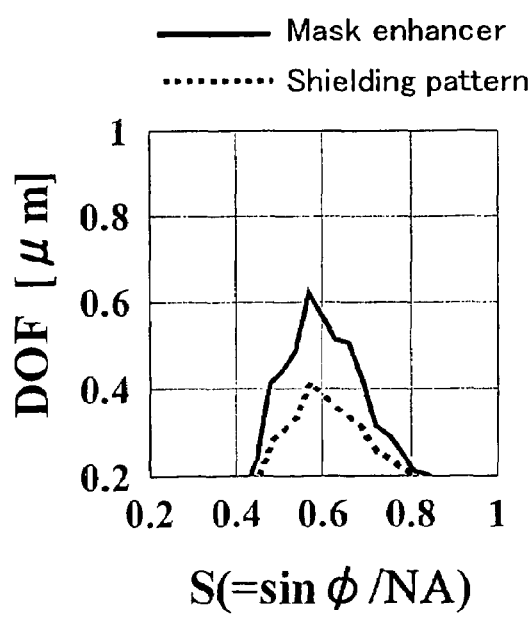
Figure 15D:
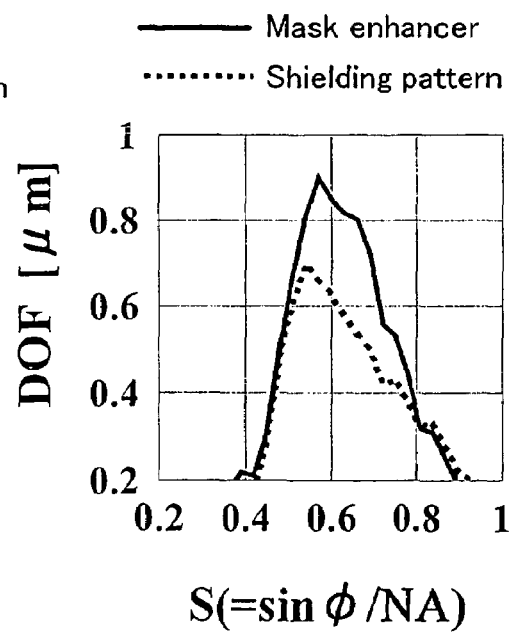

FIGS. 15A through 15D show the result of simulation performed by subjecting the mask patterns of FIGS. 9A through 9C to the oblique incident exposure using the dipole illumination. FIG. 15A is a diagram of the dipole illumination used in the simulation. FIG. 15A also shows the XY coordinate system. In FIG. 15A, the inside coordinate of polarized illumination is indicated by x1 and the outside coordinate is indicated by x2. In this case, it is assumed that the polarization direction of the dipole illumination is perpendicular to the line direction of the mask enhancer 110 and the like. Specifically, the polarization direction of the dipole illumination is parallel to the X axis of the XY coordinate system, and each line pattern of FIGS. 9A through 9C is arranged in parallel to the Y axis of the XY coordinate system. Also, in simulating the dependency of the DOF on the oblique incident angle, in the case where the illumination of FIG. 15A is used for the exposure, the oblique incident position S is defined as (x1+ x2)/2, and each of the auxiliary patterns 113 and 114 of FIGS. 9A through 9C is arranged on the basis of sin $\phi$=S×NA, so as to simulate the pattern formation characteristics. In the simulation, L=100 nm, W=60 nm, D=60 nm, $\lambda$=193 nm and NA=0.7. Also, the shape of the dipole illumination is determined so that x2−x1=0.02. Similarly to FIGS. 14B through 14D where the annular illumination is used, FIGS. 15B through 15D show the result of the simulation for the dependency of the DOF on the oblique incident angle $\phi$ (more precisely, on the oblique incident position S=sin φ/NA) performed under these conditions for forming a pattern with a width of 80 nm by using each of the mask patterns of FIGS. 9A through 9C. In FIGS. 15B through 15D, the result obtained by using a shielding pattern with a width of 100 nm as a main pattern is also shown for comparison. Specifically, in FIGS. 15B through 15D, the result obtained when the main pattern has the mask enhancer structure is shown with a solid line and the result obtained when the main pattern is a shielding pattern is shown with a broken line.

In all the results shown in FIGS. 15B through 15D, the DOF obtained under an illumination condition that S is approximate to 0.58 is the maximum. Also, under an illumination condition that S is not less than 0.5 and not more than 0.7, the DOF can be improved by using the mask enhancer structure as the main pattern as compared with the case where the shielding pattern is used as the main pattern. Specifically, under an exposure condition that the oblique incident angle φ satisfies sin φ=0.58×NA, each of the mask patterns of FIGS. 9A through 9C in which the auxiliary patterns are disposed in the positions defined by using sin φ and NA against the main pattern made from the mask enhancer can be a mask pattern for realizing the best pattern formation characteristics. Although the optimum illumination condition is defined as described above, when the mask enhancer structure is introduced into a main pattern and an illumination condition that sin φ is not less than 0.5×NA and not more than 0.7×NA is employed, the DOF can be improved as compared with the case where the main pattern is made from a shielding pattern.

Figure 16A:
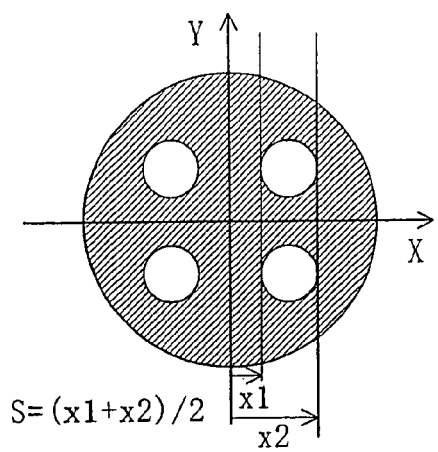
FIGS. 16A, 16B, 16C and 16D are diagrams for explaining the result of simulation in which oblique incident exposure is performed on the mask patterns of FIGS. 9A through 9C by using quadrupole illumination.
Figure 16B:
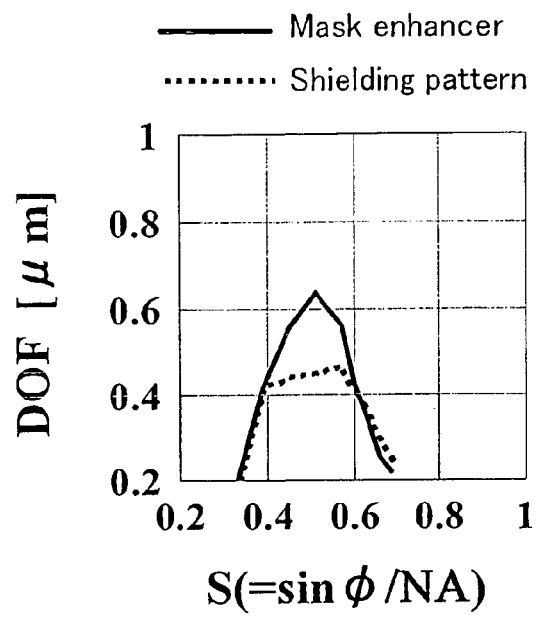
Figure 16C:
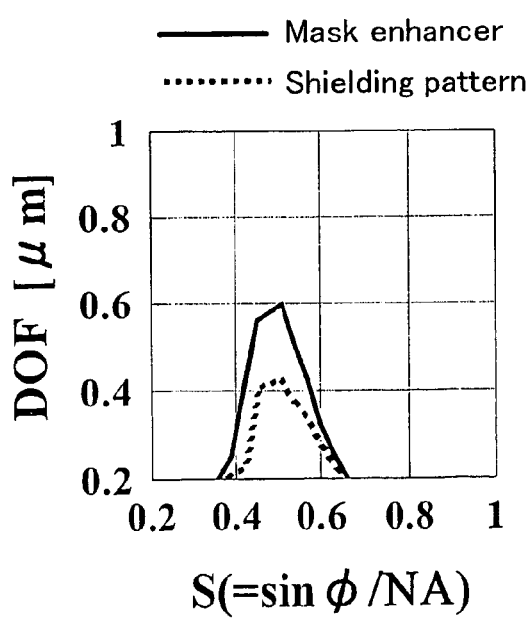
Figure 16D:
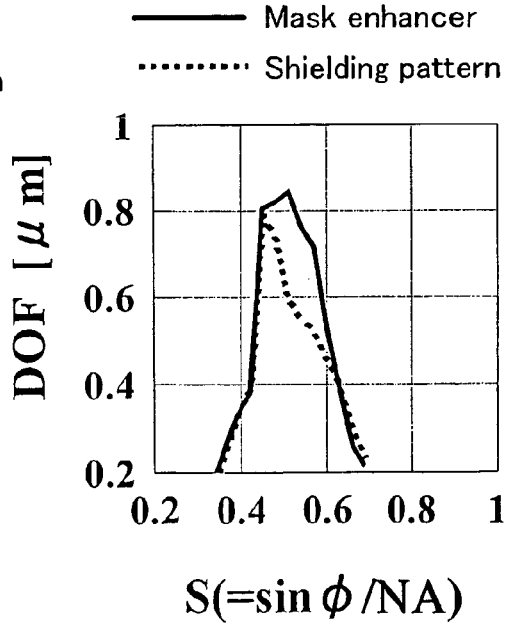

FIGS. 16A through 16D show the result of simulation performed by subjecting the mask patterns of FIGS. 9A through 9C to the oblique incident exposure using the quadrupole illumination. FIG. 16A is a diagram of the quadrupole illumination used in the simulation. FIG. 16A also shows the XY coordinate system. Each line pattern (the mask enhancer 110 and the first and second auxiliary patterns 113 and 114) of FIGS. 9A through 9C is disposed in parallel to the Y axis of the XY coordinate system. The quadrupole illumination of FIG. 16A is polarized in diagonal directions against the direction of the line pattern (the line direction) and the inside coordinate of the polarized illumination along a direction (the X axis direction) perpendicular to the line direction (the Y axis direction) is indicated by x1 and the outside coordinate is indicated by x2. Also, in simulating the dependency of the DOF on the oblique incident angle, in the case where the illumination of FIG. 16A is used for the exposure, the oblique incident position S is defined as (x1+x2)/2, and each of the auxiliary patterns 113 and 114 of FIGS. 9A through 9C is disposed on the basis of sin φ=S×NA, so as to simulate the pattern formation characteristics. In the simulation, L=100 nm, W=60 nm, D=60 nm, λ=193 nm and NA=0.7. Also, the shape of the quadrupole illumination is determined so that x2−x1=0.02. Similarly to FIGS. 15B through 15D where the dipole illumination is used, FIGS. 16B through 16D show the result of the simulation for the dependency of the DOF on the oblique incident angle φ (more precisely, on the oblique incident position S=sin φ/NA) performed under these conditions for forming a pattern with a width of 80 nm by using each of the mask patterns of FIGS. 9A through 9C. In FIGS. 16B through 16D, the result obtained by using a shielding pattern with a width of 100 nm as a main pattern is also shown for comparison. Specifically, in FIGS. 16B through 16D, the result obtained when the main pattern has the mask enhancer structure is shown with a solid line and the result obtained when the main pattern is a shielding pattern is shown with a broken line.

In all the results shown in FIGS. 16B through 16D, namely, in using the quadrupole illumination, the DOF obtained under an illumination condition that S is approximate to 0.50 is the maximum. Specifically, in using the quadrupole illumination, the optimum oblique incident angle φ is defined as sin φ=0.50×NA. Since a position projected onto the X axis of the quadrupole illumination is obtained by multiplying the original incident position by $0.5^{0.5}$, this optimum oblique incident angle corresponds to a value obtained by multiplying the optimum condition in using the annular illumination, that is, sin φ=0.7, by $0.5^{0.5}$. Also, the preferable oblique incident angle φ is defined as 0.4×NA≦sin φ≦0.6×NA. In this case, the distance from the center of the light source (the origin of the XY coordinate) to each of the four polarized lighting areas is not less than $0.4/(0.5^{0.5})×NA$ and not more than $0.6/(0.5^{0.5})×NA$.

As described above, in using the annular illumination, the preferable oblique incident position S is not less than 0.6 and not more than 0.8, and the optimum value can be obtained under the condition of S=0.7, i.e., sin φ=0.7×NA. In using the dipole illumination, the preferable oblique incident position S is not less than 0.5 and not more than 0.7, and the optimum value can be obtained under the condition of S=0.58, namely, sin φ=0.58×NA. In using the quadrupole illumination, the preferable oblique incident position S is not less than 0.4 and not more than 0.6, and the optimum value can be obtained under the condition of S=0.5, namely, sin φ=0.5×NA. Specifically, between the annular illumination and the dipole illumination, the ranges of the preferable oblique incident position S partly overlap, and hence, any of the mask patterns of FIGS. 9A through 9C in which the oblique incident position S is defined as a value not less than 0.58 and not more than 0.7 can be a mask pattern for attaining a good DOF characteristic in using any illumination belonging to the groups of the annular illumination and the dipole illumination. Also, deformed quadrupole illumination, which is different from the ideal quadrupole illumination shown in FIG. 16A and has lighting areas distributed along larger angular directions not limited to the angle of 45 degrees against the line direction, substantially belongs to the groups of the annular illumination and the dipole illumination. Therefore, a photomask formed so as to correspond to a preferable oblique incident angle for both the annular illumination and the dipole illumination can be the most preferable photomask for practical use.

Furthermore, a photomask formed so as to correspond to the oblique incident position S of 0.4 or more and 0.8 or less can exhibit a good DOF characteristic when the illumination conditions are adjusted suitably to the photomask.

It is noted that the most practically preferable illumination is the annular illumination for the following reason: Since the dipole illumination exhibits a minimum effect on a line pattern in parallel to the polarization direction of the lighting shape, patterns suitably applicable to the dipole illumination are limited. Since the quadrupole illumination may cause an unwanted phenomenon that in forming a T-shaped or L-shaped pattern obtained by bending one line, the shape of the pattern can be largely deformed as compared with a mask shape.

Modification 3 of Embodiment 1

As Modification 3 of Embodiment 1, arrangement of the auxiliary patterns for allowing the mask enhancer structure of the photomask according to Embodiment 1 (or Modification 1 or 2 of Embodiment 1) to exhibit more preferable effects will be described.

It has been described so far that various effects can be attained by introducing the mask enhancer structure to a main pattern. In other words, in the mask enhancer structure, the pattern formation characteristics such as the DOF and the contrast can be improved by controlling the mask width of the main pattern and the width of a phase shifter provided within the main pattern.

However, in employing any of the structures shown in FIGS. 1B, 1C and 2A through 2D, a part of the semi-shielding portion or the shielding portion surrounding the phase shifter preferably has a given width. This is because, when the part of the semi-shielding portion or the shielding portion surrounding the phase shifter is too fine, such a fine part is difficult to process in the mask processing, and in post-processing such as cleaning performed after the processing, there arises a problem of, for example, peeling of the pattern. Also, when the transmittance of the phase shifter is as high as the transmittance of a transparent portion, the phase shifter cannot be distinguished from the transparent portion in a mask inspection utilizing permeability of light. In contrast, when there is a semi-shielding portion with low transmittance or a shielding portion that can be identified by a mask inspection apparatus in the boundary between the phase shifter and the transparent portion, the photomask can be easily inspected.

From the viewpoint of the mask processing, the width of the part of the semi-shielding portion or the shielding portion surrounding the phase shifter is preferably at least 20 nm (in the actual dimension on the photomask) in the mask enhancer structure. This is because the resolution limit attained by utilizing a technique of twice exposure in an electron beam aligner used in the photomask processing is approximately 20 nm.

Furthermore, the mask inspection is ideally performed by using light of the same wavelength as the exposure wavelength, and therefore, a dimension that can be identified by the mask inspection apparatus is preferably not less than ¼ times as large as the exposure wavelength (in the actual dimension on the photomask). This is because a smaller dimension cannot be identified by using light. Herein, the actual dimension on the photomask means the actual dimension of a part formed on the photomask not converted by using the mask magnification.

However, in order to obtain the effects of the mask enhancer, light passing through the phase shifter and light passing through the transparent portion should interfere with each other, and therefore, the dimension of the part of the semi-shielding portion (or the shielding portion) sandwiched between the phase shifter and the transparent portion is preferably not more than $0.3 \times \lambda/NA$, that is, a distance at which the two lights can strongly interfere with each other. This is, however, a distance on a transferred image on the wafer, and therefore, the dimension on the mask is preferably not more than $(0.3 \times \lambda/NA) \times M$, which is obtained by multiplying the dimension by the mask magnification M.

Now, it will be described on the basis of the result of simulation that good pattern formation characteristics can be realized by using the mask enhancer structure for exhibiting preferable effects owing to the arrangement of auxiliary patterns according to this modification.

Figure 17A:
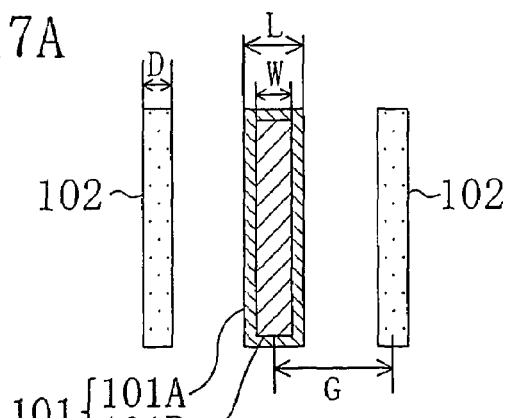
FIGS. 17A, 17B, 17C and 17D are diagrams for explaining that a good pattern formation characteristic can be realized by using a mask enhancer structure for attaining a preferable effect in accordance with arrangement of auxiliary patterns according to Modification 3 of Embodiment 1 of the invention.

FIG. 17A is a diagram of a mask pattern used in the simulation. In FIG. 17A, like reference numerals are used to refer to like elements used in the photomask of Embodiment 1 shown in FIG. 1A so as to omit detailed description.

As shown in FIG. 17A, in a main pattern 101 having the mask enhancer structure composed of a shielding portion 101A (the first semi-shielding portion 101A in Embodiment 1) and a phase shifter 101B, the main pattern 101 has a width L and the phase shifter 101B has a width W. On both sides of the main pattern 101, a pair of auxiliary patterns 102 that diffract exposing light and are not transferred through exposure are provided. In this case, the distance between the center of the phase shifter 101B and the center of the auxiliary pattern 102 is G. Also, the auxiliary pattern 102 is made from a semi-shielding portion with a width D.

Figure 17B:
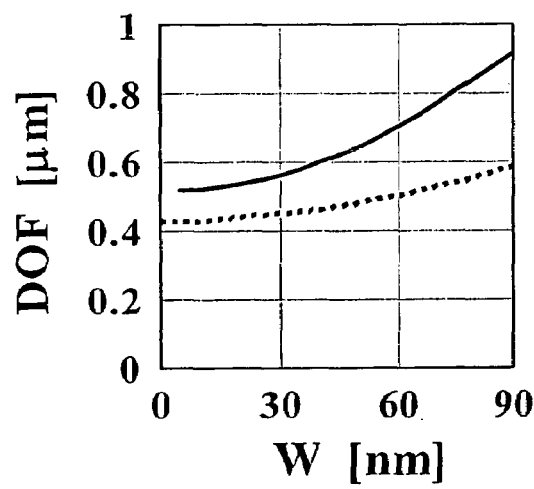
Figure 17C:
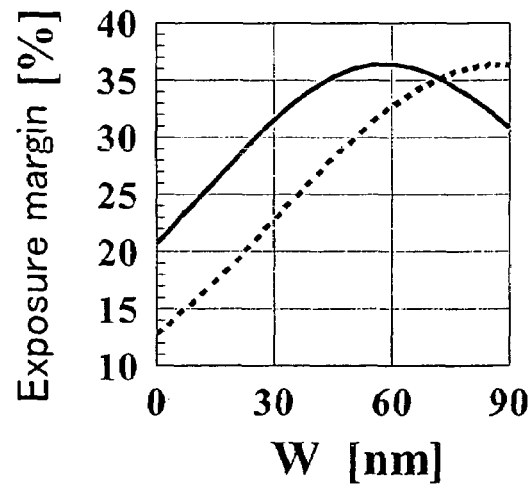
Figure 17D:
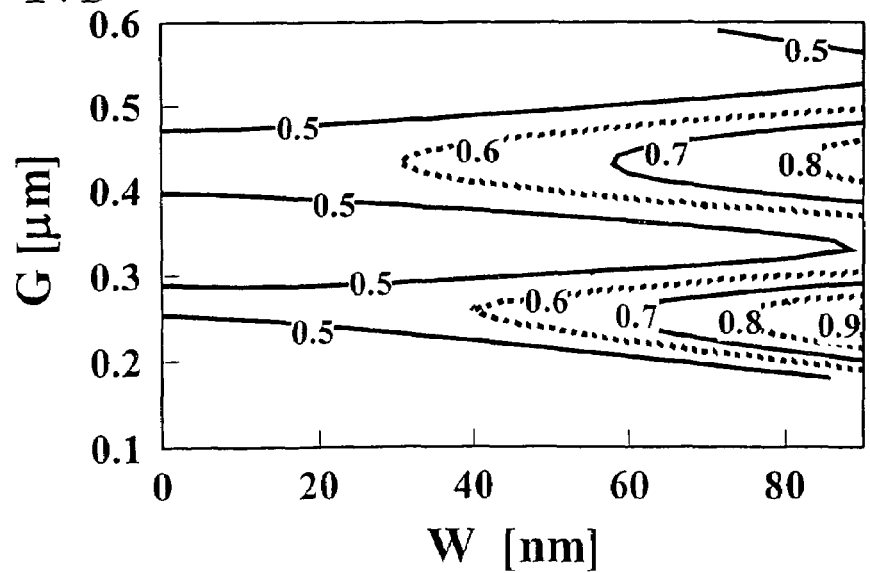

FIGS. 17B through 17D show the result of simulation performed for evaluating the DOF and the exposure margin obtained in forming a pattern with a width of 90 nm while changing the width W and the distance G when L=90 nm and D=70 nm. Herein, the exposure margin means the ratio (%) of change of the exposure energy (dose) necessary for changing a pattern dimension by 10%. In other words, as the exposure margin is larger, a pattern dimension is more stable against the change of the exposure energy, and hence preferably, is less changed against the change of the exposure energy in actual pattern formation. In the simulation, $\lambda$=193 nm and NA=0.7, and the quadrupole illumination shown in FIG. 16A is used, whereas x1 is 0.45×NA and x2 is 0.6×NA in FIG. 16A.

Specifically, FIG. 17B shows the dependency of the DOF on the width W (of the phase shifter) obtained in the cases where G=240 nm and G=500 nm. Also, FIG. 17C shows the dependency of the exposure margin on the width W (of the phase shifter) obtained in the cases where G=240 nm and G=500 nm.

As is understood from FIGS. 17B and 17C, in the simulation result obtained when G=500 nm, both the DOF and the exposure margin are the maximum when the width W is approximate to 90 nm, namely, the width W of the phase shifter is substantially equal to the width L of the mask pattern (namely, the width of the main pattern 101). Also, since the DOF merely gently increases in proportion to the width W of the phase shifter, when the width W of the phase shifter is small as compared with the width L of the mask pattern, a sufficient margin cannot be obtained.

In order to obtain a sufficient margin in the pattern formation, it is necessary to set the width W of the phase shifter to be substantially equal to the width L of the mask pattern. However, in this case, the width of the part of the shielding portion surrounding the phase shifter is very small, which is not preferable as the mask enhancer structure.

On the other hand, as is understood from FIGS. 17B and 17C, in the simulation result obtained when G=240 nm, when the width W is approximate to 60 nm, the exposure margin is the maximum and the DOF is sufficiently improved as compared with that attained by a simple shielding pattern with the width W of 0. Accordingly, when the width W of the phase shifter is smaller by approximately 30 nm than the width L of the mask pattern, a sufficient margin can be obtained in the pattern formation. In this case, the width of the part of the shielding portion surrounding the phase shifter is 15 nm. When this is converted into the actual dimension on the mask by assuming the magnification (reduction ratio) M is 4-fold, the actual dimension on the mask is 60 nm, and hence, a dimension not less than ¼ of the exposure wavelength (193 nm) can be secured. In FIGS. 17B and 17C, the width W of 90 nm means that the main pattern 101 is composed of the phase shifter alone.

It is understood from the aforementioned simulation result that when the main pattern has the same mask width, the exposure margin of the photomask can be more improved by using auxiliary patterns when the main pattern has the mask enhancer structure than when the main pattern is made from a simple phase shifter. When $NA \times \sin \phi = (x1+x2)/2$, the width G of 240 nm corresponds to the optimum position of the first auxiliary pattern (auxiliary pattern 102), that is, $\lambda/(2 \times \sin \phi)$.

Although herein not described in detail, the present inventor has confirmed that a similar result can be obtained with respect to the second auxiliary pattern (in the case where the width G is 440 nm corresponding to its optimum position, $\lambda/(2 \times \sin \phi) + \lambda/(NA + \sin \phi)$).

Furthermore, as is understood from FIGS. 17B and 17C, the exposure margin abruptly increases in proportion to the width W of the phase shifter until it becomes the maximum value. On the other hand, if a sufficient exposure margin can be secured, the width W of the phase shifter is not necessarily set to a value for maximizing the exposure margin. Accordingly, whether or not a sufficient margin can be secured in the pattern formation while sufficiently securing the width of the part of the semi-shielding or shielding portion surrounding the phase shifter depends upon whether or not the DOF is largely improved in accordance with the increase of the width W of the phase shifter in the mask enhancer structure.

FIG. 17D shows the result obtained by plotting the dependency of the DOF on a matrix of the width W of the phase shifter and the distance G between the center of the phase shifter and the center of the auxiliary pattern. It is understood from this result that the DOF is abruptly improved in proportion to the width W when G=240 nm (0.24 μm) and G=440 nm (0.44 μm). These distances G correspond to the optimum position of the first auxiliary pattern and the optimum position of the second auxiliary pattern in this modification as described above. Accordingly, when the auxiliary patterns are disposed in these positions, a sufficient margin can be secured in the pattern formation while sufficiently securing the width of the part of the semi-shielding portion or the shielding portion surrounding the phase shifter in the mask enhancer structure.

Modification 4 of Embodiment 1

As Modification 4 of Embodiment 1, the width of an auxiliary pattern for allowing the photomask according to Embodiment 1 (or Modification 1, 2 or 3 of Embodiment 1) to exhibit more preferable effects will be described.

First, the result of simulation for dependency of the DOF and the exposure margin on the width of an auxiliary pattern obtained in subjecting the mask pattern of FIG. 4 to the exposure will be described. In the simulation, $\lambda$=193 nm and NA=0.7, and annular illumination (with an inner diameter of 0.65 and an outer diameter of 0.75) is used. Also, it is assumed that a transparent portion and a phase shifter have transmittance of 1 and that a mask pattern excluding the phase shifter is made from a semi-shielding portion (with transmittance of 6%). Furthermore, the respective auxiliary patterns are disposed in their optimum positions as shown in FIG. 4 in accordance with $\sin \phi = 0.7 \times NA$.

In general, when the auxiliary pattern is thicker, the DOF of the main pattern is increased while the exposure margin is reduced. Therefore, the DOF and the exposure margin in transferring a main pattern are simulated so as to find how this phenomenon actually depends upon the widths of the first and second auxiliary patterns. Specifically, the main pattern 101 in which the width L is 140 nm and the width W is 80 nm is subjected to the exposure with the widths D1 and D2 of the first and second auxiliary patterns 102 and 103 changed from 40 nm to 100 nm, so as to obtain the DOF and the exposure margin.

Figure 18A:
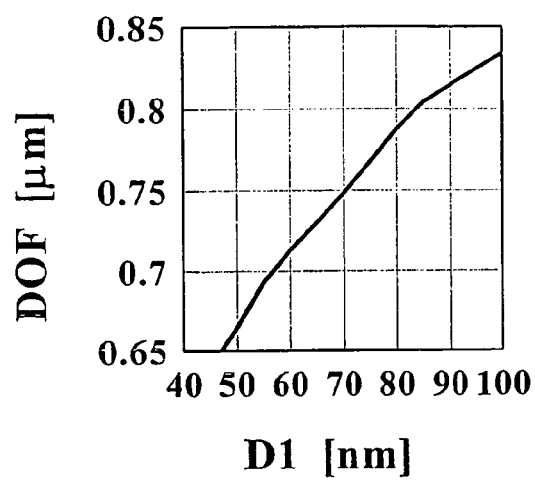
FIGS. 18A, 18B, 18C and 18D are diagrams for explaining the result of simulation for dependency of a DOF and an exposure margin on the width of an auxiliary pattern obtained through exposure performed on the mask pattern of FIG. 4.
Figure 18B:
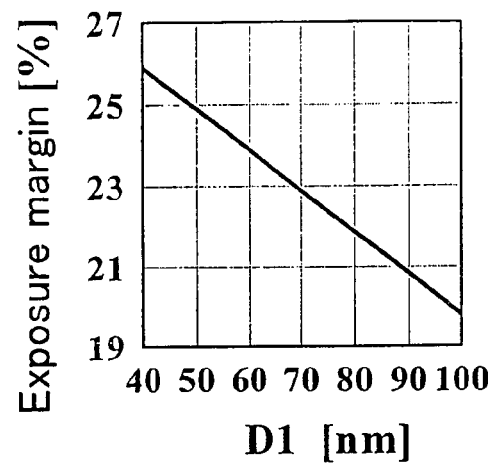
Figure 18C:
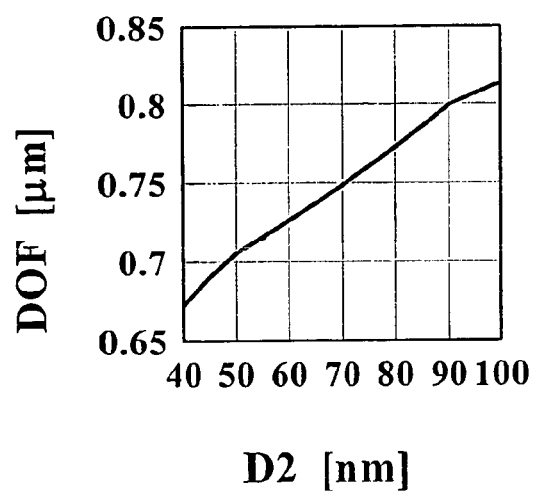
Figure 18D:
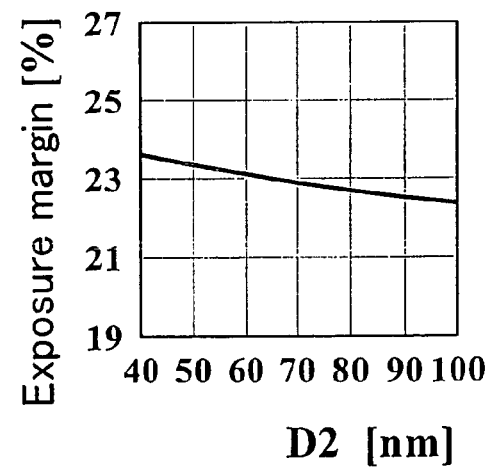

FIGS. 18A and 18B show the result of the simulation for the DOF and the exposure margin obtained by fixing the width D2 to 70 nm and changing the width D1 from 40 nm to 100 nm. FIGS. 18C and 18D show the result of the simulation for the DOF and the exposure margin obtained with the width D1 fixed to 70 nm and the width D2 changed from 40 nm to 100 nm. The DOF and the exposure margin shown in FIGS. 18A through 18D are obtained in forming a pattern with a width of 90 nm.

It is understood from the result shown in FIGS. 18A and 18B that the DOF obtained in transferring the main pattern is largely increased as the width D1 of the first auxiliary pattern 102 is increased. On the other hand, it is understood that the exposure margin obtained in transferring the main pattern is largely reduced as the width D1 is increased. In other words, when the first auxiliary pattern 102 is thicker, the exposure margin is reduced although the DOF is improved. Therefore, the exposure margin can be improved merely through trade-off of these factors.

On the other hand, as is understood from the result shown in FIGS. 18C and 18D, the DOF obtained in transferring the main pattern is largely increased as the width D2 of the second auxiliary pattern 103 is increased in the same manner as in the case of the first auxiliary pattern 102. However, even when the width D2 is increased, the exposure margin obtained in transferring the main pattern is merely slightly reduced. Therefore, when the width D2 is increased, the DOF can be improved without reducing the exposure margin.

As described so far, when the width D2 of the second auxiliary pattern is larger than the width D1 of the first auxiliary pattern, the DOF can be improved while keeping a large exposure margin. Furthermore, the present inventor has experimentally found that the second auxiliary pattern does not form an unexposed portion on a resist even when the second auxiliary pattern has a width approximately 1.2 times as large as the maximum width of the first auxiliary pattern for avoiding formation of an unexposed portion on the resist. Accordingly, even when the second auxiliary pattern has a width 1.2 times as large as that of the first auxiliary pattern, a phenomenon that an unexposed portion is formed in a resist can be avoided. Accordingly, when the width D2 of the second auxiliary pattern is not less than 1.2 times as large as the width D1 of the first auxiliary pattern, the aforementioned effects can be definitely attained while preventing the second auxiliary pattern from forming an unexposed portion in a resist. However, in order to obtain the effect to improve the DOF by the auxiliary patterns, each auxiliary pattern preferably has a width a half as large as the minimum dimension at which the auxiliary pattern is resolved. Specifically, when the width D1 of the first auxiliary pattern is sufficiently large for attaining the effect to improve the DOF, in order to prevent the second auxiliary pattern from being resolved, the width D2 of the second auxiliary pattern is preferably not more than twice as large as the width D1 of the first auxiliary pattern.

In this modification, a pair of auxiliary patterns working as the diffraction light generation patterns are provided on both sides of the main pattern as a premise. However, in the case where a main pattern is disposed in the vicinity of one side of another main pattern, an auxiliary pattern may be provided merely on the other opposite side of the main pattern.

Embodiment 2

A photomask according to Embodiment 2 of the invention will now be described with reference to the accompanying drawing.

Figure 19:
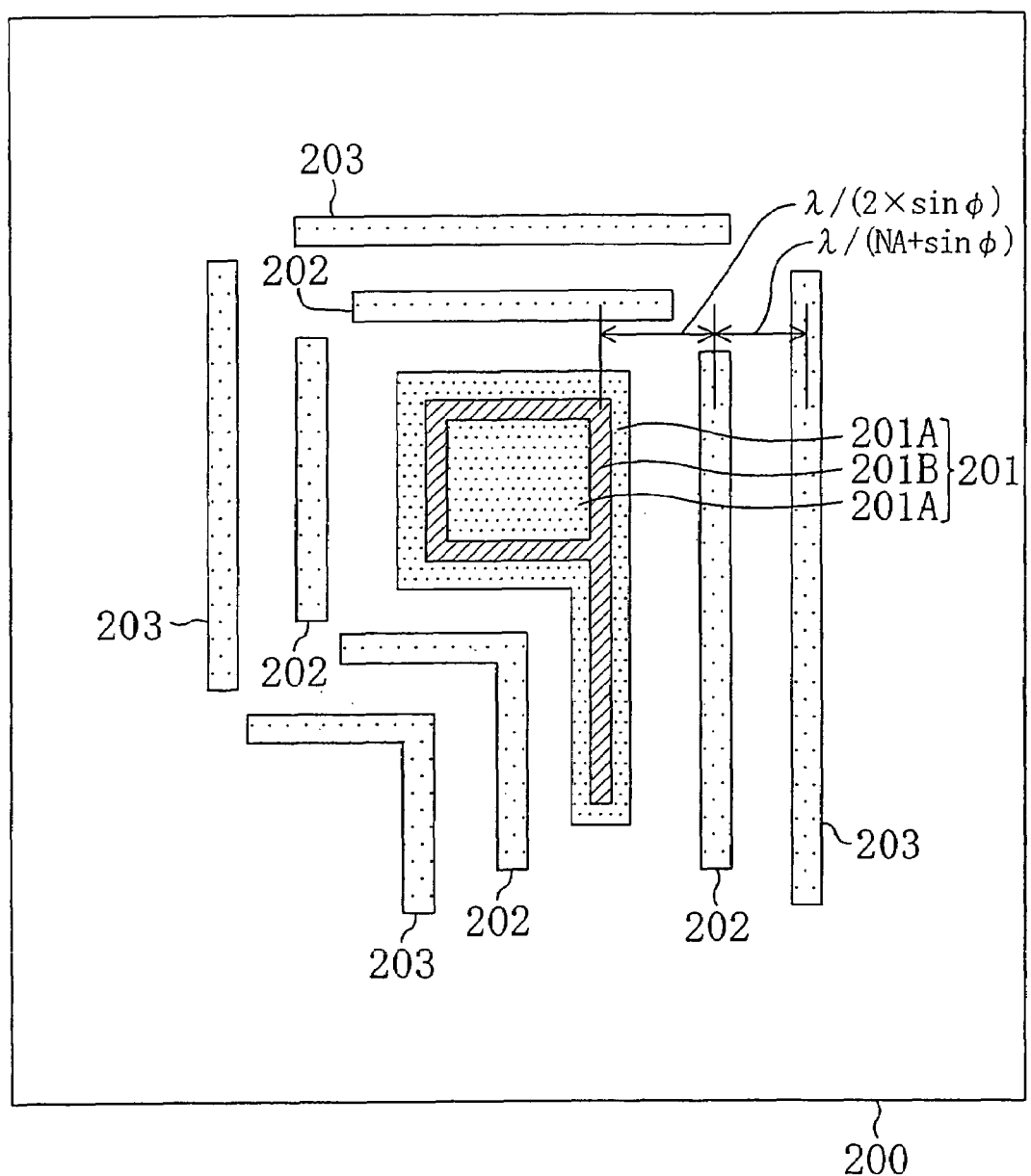
FIG. 19 is a plan view of a photomask according to Embodiment 2 of the invention.

FIG. 19 is a plan view of the photomask of Embodiment 2.

As shown in FIG. 19, a main pattern 201 to be transferred through exposure is provided on a transparent substrate 200. The main pattern 201 is composed of a first semi-shielding portion 201A having first transmittance for partially transmitting exposing light and a phase shifter 201B. The first semi-shielding portion 201A is in the shape corresponding to the outline of the main pattern 201. The phase shifter 201B is provided in a peripheral portion of the main pattern 201 so as to be surrounded by a part of the first semi-shielding portion 201A. The phase shifter 201B is formed by, for example, trenching the transparent substrate 200. Each of first auxiliary patterns 202 (with a width D1) that diffract the exposing light and are not transferred through the exposure is provided on the transparent substrate 200 in a position away from the center of the phase shifter 201B of the main pattern 201 by a distance $\lambda/(2\times\sin \phi)$ so as to sandwich a transparent portion between the main pattern 201 and the first auxiliary pattern 202. Also, each of second auxiliary patterns 203 (with a width D2) that diffract the exposing light and are not transferred through the exposure is provided on the transparent substrate 200 in a position away from the center of the first auxiliary pattern 202 (in a direction away from the main pattern 201) by a distance $\lambda/(NA+\sin \phi)$ so as to sandwich a transparent portion between the first auxiliary pattern 202 and the second auxiliary pattern 203. In this case, each of the first auxiliary patterns 202 and the second auxiliary patterns 203 is made from a second semi-shielding portion having second transmittance for partially transmitting the exposing light.

In this embodiment, the distance between the phase shifter 201B and the first auxiliary pattern 202 may be approximate to $\lambda/(2\times\sin \phi)$ (see Modification 1 of Embodiment 1).

Also in this embodiment, the distance between the phase shifter 201B and the second auxiliary pattern 203 may be approximate to $\lambda/(2\times\sin \phi)+\lambda/(NA+\sin \phi)$ (see Modification 1 of Embodiment 1).

Furthermore, in this embodiment, sin $\phi$ (wherein $\phi$ is an oblique incident angle) is preferably not less than 0.40×NA and not more than 0.80×NA, and more preferably not less than 0.58×NA and not more than 0.70×NA. In the case where the exposure is performed by using annular illumination, sin $\phi$ is preferably not less than 0.60×NA and not more than 0.80×NA. In the case where the exposure is performed by using quadrupole illumination, sin $\phi$ is preferably not less than 0.40×NA and not more than 0.60×NA (see Modification 2 of Embodiment 1).

Also, in this embodiment, the width D2 of the second auxiliary pattern 203 is preferably larger than the width D1 of the first auxiliary pattern 202. In particular, the width D2 is preferably not less than 1.2 times as large as the width D1 (see Modification 4 of Embodiment 1).

Now, a characteristic of the arrangement of the phase shifter in this embodiment will be described. In the case where the dimension of a pattern to be formed is 0.3×λ/NA or less, the phase shifter is preferably disposed at the center of a semi-shielding portion (a semi-shielding pattern) corresponding to the pattern to be formed. Alternatively, in the case where the dimension of a pattern to be formed is λ/NA or more, the phase shifter is preferably disposed in a peripheral portion of a semi-shielding pattern corresponding to the pattern to be formed. Alternatively, in the case where the dimension of a pattern to be formed is larger than 0.3×λ/NA and smaller than λ/NA, the phase shifter may be disposed at the center or in a peripheral portion of a semi-shielding pattern corresponding to the pattern to be formed.

The phase shifter is disposed in the peripheral portion of a mask pattern used for forming a pattern with a dimension of λ/NA or more in order to attain an effect to prove the pattern formation characteristics by an "outline enhancement method" described later as well as to provide diffraction light generation patterns in optimum positions. Specifically, the phase shifter is preferably disposed in a position away from the outer periphery of the semi-shielding pattern by a distance $\lambda/(2\times\sin \phi)$ or less. This is because the phase shifter should be present in a position away from the outer periphery of the semi-shielding pattern (main pattern) by the distance $\lambda/(2\times\sin \phi)$ or less in order to dispose first-order diffraction light generation patterns. Also, in considering that the maximum value of sin $\phi$ is NA, when the semi-shielding pattern has a dimension of λ/NA or more, the phase shifter is preferably disposed in the peripheral portion thereof.

In the photomask shown in FIG. 19, a mask pattern consists of the main pattern 201, the first auxiliary patterns 202 and the second auxiliary patterns 203. Also, an area on the transparent substrate 200 where the mask pattern is not formed corresponds to a transparent portion (opening).

There is a relationship of opposite phases between light passing through the phase shifter 201B and light passing through the transparent portion (specifically, a relationship that a phase difference between these lights is not less than (150+360×n) degrees and not more than (210+360×n) degrees (wherein n is an integer)).

Also, there is a relationship of the identical phase between light passing through each of the first semi-shielding portion 201A and the second semi-shielding portion (namely, the first and second auxiliary patterns 202 and 203) and light passing through the transparent portion (specifically, a relationship that a phase difference between these lights is not less than (−30+360×n) degrees and not more than (30+360×n) degrees (wherein n is an integer)).

According to Embodiment 2, since the main pattern 201 is composed of the first semi-shielding portion 201A and the phase shifter 201B, lights passing through the transparent portion and the first semi-shielding portion 201A can be partially cancelled by light passing through the phase shifter 201B. Therefore, the contrast in a light intensity distribution of a shielded image corresponding to the main pattern 201 can be emphasized.

Furthermore, according to Embodiment 2, the first and second auxiliary patterns 202 and 203 having low transmittance are provided separately from the main pattern 201. Specifically, the first auxiliary patterns (first-order diffraction light generation patterns) 202 are disposed in positions away from the center of the phase shifter 201B of the main pattern 201 by a distance $\lambda/(2\times\sin \phi)$. Also, the second auxiliary patterns (second-order diffraction light generation patterns) 203 are disposed in positions away from the centers of the first auxiliary patterns 202 by a distance $\lambda/(NA+\sin \phi)$. Therefore, diffraction light for interfering with the light passing through the phase shifter 201B of the main pattern 201 can be definitely generated. Accordingly, the defocus characteristic of a transferred image of the main pattern 201 can be improved, resulting in improving the DOF characteristic.

Even when the distance between the phase shifter 201B and the first auxiliary pattern 202 is approximate to $\lambda/(2\times\sin \phi)$ in this embodiment, the above-described effects can be attained to some extent. Similarly, even when the distance between the phase shifter 201B and the second auxiliary pattern 203 is approximate to $\lambda/(2\times\sin \phi))+\lambda/(NA+\sin \phi)$, the above-described effects can be attained to some extent (see Modification 1 of Embodiment 1). Furthermore, sin $\phi$ (wherein $\phi$ is an oblique incident angle) is preferably not less than 0.40×NA and not more than 0.80×NA, and more preferably not less than 0.60×NA and not more than 0.70×NA (see Modification 2 of Embodiment 1).

Moreover, in this embodiment, the width of the part of the semi-shielding portion (the first semi-shielding portion 201A) of the main pattern 201 sandwiched between the phase shifter 201B and the transparent portion is preferably at least 20 nm (in the actual dimension on the mask), and more preferably not less than ¼ of exposure wavelength (see Modification 3 of Embodiment 1).

Also, in this embodiment, the width D2 of the second auxiliary pattern 203 is preferably larger than the width D1 of the first auxiliary pattern 202. In particular, the width D2 is preferably not less than 1.2 times as large as the width D1 (see Modification 4 of Embodiment 1).

Furthermore, according to Embodiment 2, since the first and second auxiliary patterns 202 and 203 are made from the semi-shielding portion, the degree of freedom in the arrangement of the auxiliary patterns can be increased. Therefore, the periodicity in the arrangement of the patterns including the main pattern 201 can be increased, so that the DOF characteristic can be further improved. Also, since the first and second auxiliary patterns 202 and 203 are made from the semi-shielding portion, these auxiliary patterns can be made thick under restriction they are not transferred through the exposure, and hence, the auxiliary patterns can be easily processed.

Moreover, according to Embodiment 2, since the phase shifter 201B is disposed in the peripheral portion of the main pattern 201, the contrast in the light intensity distribution in an image formed by the light passing through the transparent portion in the vicinity of the main pattern 201 can be emphasized, so that the pattern formation can be carried out while keeping a good defocus characteristic.

Furthermore, according to Embodiment 2, since the phase shifter 201B is formed by trenching the transparent substrate 200, a very good defocus characteristic can be exhibited in the pattern formation.

Also in Embodiment 2, either of the first auxiliary patterns 202 and the second auxiliary patterns 203 may be omitted.

In Embodiment 2, the first transmittance of the first semi-shielding portion 201A used for forming the main pattern 201 is preferably 15% or less. Thus, the thickness of a resist film can be prevented from reducing or the resist sensitivity can be optimized in the pattern formation. However, in order to attain such an effect as well as the effects to improve the DOF and the contrast, the first transmittance is preferably 3% or more.

Also in Embodiment 2, the second transmittance of the first and second auxiliary patterns 202 and 203 (namely, the second semi-shielding portion) is preferably not less than 6% and not more than 50%. Thus, the effect to improve the DOF derived from the diffraction light can be definitely realized while preventing an unexposed portion from being formed in a resist due to a too high shielding property of the auxiliary pattern.

In Embodiment 2, the first semi-shielding portion 201A and the second semi-shielding portion working as the first and second auxiliary patterns 202 and 203 may be made from one semi-shielding film, such as a metal thin film formed on the transparent substrate 200. In this case, the photomask can be easily processed because each semi-shielding portion can be easily formed. As the metal thin film, a thin film (with a thickness of approximately 50 nm or less) of Cr (chromium), Ta (tantalum), Zr (zirconium), Mo (molybdenum), or Ti (titanium), or an alloy of any of these metals can be used. Examples of the alloy are Ta—Cr alloy, Zr—Si alloy, Mo—Si alloy and Ti—Si alloy. Alternatively, a thick film including a silicon oxide, such as ZrSiO, CrAlO, TaSiO, MoSiO or TiSiO, may be used instead of the metal thin film.

Furthermore, in Embodiment 2, the phase shifter 201B may be formed by forming, on the transparent substrate 200, a phase shift film made from a material with high transmittance.

Next, a method, found by the present inventor, for improving the resolution of an isolated space pattern by using a structure in which a phase shifter (the phase shifter 201B) is provided in a peripheral portion of a shielding pattern (the main pattern 201) (hereinafter referred to as the outline enhancement method) will be described. The "outline enhancement method" is based on a principle applicable to any fine space pattern used in the positive resist process regardless of the shape of the pattern. The following description is given by exemplifying the case where a contact pattern is to be formed through the positive resist process, whereas the outline enhancement method is applicable also to the negative resist process by replacing a fine space pattern (a resist removal pattern) of the positive resist process with a fine pattern (a resist pattern). In the following description, a shielding pattern excluding a phase shifter is made from a semi-shielding portion unless otherwise mentioned.

In a photomask in which a shielding pattern is provided, for example, so as to surround an opening and a phase shifter is provided in a peripheral portion of the shielding pattern (hereinafter referred to as the outline enhanced mask), light passing through the phase shifter provided in the peripheral portion of the shielding pattern, namely, provided around the opening (transparent portion), can partially cancel lights passing through the opening and a semi-shielding portion. Accordingly, when the intensity of the light passing through the phase shifter is controlled to cancel light passing through a region around the opening (an outline region), a light intensity distribution in which the light intensity in the outline region is reduced to substantially 0 (zero) can be formed. Also, the light passing through the phase shifter strongly cancels the light passing through the outline region but weakly cancels light passing a region in the vicinity of the center of the opening. As a result, in the light intensity distribution of the light passing through the outline enhanced mask, the gradient of the profile from the opening to its periphery can be increased. Accordingly, the intensity distribution of the light passing through the outline enhanced mask has a sharp profile, resulting in forming an image of the light intensity with high contrast. This is the principle that an image of the light intensity can be emphasized by the outline enhancement method. Specifically, when the phase shifter is provided in the vicinity of the opening in the mask pattern made from a semi-shielding portion with low transmittance, a very strong dark part corresponding to the outline of the opening can be formed in an image of the light intensity formed by using the photomask. In this manner, a light intensity distribution having emphasized contrast between the light intensity obtained in the opening and the light intensity obtained in the region around the opening can be formed.

It is noted that the semi-shielding portion used in the outline enhancement method preferably has high transmittance. However, since transmitted light may reach a region that should originally be a shielded part due to the presence of the semi-shielding portion, the maximum value of the transmittance of the semi-shielding portion is preferably approximately 15% in order to, for example, prevent the thickness of a resist film (a resist pattern corresponding to the semi-shielding portion) from reducing or to optimize the resist sensitivity in the pattern formation. On the other hand, in order to attain the effect of the outline enhancement method, the minimum value of the transmittance of the semi-shielding portion is preferably approximately 3%. Accordingly, the optimum value of the transmittance of the semi-shielding portion of the outline enhanced mask is not less than 3% and not more than 15%. Also, in the outline enhanced mask, the phase shifter may be provided in contact with the opening or with a part of the semi-shielding portion sandwiched between the phase shifter and the opening. Furthermore, the phase shifter may be provided along the whole outline of the opening or along merely part of the outline.

Furthermore, when a semi-shielding pattern for transmitting light in the identical phase with respect to a transparent portion is used as the shielding pattern, a mask pattern simultaneously employing the center line enhancement method (described in Embodiment 1) and the outline enhancement method can be formed. Specifically, a phase shifter is provided at the center of a semi-shielding pattern used for forming a fine line pattern. On the other hand, a phase shifter is provided in a peripheral portion of a semi-shielding pattern used for forming a large pattern. In this manner, the contrast of a light intensity image corresponding to the edge of the large pattern can be improved owing to the outline enhancement method, and therefore, the contrast of the light intensity image can be emphasized over every part of the whole pattern to be formed. Thus, a semi-shielding pattern (a semi-shielding portion for transmitting light in the identical phase with respect to a transparent portion), which is conventionally not preferably used in a mask pattern for use in the pattern formation, can be used for forming a pattern in an arbitrary shape. Furthermore, the use of a semi-shielding pattern, namely, a semi-shielding film, can result in the following merits: In a conventional mask, it is necessary to use a thick metal film as a mask pattern for securing a sufficient shielding property. In contrast, a semi-shielding pattern can be made from a thin metal film with a semi-shielding property, in other words, the thickness of a metal film used for forming the mask pattern can be reduced, the photomask can be easily processed. Specifically, when a Cr film is used, a thickness of approximately 100 nm is necessary as a mask pattern in a conventional mask, but a thickness of approximately 10 nm is sufficient as a semi-shielding pattern. Therefore, even when a fine mask pattern is formed through etching or when cleaning is performed after forming a mask pattern, defectives such as peeling can be avoided.

In Embodiment 2, the defocus characteristic (the DOF characteristic) in the pattern formation can be improved by generating, by using the diffraction light generation patterns (the first and second auxiliary patterns 202 and 203), diffraction light for interfering with light passing through the opening (the phase shifter 201B) provided within the mask enhancer (the main pattern 201) for the same reason as that described in Embodiment 1.

Specifically, in the mask enhancer structure (shown in FIG. 19) for the outline enhancement method in which a phase shifter (the phase shifter 201B) is provided in a peripheral portion of a semi-shielding portion (the first semi-shielding portion 201A), a part of the semi-shielding portion surrounded by the phase shifter transmits merely light that cannot sensitize a resist but is optically identical to a transparent portion. Accordingly, the phase shifter of the outline enhancement method exhibits the same function as the phase shifter of the center line enhancement method. Therefore, in the same manner as in the center line enhancement method, the defocus characteristic can be improved by disposing a first-order diffraction light generation pattern in a position away from the center of the phase shifter by a distance $\lambda/(2\times\sin\phi)$ and (or) a second-order diffraction light generation pattern in a position away from the center of the first-order diffraction light generation pattern by a distance $\lambda/(NA+\sin\phi)$. The allowable ranges of the positions of the diffraction light generation patterns on the basis of the position of the phase shifter are the same as those employed in the center line enhancement method described in Embodiment 1.

Embodiment 3

A photomask according to Embodiment 3 of the invention will now be described with reference to the accompanying drawings.

Figure 20A:
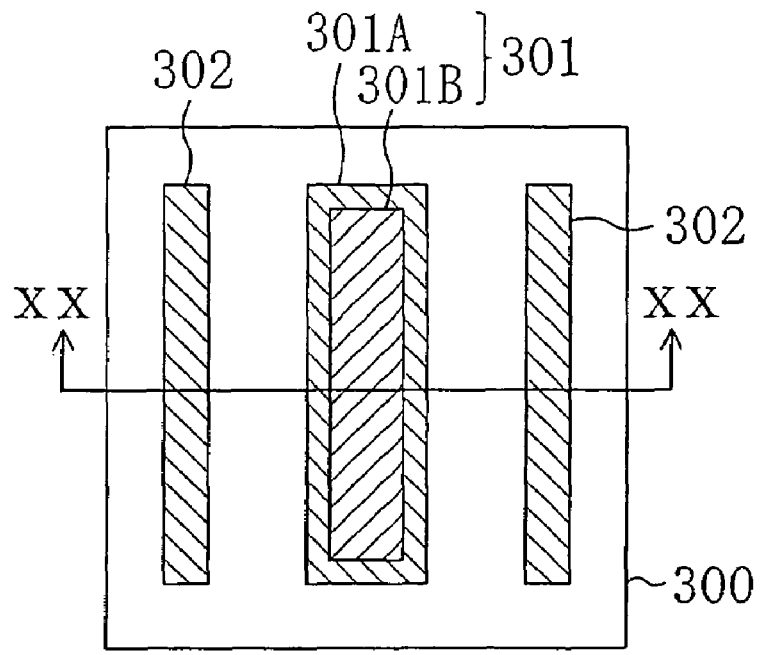
FIG. 20A is a plan view of a photomask according to Embodiment 3 of the invention and FIG. 20B is a cross-sectional view thereof taken along line XX-XX of FIG. 20A.
Figure 20B:
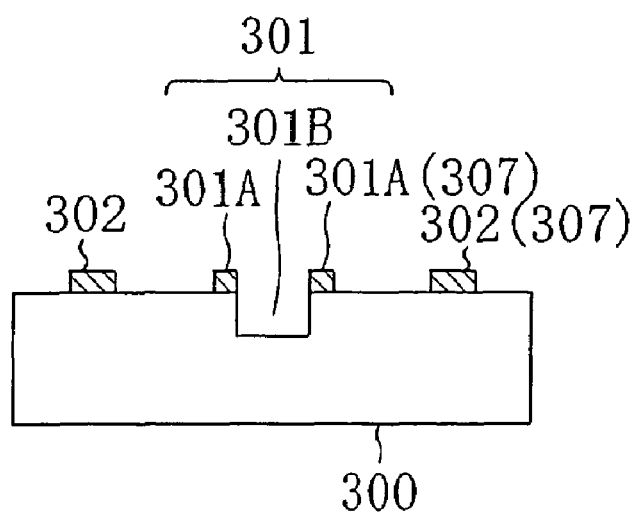
Figure 21A:
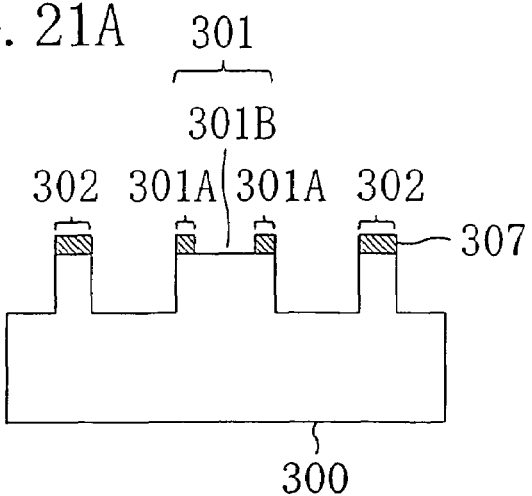
FIGS. 21A, 21B and 21C are diagrams for showing variations of the cross-sectional structure taken along line XX-XX of FIG. 20A.
Figure 21B:
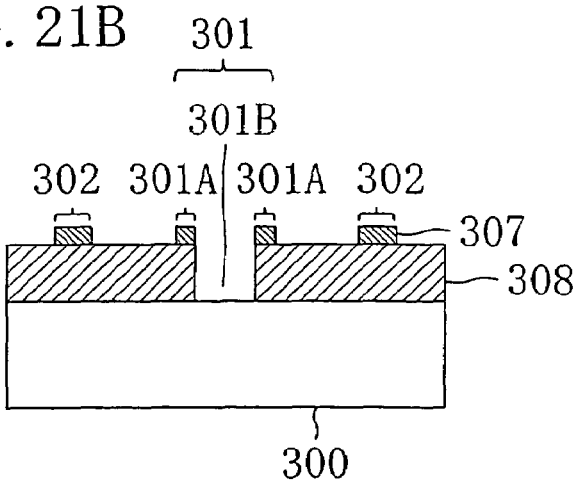
Figure 21C:
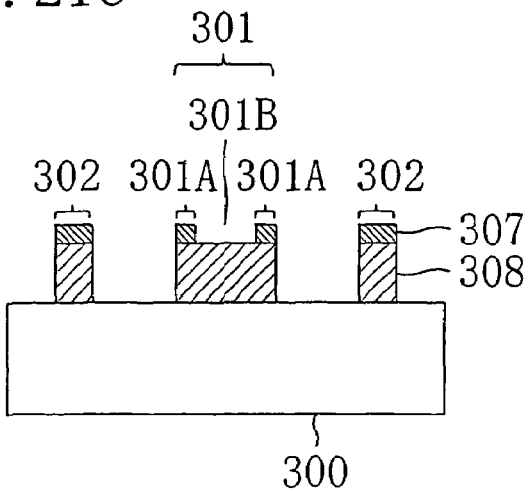

FIG. 20A is a plan view of the photomask of Embodiment 3, and FIG. 20B is a cross-sectional view thereof taken along line XX-XX of FIG. 20A. Also, FIGS. 21A through 21C are cross-sectional views for showing variations of the cross-sectional structure taken on line XX-XX of FIG. 20A.

As shown in FIGS. 20A and 20B, a line-shaped main pattern 301 to be transferred through exposure is provided on a transparent substrate 300. The main pattern 301 is composed of a first shielding portion 301A and a phase shifter 301B. The first shielding portion 301A is formed so as to surround the phase shifter 301B in a line shape. In other words, the phase shifter 301B is provided at the center of the main pattern 301. The phase shifter 301B is formed by, for example, trenching the transparent substrate 300. A pair of auxiliary patterns 302 that diffract exposing light and are not transferred through the exposure are provided on the transparent substrate 300 on both sides of the main pattern 301 so as to sandwich a transparent portion between the main pattern 301 and the auxiliary patterns 302. The auxiliary patterns 302 are made from a second shielding portion.

In this embodiment, the first shielding portion 301A and the second shielding portion working as the auxiliary patterns 302 are made from one shielding film 307 of, for example, a metal film such as a Cr (chromium) film formed on the transparent substrate 300.

In other words, Embodiment 3 is different from Embodiment 1 in using a mask enhancer composed of a shielding portion and a phase shifter and auxiliary patterns (diffraction light generation patterns) made from a shielding portion alone. In the photomask shown in FIGS. 20A and 20B, a mask pattern consists of the main pattern 301 and the auxiliary patterns 302. Also, an area on the transparent substrate 300 where the mask pattern is not formed corresponds to a transparent portion (opening). Furthermore, there is a relationship of the opposite phases between light passing through the phase shifter 301B and light passing through the transparent portion (specifically, a relationship that a phase difference between these lights is not less than $(150+360\times n)$ degrees and not more than $(210+360\times n)$ degrees (wherein n is an integer).

According to Embodiment 3, since the main pattern 301 includes the phase shifter 301B, light passing through the transparent portion can be partially cancelled by light passing through the phase shifter 301B. Therefore, the contrast in a light intensity distribution of a shielded image corresponding to the main pattern 301 can be emphasized. Furthermore, since the auxiliary patterns 302 are provided separately from the main pattern 301, when the auxiliary patterns 302 are disposed in appropriate positions, diffraction light for interfering with the light passing through the phase shifter 301B of the main pattern 301 can be generated. Accordingly, the defocus characteristic of a transferred image of the main pattern 301 can be improved, resulting in improving the DOF characteristic.

Also, according to Embodiment 3, since the phase shifter 301B is disposed at the center of the first shielding portion 301A in the shape corresponding to the outline of the main pattern 301, the contrast of the light intensity distribution at the center of the shielded image corresponding to the main pattern 301 can be emphasized. As a result, for example, a fine line pattern can be formed while keeping a good defocus characteristic.

Furthermore, according to Embodiment 3, since the phase shifter 301B is formed by trenching the transparent substrate 300, a good defocus characteristic can be exhibited in the pattern formation. Specifically, the phase shifter 301B is formed by forming an opening in the shielding film 307 (shielding portion) and trenching the transparent substrate 300 within the opening, and therefore, the phase shifter 301B can attain a high transmitting property. Also, since the intensity of light in the opposite phase passing through the inside of the main pattern 301 can be controlled in accordance with the dimension of the opening formed in the shielding portion, the light in the opposite phase passing through the main pattern 301 can be easily optimized. Therefore, a very good defocus characteristic can be exhibited in the pattern formation. Specifically, the mask dimension (the dimension of the main pattern) can be controlled in accordance with the width of a part of the shielding portion surrounding the phase shifter, and the intensity of the light in the opposite phase passing through the main pattern can be controlled in accordance with the dimension of the opening formed in the shielding portion. Therefore, as a peculiar effect of this photomask, the mask dimension and the intensity of the light in the opposite phase can be independently controlled. Accordingly, similarly to Embodiment 1, while definitely attaining effects resulting from the control of the light in the opposite phase, such as the effect to improve the focus characteristic and the effect to improve the contrast of a fine pattern, a desired pattern dimension can be easily realized.

In Embodiment 3, a photomask that can attain the same effects as those of the photomask shown in FIG. 20B can be also realized as shown in, for example, FIG. 21A, in which a shielding film 307 is removed from a multilayer structure of a transparent substrate 300 and the shielding film 307 in a phase shifter formation region and a transparent portion formation region and the transparent substrate 300 is trenched in the transparent portion formation region.

Alternatively, in Embodiment 3, the main pattern 301 including the phase shifter 301B and the auxiliary patterns 302 may be formed by employing a structure as shown in, for example, FIG. 21B or 21C, in which a shielding film 307 is formed above a transparent substrate 300 with a phase shift film 308 made from a material with high transmittance sandwiched between the transparent substrate 300 and the shielding film 307. Specifically, as shown in FIG. 21B, in a mask structure in which the phase shift film 308 with high transmittance is deposited on the transparent substrate 300 and the shielding film 307 is deposited on the phase shift film 308, the shielding film 307 is removed in the phase shifter formation region and the transparent portion formation region and the phase shift film 308 is removed in the phase shifter formation region. Also in this manner, a photomask that can attain the same effects as those of the photomask of FIG. 20B can be realized. Also, in the photomask of FIG. 21B, the phase of the phase shifter 301B can be highly precisely controlled. On the other hand, as shown in FIG. 21C, in a multilayer mask structure similar to that of FIG. 21B, the shielding film 307 is removed in the phase shifter formation region and the transparent portion formation region and the phase shift film 308 is removed in the transparent portion formation region. Also in this manner, a photomask that can attain the same effects as those of the photomask of FIG. 20B can be realized.

At this point, it will be described that a photomask easily inspectable can be realized when the photomask is fabricated by forming a shielding portion of a metal film on a transparent substrate and forming a phase shifter by trenching the transparent substrate as in this embodiment. The transmittance of a material having a light transmitting property is varied depending upon the wavelength of light. Therefore, in some cases, a mask inspection cannot be carried out without using light of the same wavelength as exposing light. Specifically, in the case where a material with low transmittance against exposing light is inspected by using light of a higher wavelength than the exposing light, for example, the material may have such high transmittance against the wavelength of the light used in the inspection that the shielding property of a mask pattern cannot be inspected. However, as in this embodiment, when a metal film with a sufficient thickness that can substantially completely shield light is used as a shielding portion, the metal film works as a substantially complete shielding film against almost all lights excluding light of a wavelength in the X-ray region. Accordingly, even when the wavelength of the exposing light is different from the wavelength of the light used in the inspection, a photomask like that of this embodiment can be easily inspected.

Modification of Embodiment 3

A photomask according to a modification of Embodiment 3 of the invention will now be described with reference to the accompanying drawing.

Figure 22:
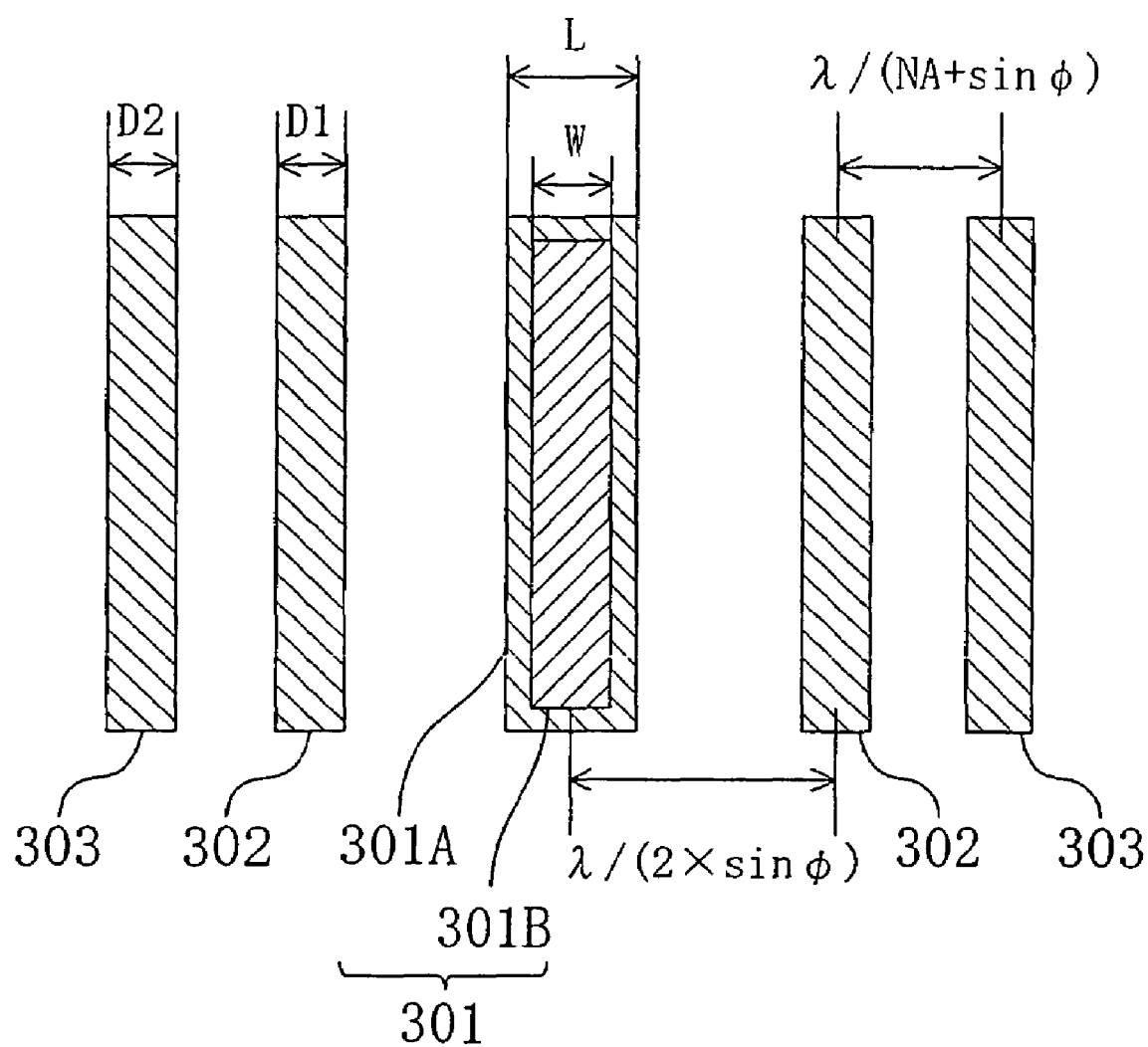
FIG. 22 is a plan view of a photomask according to a modification of Embodiment 3 of the invention.

FIG. 22 is a plan view of a mask pattern of the photomask of this modification. In FIG. 22, like reference numerals are used to refer to like elements used in the photomask of Embodiment 3 shown in FIGS. 20A and 20B so as to omit the description.

As a first characteristic of this modification, an auxiliary pattern 302 (with a width D1) is disposed in a position away from the center of a phase shifter 301B of a main pattern 301 (with a width L) by a distance $\lambda/(2 \times \sin \phi)$.

As a second characteristic of this modification, a second auxiliary pattern 303 (with a width D2) is disposed in a position away from the center of the phase shifter 301B (with a width W) of the main pattern 301 by a distance $\lambda/(2 \times \sin \phi) + \lambda/(NA + \sin \phi)$, namely, in a position away from the center of the auxiliary pattern 302 (hereinafter referred to as the first auxiliary pattern) by a distance $\lambda/(NA + \sin \phi)$ with a transparent portion sandwiched between the first auxiliary pattern 302 and the second auxiliary pattern 303. The second auxiliary pattern 303 is made from a similar shielding portion to that used for the first auxiliary pattern 302.

According to this modification, the effect to improve the DOF derived from the diffraction light attained by Embodiment 3 can be definitely realized.

It is noted, in this modification, that either of the first auxiliary pattern 302 and the second auxiliary pattern 303 may be omitted.

Furthermore, in this modification, even when the distance between the phase shifter 301B and the first auxiliary pattern 302 is approximate to $\lambda/(2 \times \sin \phi)$, the above-described effect can be attained to some extent.

Also, in this modification, even when the distance between the phase shifter 301B and the second auxiliary pattern 303 is approximate to $\lambda/(2 \times \sin \phi) + \lambda/(NA + \sin \phi)$, the aforementioned effect can be attained to some extent.

Herein, these approximate values of the distances of the first auxiliary pattern 302 and the second auxiliary pattern 303 for attaining the effect to some extent correspond to the allowable ranges of the positions of the diffraction light generation patterns described in Modification 1 of Embodiment 1.

Furthermore, in this modification, with respect to the oblique incident angle $\phi$, $\sin \phi$ is preferably not less than $0.40 \times NA$ and not more than $0.80 \times NA$, and more preferably not less than $0.58 \times NA$ and not more than $0.70 \times NA$. In the case where the exposure is performed by using annular illumination, sin φ is preferably not less than 0.60×NA and not more than 0.80×NA. In the case where the exposure is performed by using quadrupole illumination, sin φ is preferably not less than 0.40×NA and not more than 0.60×NA (see Modification 2 of Embodiment 1).

Moreover, in this modification, the width L of the main pattern 301 is preferably larger than the width W of the phase shifter 301B by at least 2×20 nm (in the actual dimension on the mask), and in particular, is preferably not less than twice of a quarter of the exposure wavelength (the wavelength of the exposing light). Specifically, in the mask enhancer structure of the main pattern, the width of a part of the shielding portion sandwiched between the phase shifter and the transparent portion is preferably at least 20 nm (in the actual dimension on the mask), and in particular, is preferably not less than a quarter of the exposure wavelength. However, since this photomask employs the mask enhancer structure, the width of the main pattern is preferably 0.8×λ/NA or less, and therefore, the width of a part of the shielding portion sandwiched between the phase shifter and the transparent portion preferably does not exceed 0.4×π/NA (described in detail in Modification 3 of Embodiment 1).

Also, in this modification, the width D2 of the second auxiliary pattern 303 is preferably larger than the width D1 of the first auxiliary pattern 302. In particular, the width D2 is preferably not less than 1.2 times as large as the width D1 (described in detail in Modification 4 of Embodiment 1).

Embodiment 4

A photomask according to Embodiment 4 of the invention will now be described with reference to the accompanying drawings.

Figure 23A:
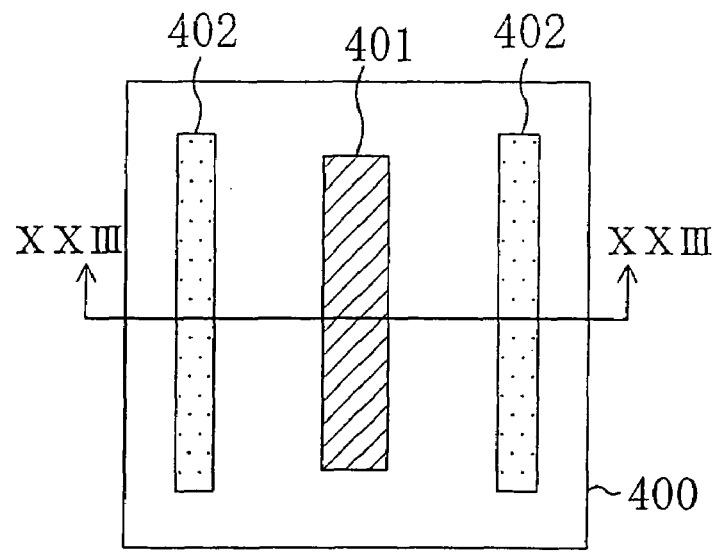
FIG. 23A is a plan view of a photomask according to Embodiment 4 of the invention and FIGS. 23B and 23C are cross-sectional views thereof taken along line XXIII-XXIII of FIG. 23A.
Figure 23B:
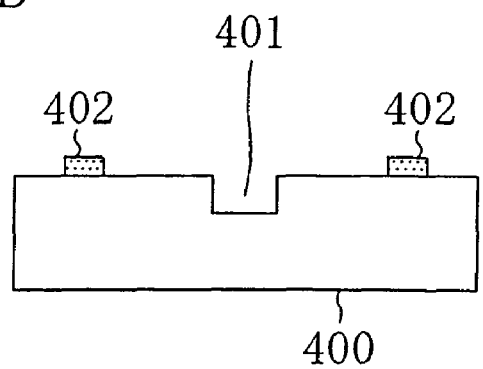

FIG. 23A is a plan view of the photomask of Embodiment 4, and FIG. 23B is a cross-sectional view thereof taken along line XXIII-XXIII of FIG. 23A.

As shown in FIGS. 23A and 23B, a line-shaped main pattern 401 to be transferred through exposure is provided on a transparent substrate 400. The main pattern 401 is made from a phase shifter. The phase shifter is formed by, for example, trenching the transparent substrate 400. A pair of auxiliary patterns 402 that diffract exposing light and are not transferred through the exposure are provided on the transparent substrate 400 on both sides of the main pattern 401 so as to sandwich a transparent portion between the main pattern 401 and the auxiliary pattern 402. The auxiliary pattern 402 is made from a semi-shielding portion for partially transmitting the exposing light.

Specifically, Embodiment 4 is different from Embodiment 1 in employing, instead of the mask enhancer structure, a structure in which the main pattern 401 is composed of the phase shifter alone. In the photomask of FIGS. 23A and 23B, a mask pattern consists of the main pattern 401 and the auxiliary patterns 402. Also, an area on the transparent substrate 400 where the mask pattern is not formed corresponds to a transparent portion (opening).

Furthermore, there is a relationship of the opposite phases between light passing through the phase shifter working as the main pattern 401 and light passing through the transparent portion (specifically, a relationship that a phase difference between these lights is not less than (150+360×n) degrees and not more than (210+360×n) degrees (wherein n is an integer)).

Moreover, there is a relationship of the same phase between light passing through the semi-shielding portion working as the auxiliary pattern 402 and light passing through the transparent portion (specifically, a relationship that a phase difference between these lights is not less than (−30+360×n) degrees and not more than (30+360×n) degrees (wherein n is an integer)).

According to Embodiment 4, since the main pattern 401 is made from the phase shifter, the light passing through the transparent portion can be partially cancelled by the light passing through the phase shifter. Therefore, the contrast in a light intensity distribution of a shielded image corresponding to the main pattern 401 can be emphasized. Also, since the auxiliary patterns 402 having low transmittance are provided separately from the main pattern 401, diffraction light that interferes with the light passing through the phase shifter working as the main pattern 401 can be generated by disposing the auxiliary patterns 402 in appropriate positions. Accordingly, a defocus characteristic of a transferred image of the main pattern 401 can be improved, resulting in improving the DOF characteristic.

Furthermore, according to Embodiment 4, since the auxiliary patterns 402 are made from the semi-shielding portion, the degree of freedom in the arrangement of the auxiliary patterns can be increased. Therefore, the periodicity in the arrangement of the patterns including the main pattern 401 can be increased, so that the DOF characteristic can be further improved. Also, since the auxiliary patterns 402 are made from the semi-shielding portion, these auxiliary patterns can be made thick under restriction that they are not transferred through the exposure, and hence, the auxiliary patterns can be easily processed.

Moreover, according to Embodiment 4, since the phase shifter working as the main pattern 401 is formed by trenching the transparent substrate 400, a very good defocus characteristic can be exhibited in the pattern formation.

In Embodiment 4, since the main pattern 401 is composed of the phase shifter alone, it is impossible to attain the effect attained by the mask enhancer structure used in Embodiments 1 through 3, namely, the peculiar effect to easily realize a desired dimension in the pattern formation while controlling both the contrast and the defocus characteristic by adjusting the dimension of a mask enhancer and the dimension of a phase shifter (opening) provided in the mask enhancer. However, when merely the defocus characteristic is desired to be improved, a mask enhancer may be thus replaced with a simple phase shifter.

Also in Embodiment 4, the transmittance of the auxiliary patterns 402 is preferably not less than 6% and not more than 50%. Thus, the effect to improve the DOF derived from the diffraction light can be definitely realized while preventing an unexposed portion from being formed in a resist due to a too high shielding property of the auxiliary pattern 402.

Figure 23C:
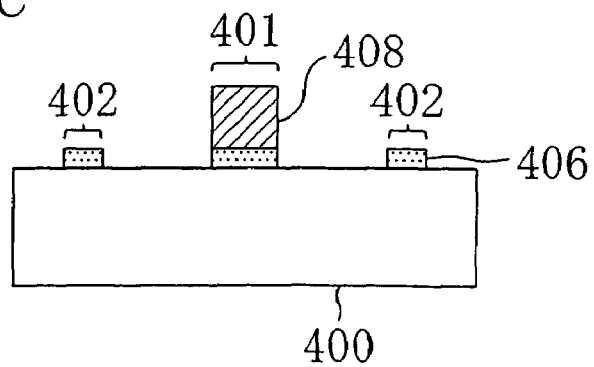

In Embodiment 4, a mask cross-sectional structure shown in FIG. 23C may be employed instead of the mask cross-sectional structure of FIG. 23B. Specifically, as shown in FIG. 23C, in a multilayer structure in which a semi-shielding film 406 and a phase shift film 408 made from a material with high transmittance are successively formed on a transparent substrate 400, the phase shift film 408 is removed in a region other than a phase shifter formation region (namely, a main pattern formation region), and the semi-shielding film 406 is removed in a transparent portion formation region. When the structure shown in FIG. 23C is employed, the transmittance of the phase shifter working as the main pattern 401 can be easily made lower than the transmittance of the semi-shielding portion working as the auxiliary patterns 402. In this case, when the transmittance of the phase shifter is set to 15% or less, not only a fine pattern but also a whole main pattern in an arbitrary dimension can be constructed by using a phase shifter. Therefore, a photomask in which patterns in arbitrary dimensions are mixedly formed as a main pattern can be easily fabricated.

Modification of Embodiment 4

A photomask according to a modification of Embodiment 4 of the invention will now be described with reference to the accompanying drawings.

Figure 24:
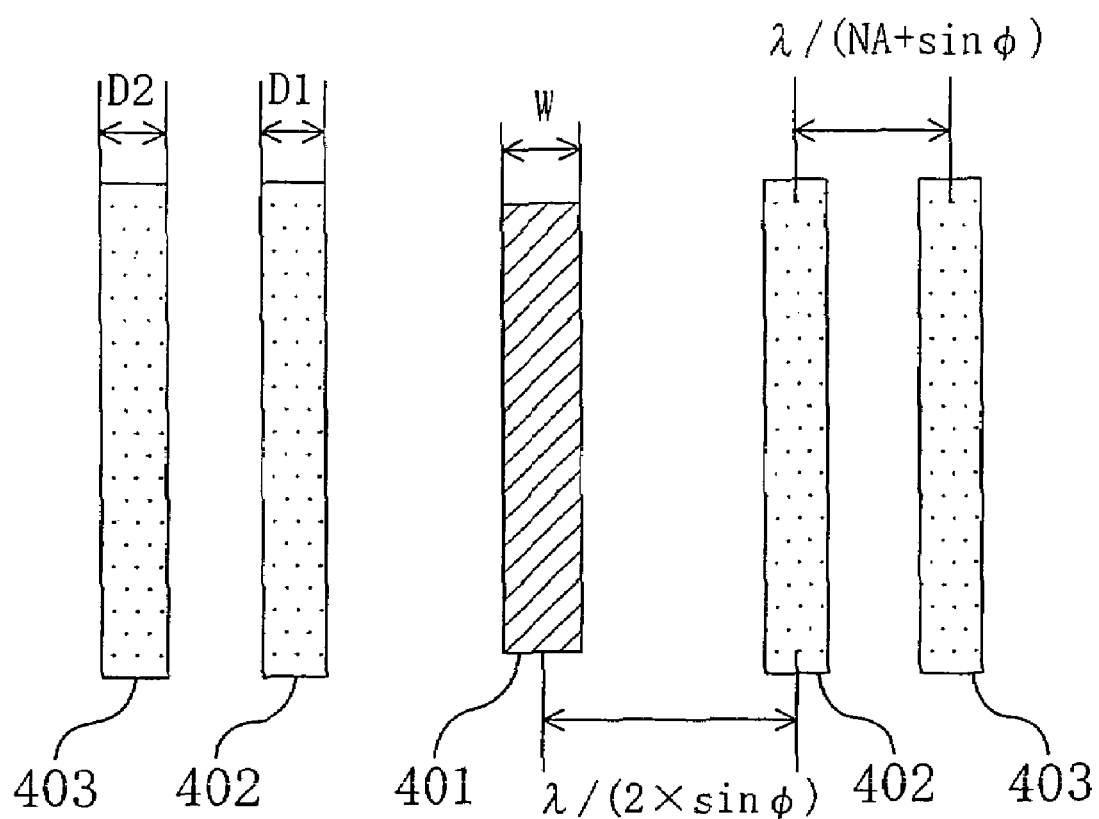
FIG. 24 is a plan view of a photomask according to a modification of Embodiment 4 of the invention.

FIG. 24 is a plan view of a mask pattern of the photomask of the modification of Embodiment 4. In FIG. 24, like reference numerals are used to refer to like elements used in the photomask of Embodiment 4 shown in FIGS. 23A and 23B so as to omit the description.

As a first characteristic of this modification, an auxiliary pattern 402 (with a width D1) is disposed in a position away from the center of a main pattern 401 (with a width W) namely, the center of a phase shifter, by a distance $\lambda/(2 \times \sin \phi)$.

As a second characteristic of this modification, a second auxiliary pattern 403 (with a width D2) that diffracts exposing light and is not transferred through exposure is disposed in a position away from the center of the phase shifter working as the main pattern 401 by a distance $\lambda/(2 \times \sin \phi) + \lambda/(NA + \sin \phi)$, namely, in a position away from the center of the auxiliary pattern 402 (hereinafter referred to as the first auxiliary pattern) by a distance $\lambda/(NA + \sin \phi)$, with a transparent portion sandwiched between the first auxiliary pattern 402 and the second auxiliary pattern 403. The second auxiliary pattern 403 is made from a similar shielding portion to that used for the first auxiliary pattern 402.

According to this modification, the effect to improve the DOF derived from the diffraction light attained by Embodiment 4 can be definitely realized.

It is noted, in this modification, that either of the first auxiliary pattern 402 and the second auxiliary pattern 403 may be omitted.

Furthermore, in this modification, even when the distance between the phase shifter working as the main pattern 401 and the first auxiliary pattern 402 is approximate to $\lambda/(2 \times \sin \phi)$, the above-described effect can be attained to some extent.

Also, in this modification, even when the distance between the phase shifter working as the main pattern 401 and the second auxiliary pattern 403 is approximate to $\lambda/(2 \times \sin \phi) + \lambda/(NA + \sin \phi)$, the aforementioned effect can be attained to some extent.

Herein, these approximate values of the distances of the first auxiliary pattern 402 and the second auxiliary pattern 403 for attaining the effect to some extent correspond to the allowable ranges of the positions of the diffraction light generation patterns described in Modification 1 of Embodiment 1.

Furthermore, in this modification, with respect to the oblique incident angle $\phi$, $\sin \phi$ is preferably not less than 0.40×NA and not more than 0.80×NA, and more preferably not less than 0.58×NA and not more than 0.70×NA. In the case where the exposure is performed by using annular illumination, $\sin \phi$ is preferably not less than 0.60×NA and not more than 0.80×NA. In the case where the exposure is performed by using quadrupole illumination, $\sin \phi$ is preferably not less than 0.40×NA and not more than 0.60×NA (see Modification 2 of Embodiment 1).

Also, in this modification, the width D2 of the second auxiliary pattern 403 is preferably larger than the width D1 of the first auxiliary pattern 402. In particular, the width D2 is preferably not less than 1.2 times as large as the width D1 (described in detail in Modification 4 of Embodiment 1).

Furthermore, although the semi-shielding portion is used for forming the auxiliary patterns 402 and 403 in this modification, a shielding portion may be used instead. In this case, as compared with the case where the semi-shielding portion is used for forming the auxiliary patterns, the contrast between the main pattern and the auxiliary patterns is lowered, but needless to say, a photomask that can realize a large DOF can be obtained by disposing the auxiliary patterns in the positions described in this modification.

Moreover, in the case where a simplified mask structure described below is used instead of the mask structure of this modification, although the effects to improve the contrast and the DOF in the pattern formation are reduced as compared with those attained by this modification, these effects can be improved as compared with those attained by the conventional technique.

Figure 25A:
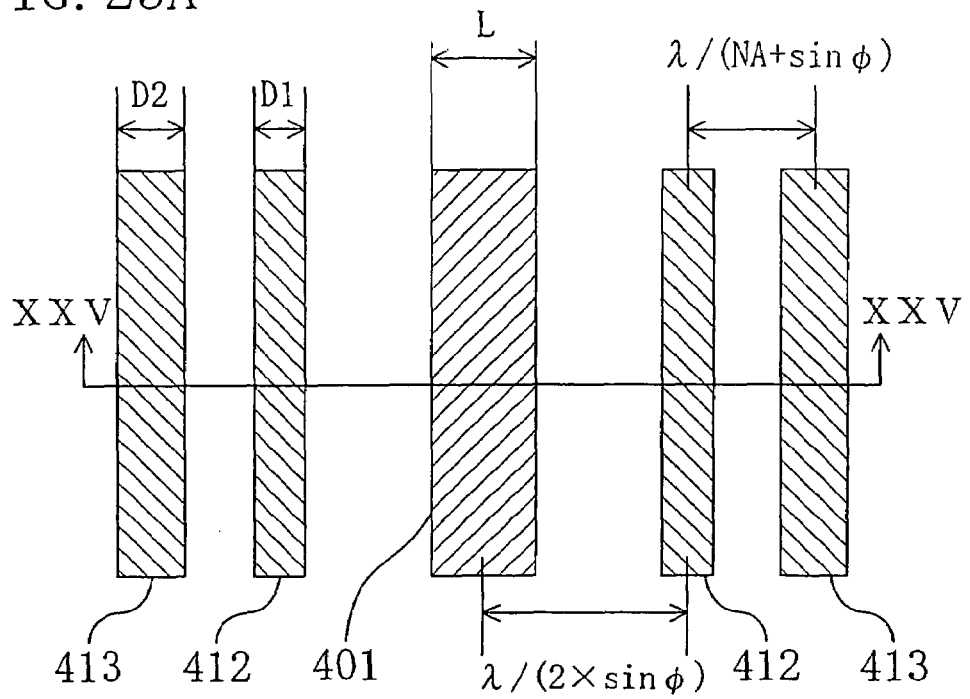
FIG. 25A is a plan view of an example of a simplified photomask according to the modification of Embodiment 4 and FIGS. 25B and 25C are cross-sectional views thereof taken along line XXV-XXV of FIG. 25A.

Specifically, when auxiliary patterns 412 and 413 made from a shielding portion as shown in FIG. 25A are used instead of the auxiliary patterns 402 and 403 made from the semi-shielding portion of this modification (see FIG. 24), the degree of freedom in the arrangement of the auxiliary patterns is lowered because the shielding property of the auxiliary patterns is increased. However, also in the mask structure shown in FIG. 25A, since the main pattern 401 is made from a phase shifter, the effect to improve the DOF can be attained by disposing the auxiliary patterns 412 and 413 in the positions similar to those of the auxiliary patterns 402 and 403 of this modification. Also, since the semi-shielding portion is replaced with the shielding portion, although the performance in the pattern formation is lowered, a mask inspection can be definitely carried out (see Embodiment 3).

Figure 25B:
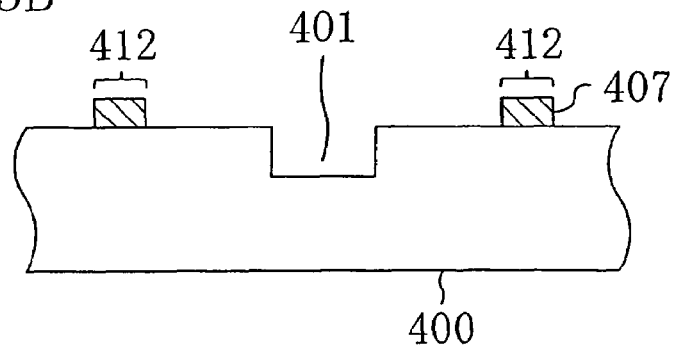
Figure 25C:
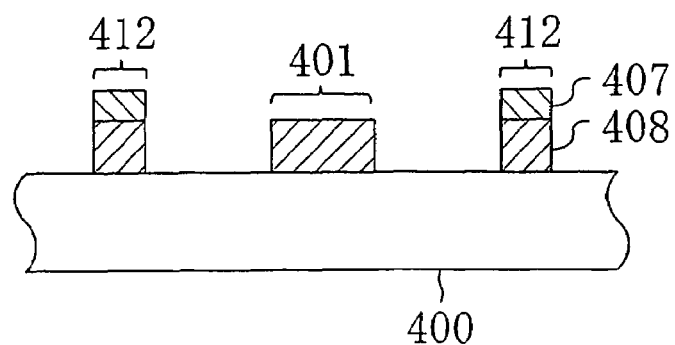

FIGS. 25B and 25C are cross-sectional views for showing variations of the cross-sectional structure taken along line XXV-XXV of FIG. 25A.

In the structure of FIG. 25B, a phase shifter working as a main pattern 401 is formed by trenching a transparent substrate 400. Also, each auxiliary pattern (with the second auxiliary pattern 413 omitted in the drawing) is made from a shielding film 407 formed on the transparent substrate 400. In the structure of FIG. 25B, the phase shifter can attain sufficiently high transmittance, so that the effect to improve the DOF can be sufficiently attained.

In the structure of FIG. 25C, in a multilayer structure in which a phase shift film 408 and a shielding film 407 are successively formed on a transparent substrate 400, the shielding film 407 is removed in a region other than an auxiliary pattern formation region and the phase shift film 408 is removed in a transparent portion formation region. Specifically, the main pattern 401 is composed of a single-layer structure of the phase shift film 408, and each auxiliary pattern 412 or 413 (with the second auxiliary pattern 413 omitted in the drawing) is composed of a multilayer structure including the phase shift film 408 and the shielding film 407. In the structure of FIG. 25C, when the transmittance of the phase shifter is set to 15% or less, not only a fine pattern but also a large pattern can be constructed by using a phase shifter. Therefore, a photomask in which patterns in arbitrary dimensions ranging from a fine pattern to a large pattern are mixedly disposed as a main pattern can be easily fabricated.

Figure 26:
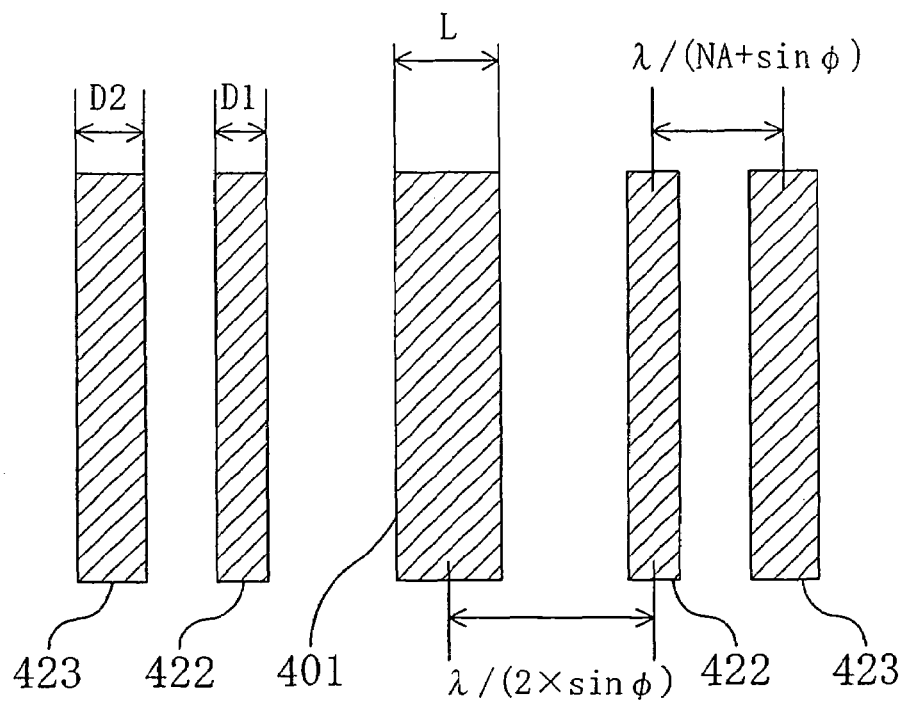
FIG. 26 is a plan view of another example of the simplified photomask according to the modification of Embodiment 4 of the invention.

In the case where auxiliary patterns 422 and 423 each made from a phase shifter as shown in FIG. 26 are used instead of the auxiliary patterns 402 and 403 made from the semi-shielding portion of this modification (see FIG. 24), although the effect to make the shielding property of the auxiliary patterns lower than that of the main pattern is reduced, the effect to improve the DOF can be sufficiently attained. The structure shown in FIG. 26 can be realized merely by patterning a phase shift film formed on a transparent substrate, and therefore, the photomask processing can be eased.

Figure 27:
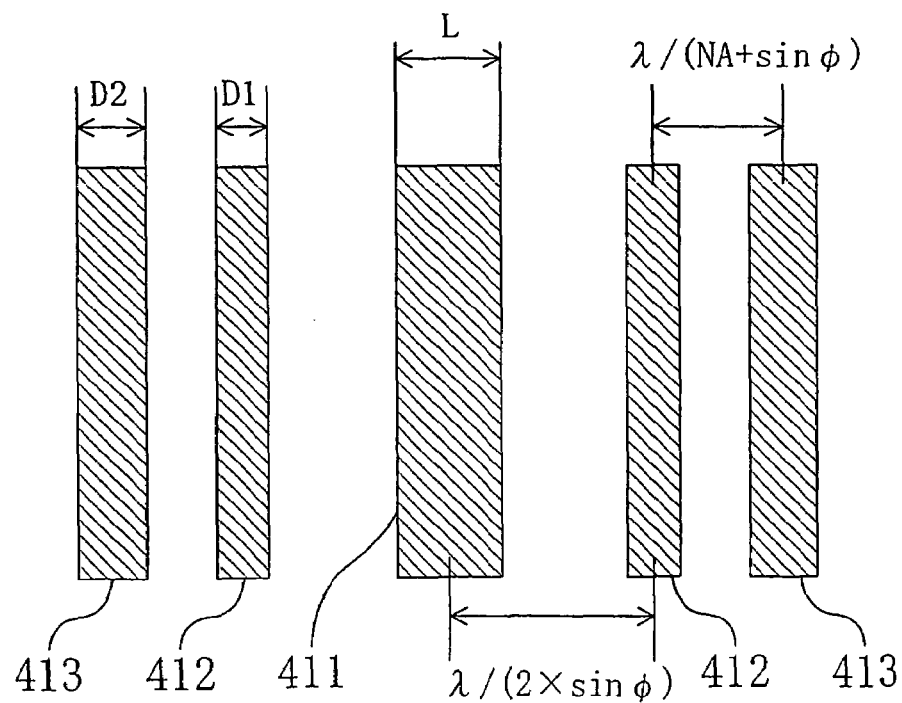
FIG. 27 is a plan view of another example of the simplified photomask according to the modification of Embodiment 4 of the invention.

Alternatively, a main pattern 411 made from a shielding portion and auxiliary patterns 412 and 413 made from a shielding portion as shown in FIG. 27 may be used instead of the main pattern 401 made from the phase shifter and the auxiliary patterns 402 and 403 made from the semi-shielding portion of this modification (see FIG. 24). In this case, although the effect to emphasize the shielding property and the effect to improve the DOF owing to the main pattern 411 are reduced as compared with those attained in this modification, the effect to improve the DOF can be attained to some extent. Since the mask pattern is made from the shielding portion alone in the mask structure of FIG. 27, the photomask processing, the inspection and the like can be much eased.

Embodiment 5

A pattern formation method according to Embodiment 5 of the invention, and more specifically, a pattern formation method using a photomask according to any of Embodiments 1 through 4 (hereinafter referred to as the present photomask), will be described with reference to the accompanying drawings.

FIGS. 28A through 28D are cross-sectional views for showing procedures in the pattern formation method of Embodiment 5.

Figure 28A:
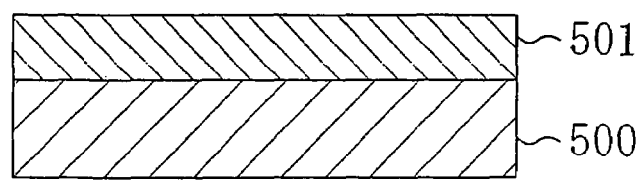
FIGS. 28A, 28B, 28C and 28D are cross-sectional views for showing procedures in a pattern formation method according to Embodiment 5 of the invention.
Figure 28B:
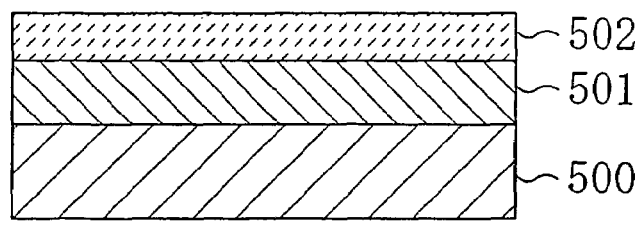

First, as shown in FIG. 28A, a target film 501 of, for example, a metal film or an insulating film is formed on a substrate 500. Thereafter, as shown in FIG. 28B, a positive resist film 502 is formed on the target film 501.

Figure 28C:
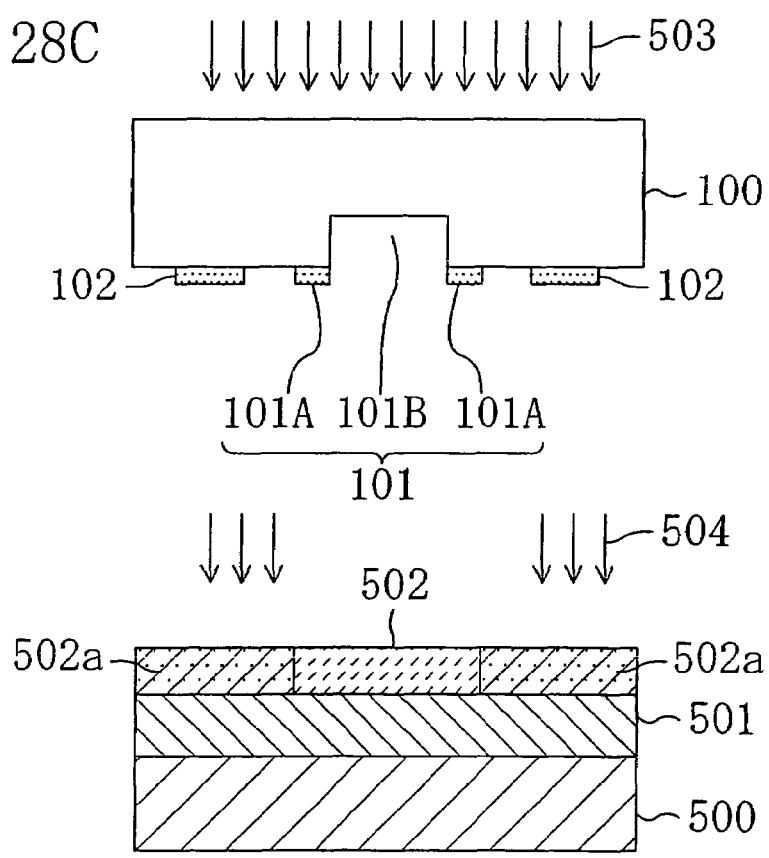

Next, as shown in FIG. 28C, the present photomask, such as the photomask according to Embodiment 1 shown in FIG. 1B, is irradiated with exposing light 503, so as to expose the resist film 502 to transmitted light 504 having passed through the photomask.

On a transparent substrate 100 of the photomask used in the procedure shown in FIG. 28C, a line-shaped main pattern 101 to be transferred through the exposure is provided. The main pattern 101 is composed of a first semi-shielding portion 101A having first transmittance for partially transmitting the exposing light and a phase shifter 101B. The first semi-shielding portion 101A is formed so as to surround the phase shifter 101B in a line shape. The phase shifter 101B is formed by, for example, trenching the transparent substrate 100. A pair of auxiliary patterns 102 that diffract the exposing light and are not transferred through the exposure are provided on the transparent substrate 100 on the both sides of the main pattern 101 so as to sandwich a transparent portion between the main pattern 101 and the auxiliary pattern 102. The auxiliary pattern 102 is made from a second semi-shielding portion having second transmittance for partially transmitting the exposing light.

In the exposure performed in FIG. 28C, the resist film 502 is subjected to the exposure by using an oblique incident exposure light source. In this case, since the semi-shielding portion having low transmittance is used in the mask pattern, the entire resist film 502 is exposed at weak energy. However, as shown in FIG. 28C, it is only a latent image portion 502a of the resist film 502 corresponding to a region other than the main pattern 101 that is irradiated at exposing energy sufficiently high for allowing the resist to dissolve in development.

Figure 28D:
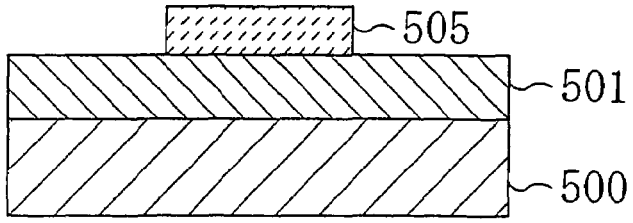

Next, as shown in FIG. 28D, the resist film 502 is developed so as to remove the latent image portion 502a. Thus, a resist pattern 505 corresponding to the main pattern 101 is formed.

According to Embodiment 5, since the pattern formation method is carried out by using the present photomask (specifically, the photomask according to Embodiment 1), the same effects as those described in Embodiment 1 can be attained. Specifically, the substrate (wafer) on which the resist is applied is subjected to the oblique incident exposure through the present photomask. At this point, since the mask enhancer (the main pattern 101) having the phase shifter (the opening) has a very strong shielding property, merely a portion of the resist corresponding to a region other than the mask enhancer can be irradiated at the exposing energy sufficiently high for allowing the resist to dissolve in the development. Also, since the latent image formed by using the mask enhancer has very high contrast and a good defocus characteristic, a fine pattern with a large DOF can be formed.

Although the photomask according to Embodiment 1 is used in Embodiment 5, in the case where a photomask according to any of Embodiments 2 through 4 is used instead, the same effects as those described in the corresponding embodiment can be attained.

Although the positive resist process is employed in Embodiment 5, the same effects can be attained by employing the negative resist process instead.

In Embodiment 5, oblique incident illumination (oblique incident exposure) is preferably used in the procedure shown in FIG. 28C for irradiating the resist film with the exposing light 503. Thus, in a light intensity distribution of the light having passed through the present photomask, contrast between a region corresponding to the main pattern and a region corresponding to the transparent portion can be improved. Also, the focus characteristic of the light intensity distribution can be improved. Accordingly, the exposure margin and the focus margin are improved in the pattern formation. In other words, a fine pattern can be formed with a good defocus characteristic.

Next, a method for calculating the oblique incident angle that plays a significant role in the oblique incident exposure using the present photomask having the auxiliary patterns (the diffraction light generation patterns) will be described.

In the case where a point light source is used as the gracing incidence exposure light source, the oblique incident angle is definitely defined (see FIG. 5). In the case where a general light source with an area is used, however, there are a plurality of oblique incident angles.

FIGS. 29A through 29E are diagrams for showing principle calculation methods for the oblique incident angle that are defined by the present inventor for calculating the optimum position of a diffraction light generation pattern also in using a light source with an area.

Figure 29A:
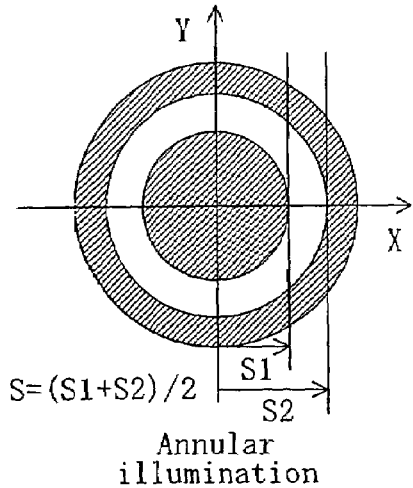
FIGS. 29A, 29B, 29C, 29D and 29E are diagrams for showing principal methods for calculating an oblique incident angle defined by the present inventor for calculating appropriate positions of diffraction light generation patterns also in using a light source having an area.
Figure 29B:
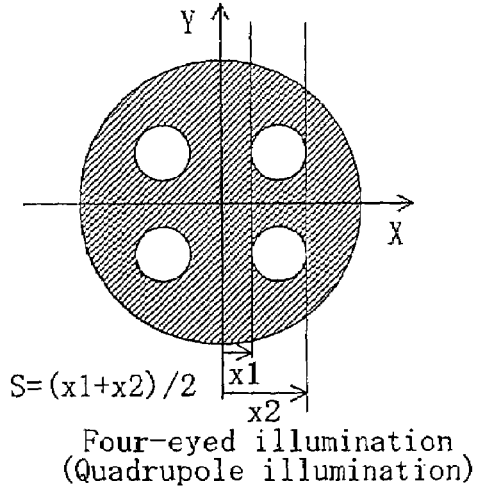
Figure 29C:
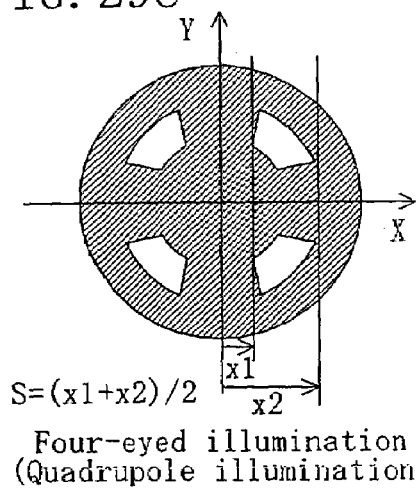
Figure 29D:
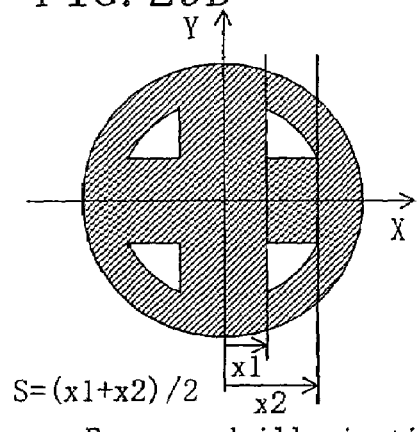
Figure 29E:
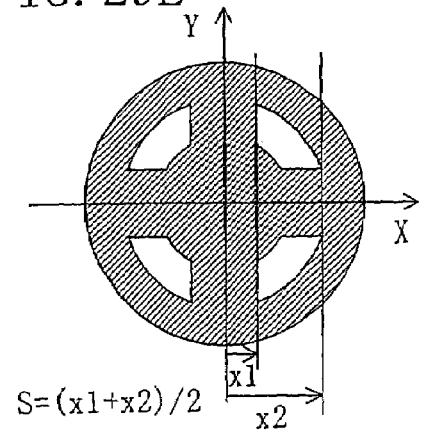

FIG. 29A shows a calculation method for the oblique incident angle in using annular illumination. As shown in FIG. 29A, in the annular illumination, the inner diameter S1 of the annular light source corresponds to a minimum oblique incident angle $\phi 1$, and the outer diameter S2 of the annular light source corresponds to a maximum oblique incident angle $\phi 2$. Accordingly, the oblique incident angle $\phi$ used for calculating the position of a diffraction light generation pattern is defined on the basis of a light source emitting light from a position S ($=(S1+S2)/2$) calculated by using the inner diameter S1 and the outer diameter S2. Specifically, the oblique incident angle $\phi$ is obtained as $(\phi 1+\phi 2)/2$. Also, when the diameters S1 and S2 have values standardized by the numerical aperture NA, the oblique incident angle $\phi$ in the photomask according to any of Embodiments 1 through 4 can be set on the basis of $\sin \phi = S \times NA = (S1+S2) \times NA/2$. However, in the pattern formation method using the annular illumination, lighting and a photomask are preferably adjusted so that the oblique incident position S can be not less than 0.6 and not more than 0.8, and more preferably adjusted so that the oblique incident position S can be approximate to 0.7 (see Modification 2 of Embodiment 1).

It goes without saying that the oblique incident angle $\phi$ can be set to an arbitrary value not smaller than $\phi1$ and not larger than $\phi2$. In other words, it goes without saying that the oblique incident angle $\phi$ can be set to an arbitrary value satisfying a relationship, $S1 \times NA \leqq \sin \phi \leqq S2 \times NA$.

As described in Embodiment 1, in the case where the oblique incident angle $\phi$ satisfies $\sin \phi < NA/3$ in the oblique incident exposure, the effect to improve the defocus characteristic cannot be attained. Therefore, also in using a light source with an area, the oblique incident angles $\phi$ preferably includes merely values for attaining a sufficient effect to improve the defocus characteristic. Also, when a light source used in the exposure emits light having an oblique incident angle $\phi$ satisfying $\sin \phi < NA/3$, the exposure is preferably performed by using a mask in which the diffraction light generation pattern is optimally provided by ignoring this light entering at the unpreferable angle. Thus, as compared with the case where the diffraction light generation pattern is provided in consideration of the light entering at the unpreferable angle, a better defocus characteristic can be exhibited in the pattern formation. Accordingly, the minimum angle $\xi$ of the oblique incident angle $\phi$ is a value defined as $\sin \xi = 0.4 \times NA$. Specifically, the oblique incident angle $\phi$ used in calculating the position of a diffraction light generation pattern is $(\xi + \phi2)/2$. In other words, the oblique incident angle $\phi$ is defined as $\sin \phi = (0.4 + S2) \times NA/2$.

FIGS. 29B through 29E respectively show the calculation methods for the oblique incident angle in using the quadrupole lighting. In using the quadrupole lighting, as shown in each of these drawings, the oblique incident angle is calculated by using the XY coordinate system having the center of the quadrupole light source (four-eyed light source) (hereinafter referred to as the light source center) as the origin. Specifically, in using the quadrupole lighting, the oblique incident angle is optimized with respect to each pattern parallel to the X axis or the Y axis of the XY coordinate system. In other words, the oblique incident angle is not defined on the basis of the distance from the light source center to each light source but is defined by using a coordinate value of each light source on the X axis or the Y axis. Now, the optimization of the oblique incident angle with respect to a pattern parallel to the Y axis will be described, and the following description is similarly applicable to the optimization of the oblique incident angle with respect to a pattern parallel to the X axis. First, the minimum oblique incident angle is defined by a value that is the closest to the origin among absolute values of the X coordinate values of the respective light sources of the quadrupole light source. Specifically, the minimum oblique incident angle is defined by a value x1 shown in each of FIGS. 29B through 29E. Similarly, the maximum oblique incident angle is defined by a value that is farthest from the origin among the absolute values of the X coordinate values of the respective light sources of the quadrupole light source, namely, a value x2 shown in each of FIGS. 29B through 29E. Accordingly, in using the quadrupole lighting, the oblique incident angle $\phi$ used for calculating the position of a diffraction light generation pattern is set in accordance with $\sin \phi = S \times NA = (x1+x2) \times NA/2$. However, in the pattern formation using the quadrupole lighting, lighting and a photomask are preferably adjusted so that the oblique incident position S can be not less than 0.4 and not more than 0.6, and more preferably adjusted so that the oblique incident position S can be approximate to 0.5 (see Modification 2 of Embodiment 1).

It goes without saying that the oblique incident angle $\phi$ can be set to an arbitrary value satisfying a relationship, $x1 \times NA \leqq \sin \phi \leqq x2 \times NA$.

Also in using the quadrupole lighting shown in any of FIGS. 29B through 29E, similarly to the annular illumination shown in FIG. 29A, the minimum angle $\xi$ of the oblique incident angle $\phi$ preferably has a value defined as $\sin \phi = 0.4 \times NA$. Specifically, the oblique incident angle $\phi$ used in calculating the position of a diffraction light generation pattern is defined as $\sin \phi = (0.4 + x2) \times NA/2$.

Embodiment 6

A mask data creation method according to Embodiment 6 of the invention, more specifically, a mask data creation method for a photomask according to any of Embodiments 1 through 4 (hereinafter referred to as the present photomask) using the center line enhancement method, the outline enhancement method and a diffraction light generation pattern, will be described with reference to the accompanying drawings. In this embodiment, the functions, the properties and the like of the respective elements of the photomask are the same as those of the corresponding elements of the present photomask described above unless otherwise mentioned.

Before describing specific processing, a significant point of the mask data creation method for the present photomask will be explained. In the present photomask, formation of even one isolated pattern is concerned with a phase shifter, a shielding or semi-shielding portion surrounding the phase shifter and a diffraction light generation pattern (an auxiliary pattern) disposed around them. Therefore, in order to set a pattern dimension employed in the pattern formation, namely, a CD (critical dimension), to a desired value, it is necessary to determine a plurality of element values such as the width of the phase shifter, the width of the shielding or semi-shielding portion and the position and the width of the diffraction light generation pattern. Also, occasionally, the number of combinations of these element values for realizing a desired CD is not one but plural. Therefore, in the mask data creation method of this embodiment, values of significant elements for attaining a maximum margin in the pattern formation are priorly determined, and values of elements less affecting the margin in the pattern formation are subsequently controlled to adjust the pattern dimension.

Specifically, as elements largely affecting the margin in the pattern formation, preferably, the position and the width of the phase shifter are first determined, the position and the width of the auxiliary pattern are determined secondly, and the width of a part of the shielding or semi-shielding portion surrounding the phase shifter, namely, the width of a part sandwiched between the phase shifter and a transparent portion, is ultimately controlled, so as to create mask data for realizing a desired CD. Now, the specific processing will be described.

Figure 30:
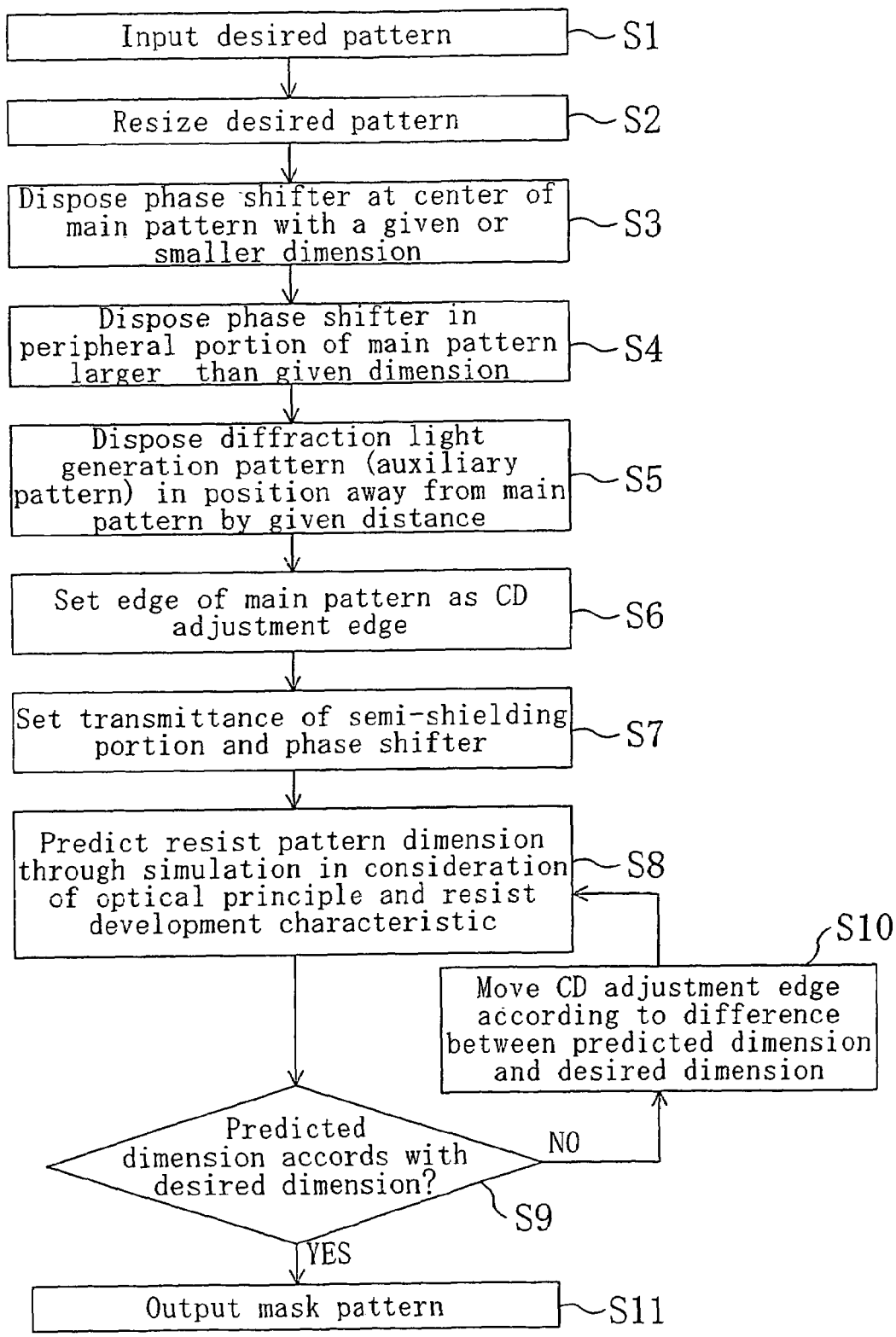
FIG. 30 is a flowchart of a mask data creation method according to Embodiment 6 of the invention.

FIG. 30 is a flowchart of the mask data creation method of Embodiment 6, more specifically, a method for forming a mask pattern for an LSI working as a shielding pattern on a mask on the basis of a desired fine pattern. FIGS. 31A through 31G are diagrams for showing exemplified specific mask patterns formed in respective procedures in the mask data creation method of Embodiment 6.

Figure 31A:
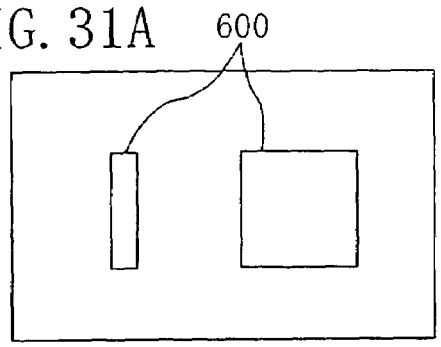
FIGS. 31A, 31B, 31C, 31D, 31E, 31F and 31G are diagrams of specific examples of mask patterns formed in the respective procedures of the mask data creation method of Embodiment 6.

FIG. 31A shows a desired pattern to be formed by using a mask pattern. Specifically, the pattern 600 shown in FIG. 31A corresponds to a region where a resist is not desired to be sensitized in exposure using the present photomask. In the description of the pattern formation in this embodiment, the positive resist process is employed unless otherwise mentioned. In other words, the description is given under assumption that an exposed portion of a resist is removed and an unexposed portion of the resist remains as a resist pattern. Accordingly, in the case where the negative resist process is employed, the description can be similarly applied by assuming that an exposed portion of a resist remains as a resist pattern and an unexposed portion is removed.

First, in step S1, the desired pattern 600 shown in FIG. 31A is input to a computer used for the mask data creation.

Figure 31B:
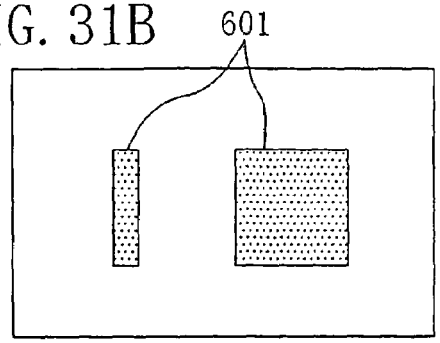

Next, in step S2, the desired pattern of FIG. 31A is resized by enlarging or reducing it depending upon whether over-exposure or under-exposure is employed in the exposure of a photomask to be created in this embodiment. Alternatively, the desired pattern may be resized in order to intentionally adjust the dimension in accordance with dimensional change caused in various procedures during the pattern formation. The resized pattern is defined as a main pattern 601 made from a semi-shielding portion as shown in FIG. 31B.

Figure 31C:
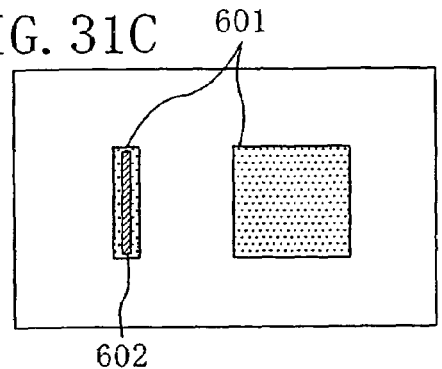

Then, in step S3, as shown in FIG. 31C, the shape (such as the width; which also applies in the following description) of a phase shifter 602 to be disposed at the center of a part of the main pattern 601 with a predetermined or smaller dimension is determined. At this point, the phase shifter 602 should be completely contained within the main pattern 601, namely, the semi-shielding pattern. In other words, the outermost edge of the main pattern 601 corresponds to the edge of the semi-shielding pattern.

The width of the phase shifter to be determined at this point is preferably adjusted as follows: Specifically, the width of the phase shifter is previously adjusted at this point so that the width of a part of the semi-shielding portion surrounding the phase shifter sandwiched between the phase shifter and a transparent portion can be prevented from being smaller than a predetermined width after being changed for CD adjustment subsequently performed. This predetermined width is preferably not less than 20 nm in the actual dimension on the mask or not less than ¼ of the exposure wavelength. Therefore, the width of the phase shifter is determined so that a dimension larger than the predetermined width can be secured, at this point, as the width of the part sandwiched between the phase shifter and the transparent portion and that a CD predicted under this condition cannot be larger than a desired value. Specifically, with the width of the phase shifter for realizing the desired CD under the aforementioned condition defined as the maximum phase shifter width, the phase shifter is disposed to have a width smaller than the maximum phase shifter width for optimizing the contrast and the DOF of the patterns. Thus, there is no need to adjust the pattern dimension by changing the width of the phase shifter afterward. It is noted that the description has been given so far under assumption that the main pattern has the mask enhancer structure, and the aforementioned processing may be omitted in creating mask data in which the main pattern is made from a phase shifter alone.

Figure 31D:
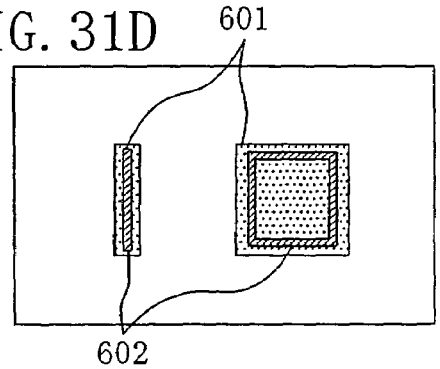

Next, in step S4, as shown in FIG. 31D, the shape of a phase shifter 602 to be disposed in a peripheral portion of a part of the main pattern 601 with a dimension larger than the predetermined dimension is determined. At this point, the phase shifter 602 should be completely contained within the main pattern 601, namely, the semi-shielding pattern, so that the outermost edge of the main pattern 601 can correspond to the edge of the semi-shielding pattern.

Figure 31E:
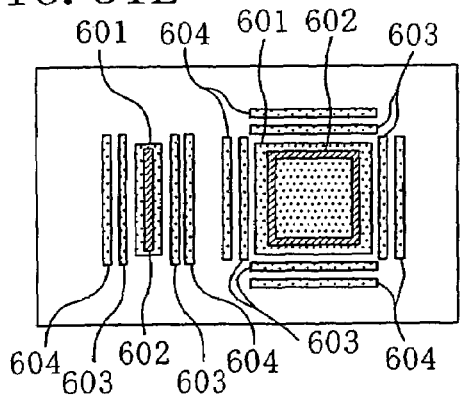

Then, in step S5, as shown in FIG. 31E, first-order diffraction light generation patterns 603 and second-order diffraction light generation patterns 604 made from a semi-shielding portion are disposed, as auxiliary patterns for diffracting the exposing light, in positions away from the phase shifters 602 disposed in step S3 and step S4 respectively by predetermined distances (that are determined on the basis of the oblique incident angle and the like of illumination of a light source used in the exposure). For example, in the case where the phase shifter 602 is in a line shape, a line-shaped diffraction light generation pattern is disposed in a position away from the phase shifter 602 by a predetermined distance to be parallel to the phase shifter 602. In the case where there is another pattern in a position where the diffraction light generation pattern is to be disposed, the diffraction light generation pattern is not disposed in such a region where another pattern is present.

Through the aforementioned processing, the position and the width of the phase shifter and the position and the width of the diffraction light generation pattern, which largely affect the margin in the pattern formation, have been determined to have optimum values.

Figure 31F:
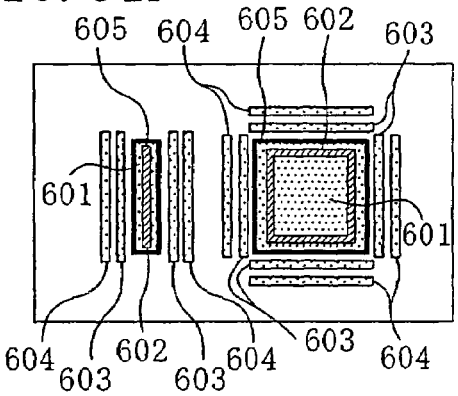

Next, in step S6, preparation is made for processing for adjusting the dimension of the mask pattern for forming a pattern with a desired dimension correspondingly to the mask pattern through the exposure using the present photomask. Specifically, preparation is made for processing generally designated as OPC (optical proximity correction). In this embodiment, a mask pattern region that is to be adjusted in the dimension on the basis of prediction of the dimension in the pattern formation, namely, the predicted CD, is limited to the edge of the main pattern 601, namely, the edge of the semi-shielding pattern. Specifically, as shown in FIG. 31F, the outermost edge of the main pattern 601 is set as a CD adjustment edge 605. In other words, the CD, that is, the dimension of the pattern to be formed, is adjusted by using the outermost edge of the semi-shielding portion used for forming the main pattern. Thus, with respect to the main pattern in which the phase shifter is provided, the CD can be adjusted in accordance with the width of the part of the semi-shielding portion sandwiched between the phase shifter and the transparent portion. Accordingly, without changing the shapes of the phase shifters 602 and the diffraction light generation patterns 603 and 604 disposed in the optimum positions against the phase shifters 602, a mask pattern for realizing a desired CD can be formed.

Next, in step S7, the transmittances of the semi-shielding portion and the phase shifter used in the mask pattern are set.

Then, in step S8, step S9 and step S10, the OPC processing (for example, model base OPC processing) is performed. Specifically, in step S8, a dimension of a resist pattern formed by using the main pattern 601 including the phase shifters 602 and the diffraction light generation patterns 603 and 604 is predicted through simulation in consideration of the optical principle and a resist development characteristic. At this point, in the simulation, not only lithography processing but also other processing accompanied with the pattern formation such as dry etching may be considered. Subsequently, in step S9, it is determined whether or not the predicted dimension of the resist pattern accords with the desired dimension. When the predicted dimension does not accord with the desired dimension, in step S10, the CD adjustment edge 605 is moved on the basis of a difference between the predicted dimension and the desired dimension, so as to change the shape of the main pattern 601.

Figure 31G:
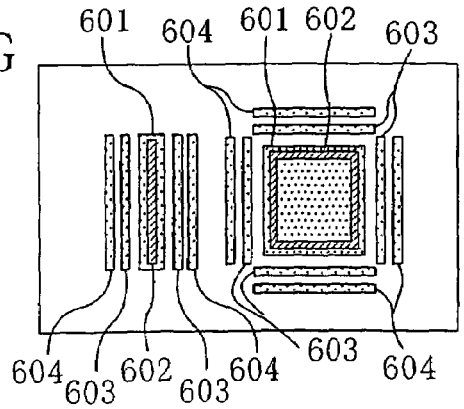

As a characteristic of this embodiment, the CD adjustment edge 605 set in step S6 alone is changed for realizing a mask pattern capable of forming a resist pattern with a desired dimension. Specifically, by repeating the procedures of steps S8 through S10 until the predicted dimension of the resist pattern accords with the desired pattern, a mask pattern capable of forming a resist pattern with the desired dimension is ultimately output in step S11. FIG. 31G shows an example of the mask pattern output in step S11.

Originally, it is a very large number of parameters of the present photomask, such as the width of the phase shifter, the width of the mask pattern (main pattern) and the position and the width of the auxiliary pattern, that affect the dimension of a pattern (resist pattern).

In contrast, in Embodiment 6, the significant parameters, that is, the widths of the phase shifters 602 and the positions of the diffraction light generation patterns 603 and 604, are first determined in order to realize a mask good at the significant pattern formation characteristic such as the contrast and the defocus characteristic. Thereafter, the pattern dimension is controlled by moving merely the outermost edge of the main pattern 601 that is set as the CD adjustment edge 605. Thus, a mask pattern with good pattern formation characteristics can be realized.

Accordingly, when a photomask is formed on the basis of the mask data created by the method of this embodiment and the oblique incident exposure is performed by using the photomask, high contrast and a very good DOF characteristic can be attained in forming a fine pattern or a fine space.

Also, according to Embodiment 6, since the phase shifter 602 is disposed at the center of the part of the main pattern 601 with the predetermined or smaller dimension, a mask pattern capable of forming a finer desired pattern and having good pattern formation characteristics can be realized.

Furthermore, according to Embodiment 6, the phase shifter 602 is disposed in the peripheral portion of the main pattern 601, a mask pattern capable of forming a desired pattern in an arbitrary shape and having good pattern formation characteristics can be realized.

Figure 32:
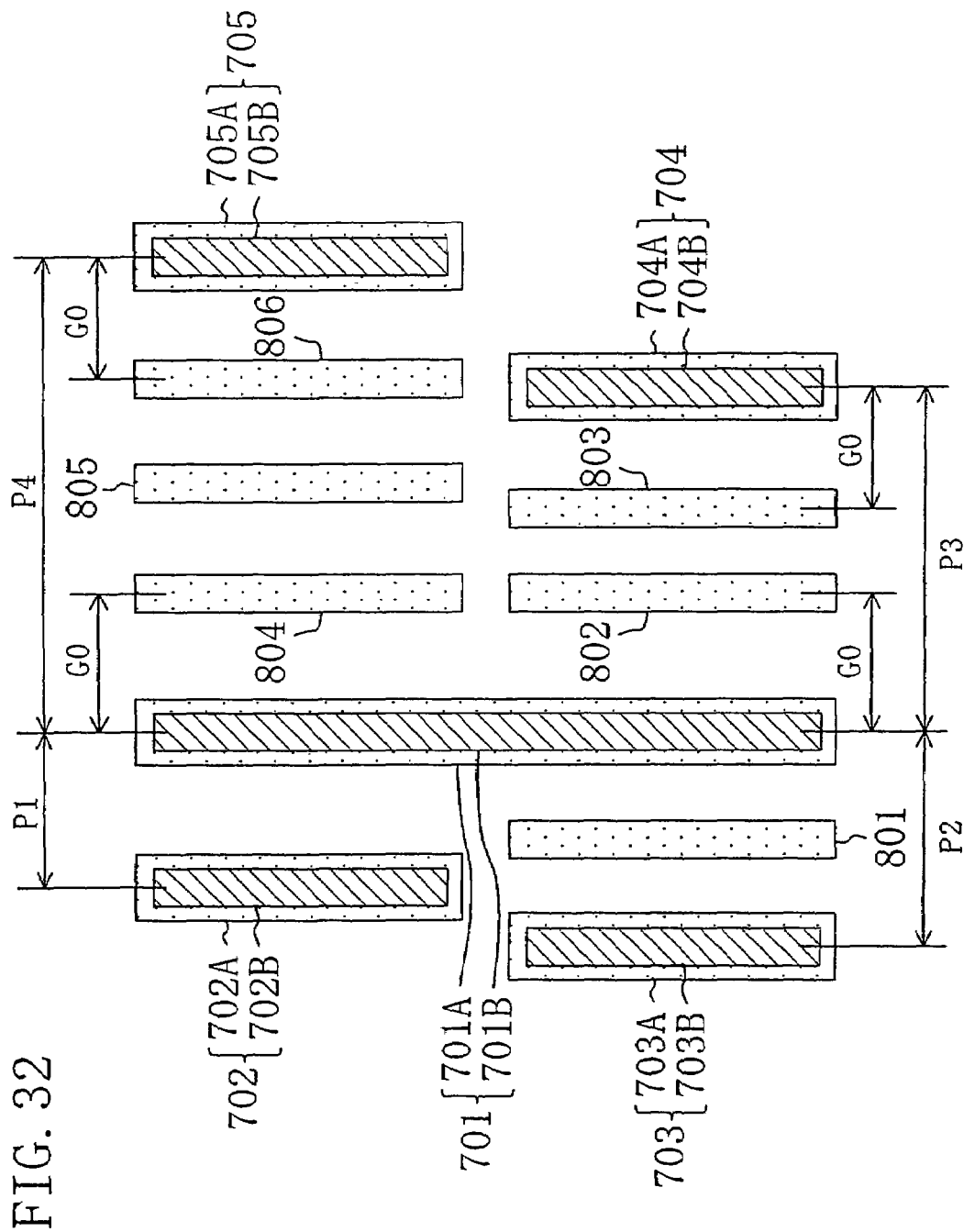
FIG. 32 is a diagram of a detailed example of a diffraction light generation pattern formed by the mask data creation method of Embodiment 6.

The mask data creation method has been described so far under assumption that a diffraction light generation pattern can be disposed in a position for generating optimum diffraction light. Next, a mask data creation method (particularly, the processing in step S5) employed in the case where another main pattern is disposed in the vicinity of a main pattern will be described in detail. In the following description, an example of the mask pattern to be formed shown in FIG. 32 is used instead of the example of the mask pattern to be formed shown in FIG. 31G. In FIG. 32, a reference numeral 701 denotes a main pattern to be noticed, reference numerals 702, 703, 704 and 705 denote other main patterns disposed in the vicinity of the main pattern 701. In the following description, it is assumed that the optimum position of the center of a first-order diffraction light generation pattern is a position away from the center of the phase shifter by a distance G0 and the allowable range in the position of the center of the first-order diffraction light generation pattern is from a distance G1 to a distance G2 (wherein G1<G0<G2). In this case, the distances G1 and G2 preferably accord with the allowable range in the position of the first-order diffraction light generation pattern described in detail in Embodiment 1. Also, the optimum position of the center of a second-order diffraction light generation pattern is a position away from the center of the phase shifter by a distance H0 and the allowable range in the position of the center of the second-order diffraction light generation pattern is from a distance H1 to a distance H2 (wherein H1<H0<H2). In this case, also the distances H1 and H2 preferably accord with the allowable range in the position of the second-order diffraction light generation pattern described in detail in Embodiment 1.

Now, a method for forming diffraction light generation patterns in consideration of the relationship between the main pattern 701 to be noticed and the other main patterns 702 through 705 formed in the vicinity will be described in detail.

Each of the main patterns 701 through 705 has the mask enhancer structure. Specifically, the main pattern 701 is composed of a phase shifter 701B and a semi-shielding portion 701A surrounding it, the main pattern 702 is composed of a phase shifter 702B and a semi-shielding portion 702A surrounding it, the main pattern 703 is composed of a phase shifter 703B and a semi-shielding portion 703A surrounding it, the main pattern 704 is composed of a phase shifter 704B and a semi-shielding portion 704A surrounding it, and the main pattern 705 is composed of a phase shifter 705B and a semi-shielding portion 705A surrounding it.

As shown in FIG. 32, it is assumed that the main pattern 701 is close to the main pattern 702 in such a manner that a distance p1 between the centers thereof satisfies $p1<2\times G1$. In this case, no diffraction light generation pattern is disposed between the main pattern 701 and the main pattern 702.

Also, it is assumed that the main pattern 701 is close to the main pattern 703 in such a manner that a distance p2 between the centers thereof satisfies $2\times G1 \leq p2 \leq 2\times G2$. In this case, a first-order diffraction light generation pattern 801 is disposed at the center between the main pattern 701 and the main pattern 703.

Furthermore, it is assumed that the main pattern 701 is close to the main pattern 704 in such a manner that a distance p3 between the centers thereof satisfies $2\times G2 \leq p3<2\times H1$. In this case, between the main pattern 701 and the main pattern 704, a first-order diffraction light generation pattern 802 is disposed so as to have its center in a position away from the center of the main pattern 701 by the distance G0, and a first-order diffraction light generation pattern 803 is disposed so as to have its center in a position way from the center of the main pattern 704 by the distance G0.

Moreover, it is assumed that the main pattern 701 is close to the main pattern 705 in such a manner that a distance p4 between the centers thereof satisfies $2\times H1 \leq p4<2\times H2$. In this case, between the main pattern 701 and the main pattern 705, a first-order diffraction light generation pattern 804 is disposed so as to have its center in a position away from the center of the main pattern 701 by the distance G0, a second-order diffraction light generation pattern 805 is disposed at the center between the main pattern 701 and the main pattern 705, and a first-order diffraction light generation pattern 806 is disposed so as to have its center in a position away from the center of the main pattern 705 by the distance G0.

In the case where the center of the main pattern to be noticed is away from the center of another adjacent main pattern by a distance $2\times H2$, a pair of first-order diffraction light generation patterns are disposed between these main patterns so as to have their centers away from the respective centers of the main patterns by the distance G0, and a pair of second-order diffraction light generation patterns are disposed between these main patterns so as to have their centers away from the respective centers of the main patterns by the distance H0.

When the aforementioned method for forming diffraction light generation patterns is employed, even if a main pattern is close to another main pattern by an arbitrary distance, a preferred diffraction light generation pattern can be definitely formed.

Although the description is given with respect to the mask pattern having the mask enhancer structure using a semi-shielding portion in Embodiment 6, the method of this embodiment is also applicable to a mask pattern having the mask enhancer structure using a shielding portion. Specifically, all elements made from the semi-shielding portions in this embodiment can be replaced with shielding portions. Also, in this case, the procedure performed in step S4 for providing the phase shifter 602 in the peripheral portion of the main pattern 601 may be omitted. In the case where a shielding portion is used instead of the semi-shielding portion, in forming a pattern with a dimension smaller than a predetermined dimension by using a mask pattern created by the method of this embodiment, an effect to largely improve the contrast or the DOF can be attained. Specifically, in forming a fine space, the effect to improve the contrast or the DOF is small. However, for example, in forming a pattern of a gate layer of an LSI circuit desired to attain a high operation speed, namely, in forming a pattern in which the dimension of a transistor pattern alone is very small but no fine space pattern is included, the aforementioned effect can be very remarkably exhibited.

Figure 33:
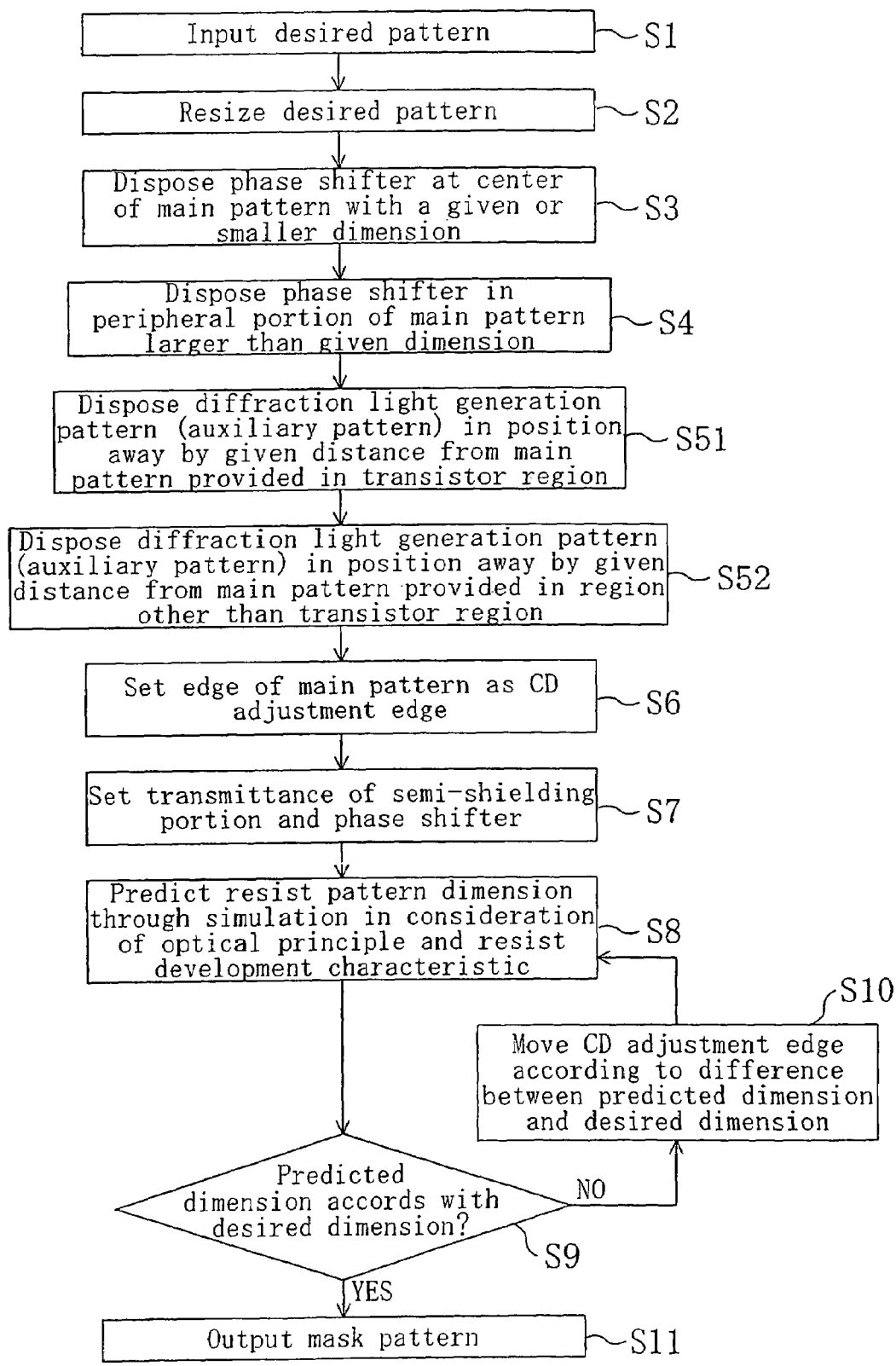
FIG. 33 is a flowchart of improved processing of the mask data creation method of Embodiment 6.

In creation of mask pattern data for a general LSI, it is significant to increase the margin in forming a transistor pattern. Therefore, in the case where main patterns are disposed in the vicinity of each other and hence diffraction light generation patterns for these main patterns cannot be disposed in optimum positions, a diffraction light generation pattern is provided in an optimum position with respect to a main pattern corresponding to a transistor region while a diffraction light generation pattern for a main pattern corresponding to an interconnect region is provided regardless of its optimum position. Now, this will be described with reference to a flowchart shown in FIG. 33. The improved flowchart of FIG. 33 is different from the flowchart of FIG. 30 in performing the processing for providing diffraction light generation patterns on the basis of the position of a phase shifter of a main pattern in separate two steps. In other words, the procedure performed in step S5 of the flowchart of FIG. 30 is performed dividedly in two steps, namely, steps S51 and S52 in the flowchart of FIG. 33. Specifically, first in step S51, an optimum diffraction light generation pattern is generated and arranged with respect to a phase shifter of a main pattern corresponding to a transistor region. Next, in step S52, a diffraction light generation pattern is generated with respect to a phase shifter of a main pattern disposed in a region other than the transistor region. In this method, even when the main pattern corresponding to the transistor region is too close to another main pattern corresponding to another region (such as an interconnect region) to simultaneously provide diffraction light generation patterns to both of these main patterns, an optimum diffraction light generation pattern can be provided to the main pattern corresponding to the transistor region. It is noted that the main pattern corresponding to a transistor region can be easily extracted, for example, through processing for extracting overlap between a gate layer and an active layer on the basis of LSI design data.

Figure 34:
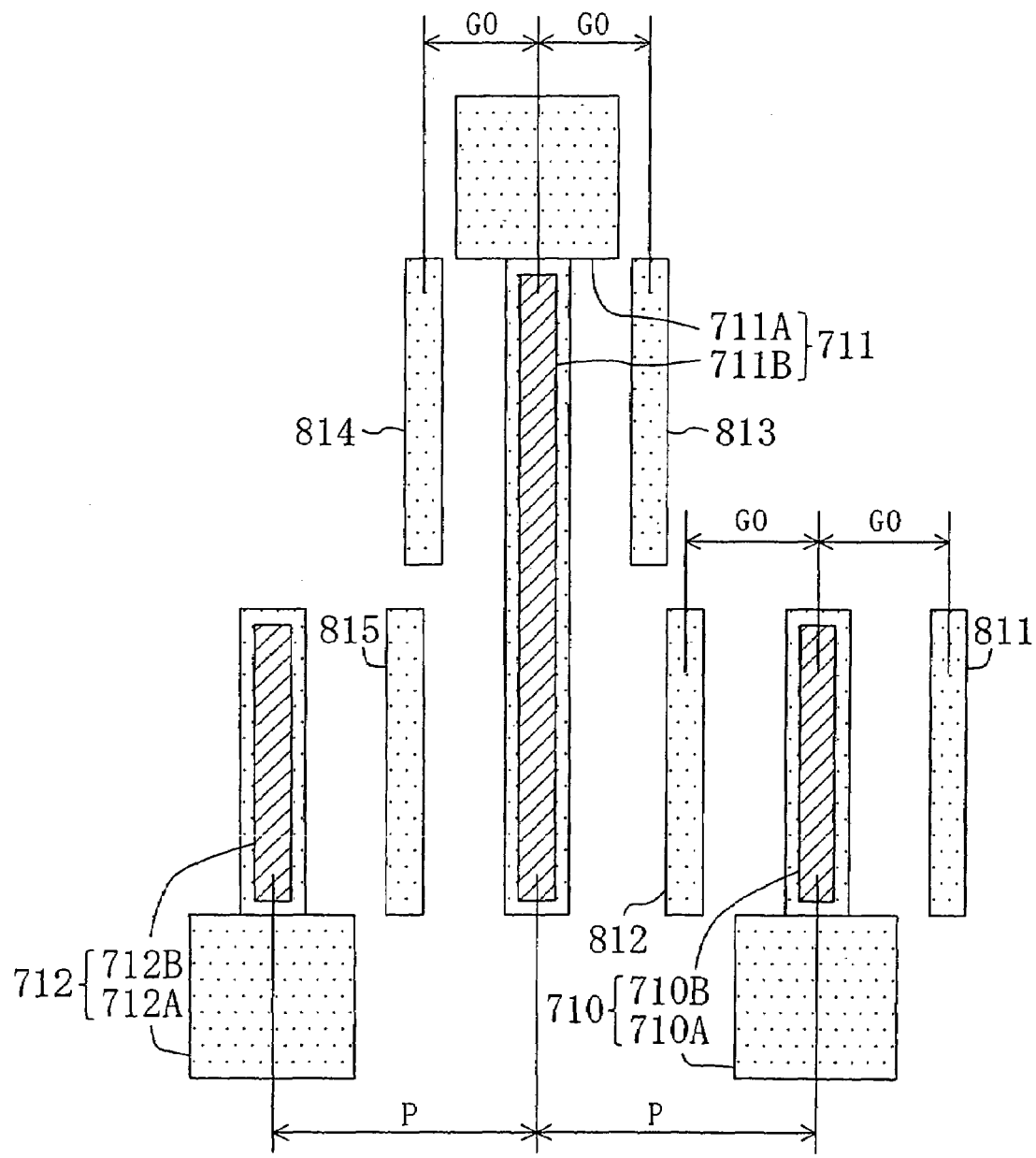
FIG. 34 is a diagram of a detailed example of a diffraction light generation pattern formed through the improved processing of the mask data creation method of Embodiment 6.
Figure 35:
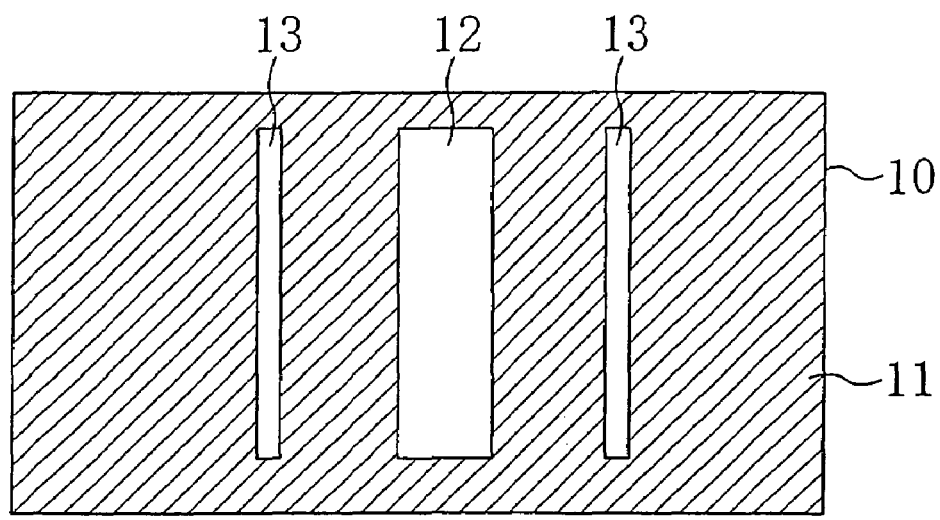
FIG. 35 is a plan view of a conventional photomask.
Figure 36:
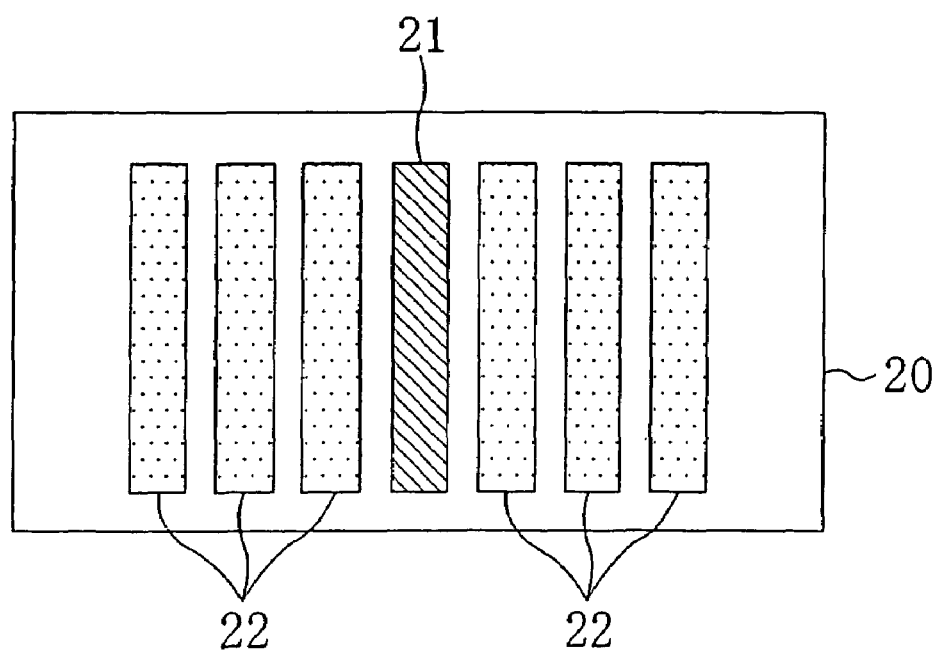
FIG. 36 is a plan view of another conventional photomask.

FIG. 34 shows an example of the mask pattern to be created specifically as a result of the processing performed in accordance with the flowchart of FIG. 33. As shown in FIG. 34, main patterns 710 through 712 are respectively composed of phase shifters 710B through 712B and shielding portions 710A through 712A. Also, first-order diffraction light generation patterns 811 through 815 are arranged with respect to these main patterns 710 through 712. In this case, the phase shifter 710B is a phase shifter disposed in a transistor region, and the other phase shifters 711B and 712B are phase shifters disposed in a region other than the transistor region. Also, it is assumed that the position of an optimum first-order diffraction light generation pattern with respect to a phase shifter is a position away from the center of the phase shifter by a distance G0 and the allowable range in the position of the first-order diffraction light generation pattern is from a distance G1 through a distance G2. Furthermore, it is assumed that the main pattern 710 is close to the main pattern 711 that is close to the main pattern 712 and the distance between the centers of the adjacent main patterns is a distance p, wherein the distance p has a value not less than 2×G1 and smaller than 2×G2. Moreover, each of the diffraction light generation patterns 812 and 815 is disposed in a region sandwiched between the adjacent close main patterns. The other diffraction light generation patterns 811, 813 and 814 are disposed with respect to the main patterns not close to another main pattern. As shown in FIG. 34, the diffraction light generation pattern 815 disposed between the main patterns 711 and 712 provided in the region other than the transistor region is disposed at the center of these main patterns. On the other hand, the diffraction light generation pattern 812 disposed between the main pattern 710 provided in the transistor region and the main pattern 711 is disposed to have its center in a position away from the center of the phase shifter 710B of the main pattern 710 by the distance G0. In other words, the phase shifter disposed in the transistor region is priorly provided with the diffraction light generation pattern arranged in the optimum position.

In the improved flowchart of FIG. 33, a diffraction light generation pattern is provided in an optimum position priorly with respect to a main pattern disposed in a transistor region by performing the procedure of step S5 of the flowchart of FIG. 30 in the two steps. However, needless to say, diffraction light generation patterns may be simultaneously provided in a transistor region and in another region in one step. Furthermore, although a transistor region is assumed to be a significant region in the pattern formation, when a region other than the transistor region is significant in the pattern formation, the transistor region is replaced with the other significant region in the aforementioned improved flowchart.

Furthermore, in Embodiment 6, the mask data creation method for a photomask in which a main pattern has the mask enhancer structure has been mainly described. However, through the aforementioned procedures, mask data for a photomask in which a main pattern does not have the mask enhancer structure can be created. Specifically, in the case where a main pattern is made from a phase shifter alone, the edge of the phase shifter corresponds to the edge of the main pattern, and hence, the CD adjustment can be performed in accordance with the width of the phase shifter. Alternatively, in the case where a main pattern is made from a shielding pattern alone, the edge of the shielding pattern corresponds to the edge of the main pattern, and hence, the CD adjustment can be performed in accordance with the width of the shielding pattern. In this case, one of or both of the procedures in steps S3 and S4 of the flowchart of FIG. 30 may be omitted.

Moreover, in each of Embodiments 1 through 6, the description is given with respect to a transmission photomask, which does not limit the invention. The present invention is applicable to a reflection mask by replacing the transmission phenomenon of exposing light with the reflection phenomenon by, for example, changing the transmittance with reflectance.

What is claimed is:

1. A mask data creation method for creating mask data for a photomask including a mask pattern formed on a transparent substrate and a transparent portion of said transparent substrate where said mask pattern is not formed, comprising the steps of:

(a) generating a main pattern corresponding to a desired unexposed region of a resist formed by irradiating said resist with exposing light through said photomask;

(b) determining a shape of a phase shifter that is disposed within said main pattern and transmits said exposing light in an opposite phase with respect to said transparent portion;

(c) disposing an auxiliary pattern for diffracting said exposing light in a position on said transparent substrate away from said phase shifter by a given distance;

(d) setting an edge of said main pattern corresponding to a boundary between said main pattern and said transparent portion as a CD adjustment edge;

(e) predicting, through simulation, a dimension of a resist pattern formed by using said main pattern including said phase shifter and said auxiliary pattern; and (f) changing a shape of said main pattern by moving said CD adjustment edge when said predicted dimension of said resist pattern does not accord with a desired dimension.

2. The mask data creation method of claim 1,
wherein said main pattern includes a semi-shielding portion that transmits said exposing light in an identical phase with respect to said transparent portion.

3. The mask data creation method of claim 2,
wherein said phase shifter is disposed at a center of a part having a given or smaller dimension of said main pattern to be surrounded by said semi-shielding portion.

4. The mask data creation method of claim 2,
wherein said phase shifter is disposed with a part of said semi-shielding portion having a given or larger width sandwiched between said transparent portion and said phase shifter.

5. The mask data creation method of claim 2,
wherein said phase shifter is disposed in a peripheral portion of said main pattern.

6. The mask data creation method of claim 1,
wherein said main pattern includes a shielding portion, and said phase shifter is disposed at a center of a part having a given or smaller dimension of said main pattern to be surrounded by said shielding portion.

7. The mask data creation method of claim 6,
wherein said phase shifter is disposed with a part of said shielding portion having a given or larger width sandwiched between said transparent portion and said phase shifter.

8. The mask data creation method of claim 1, wherein said step (c) comprises the sub-steps of:

(c1) separating said main pattern into a first region and a second region;

(c2) disposing a first auxiliary pattern, which is to be a part of said auxiliary pattern, for diffracting said exposing light in a position on said transparent substrate away from said first region of said main pattern by a given distance; and (c3) disposing a second auxiliary pattern, which is to be a part of said auxiliary pattern, for diffracting said exposing light in a position on said transparent substrate away from said second region of said main pattern by another given distance.

9. The mask data creation method of claim 8,
wherein either of said first region and said second region is a transistor region.

\* \* \* \* \*